United States Patent
Echigoya et al.

(10) Patent No.: US 9,991,335 B2
(45) Date of Patent: Jun. 5, 2018

(54) SEMICONDUCTOR DEVICE HAVING A POLARIZATION SUPER JUNCTION FIELD EFFECT TRANSISTOR, ELECTRIC EQUIPMENT, BIDIRECTIONAL FIELD EFFECT TRANSISTOR, AND MOUNTED STRUCTURE BODY HAVING THE SAME

(71) Applicant: POWDEC K.K., Oyama-shi, Tochigi (JP)

(72) Inventors: Shoko Echigoya, Oyama (JP);
Fumihiko Nakamura, Oyama (JP);
Shuichi Yagi, Oyama (JP); Souta Matsumoto, Oyama (JP); Hiroji Kawai, Oyama (JP)

(73) Assignee: POWDEC K.K., Tochigi (JP)

( * ) Notice: Subject to any disclaimer, the term of this patent is extended or adjusted under 35 U.S.C. 154(b) by 148 days.

(21) Appl. No.: 14/890,659

(22) PCT Filed: Nov. 18, 2014

(86) PCT No.: PCT/JP2014/080436
§ 371 (c)(1),
(2) Date: Nov. 12, 2015

(87) PCT Pub. No.: WO2015/159450
PCT Pub. Date: Oct. 22, 2015

(65) Prior Publication Data
US 2016/0093691 A1    Mar. 31, 2016

(30) Foreign Application Priority Data
Apr. 18, 2014 (JP) ................................ 2014-085984

(51) Int. Cl.
*H01L 29/15* (2006.01)
*H01L 29/06* (2006.01)
(Continued)

(52) U.S. Cl.
CPC ........ *H01L 29/0634* (2013.01); *H01L 29/063* (2013.01); *H01L 29/0619* (2013.01);
(Continued)

(58) Field of Classification Search
CPC ............. H01L 29/0634; H01L 29/7393; H01L 29/207; H01L 29/7783; H01L 29/205;
(Continued)

(56) References Cited

U.S. PATENT DOCUMENTS 5,760,446 A * 6/1998 Yang ................... H01L 27/0266
257/357
8,785,976 B2  7/2014 Nakajima
(Continued)

FOREIGN PATENT DOCUMENTS

JP  2007134607  5/2007
JP  2009117485  5/2009
(Continued)

OTHER PUBLICATIONS

European Search Report dated May 16, 2017 in corresponding European Application No. 14889300.1.
(Continued)

*Primary Examiner* — Anthony Ho
*Assistant Examiner* — Mohammad M Hoque
(74) *Attorney, Agent, or Firm* — K&L Gates LLP

(57) ABSTRACT

Provided are a semiconductor device and a bidirectional field effect transistor which can easily overcome the tradeoff relation between the high voltage resistance and high speed in the semiconductor device using a polarization super junction, realize both the high voltage resistance and elimination of the occurrence of current collapse, operate at a high speed, and further the loss is low. The semiconductor device comprises a polarization super junction region and a p-electrode contact region. The polarization super junction
(Continued)

region comprises an undoped GaN layer 11, an undoped $Al_xGa_{1-x}N$ layer 12 with a thickness not smaller than 25 nm and not larger than 47 nm and $0.17 \leq x \leq 0.35$, an undoped GaN layer 13 and a p-type GaN layer 14. When the reduced thickness tR is defined as $tR=u+v(1+w \times 10^{-18})$ for the thickness u [nm] of the undoped GaN layer 13, the thickness v [nm] and the Mg concentration w [cm$^{-3}$] of the p-type GaN layer 14, $tR \geq 0.864/(x-0.134)+46.0$ [nm] is satisfied. The p-electrode contact region comprises a p-type GaN contact layer formed to be in contact with the p-type GaN layer 14 and a p-electrode that is in contact with the p-type GaN contact layer.

3 Claims, 39 Drawing Sheets

(51) Int. Cl.
*H01L 29/861* (2006.01)
*H01L 29/778* (2006.01)
*H01L 29/872* (2006.01)
*H01L 29/205* (2006.01)
*H01L 29/207* (2006.01)
*H01L 29/739* (2006.01)
*H01L 29/417* (2006.01)
*H01L 29/423* (2006.01)
*H01L 29/10* (2006.01)
*H01L 29/20* (2006.01)

(52) U.S. Cl.
CPC .......... *H01L 29/205* (2013.01); *H01L 29/207* (2013.01); *H01L 29/7393* (2013.01); *H01L 29/7783* (2013.01); *H01L 29/7786* (2013.01); *H01L 29/861* (2013.01); *H01L 29/872* (2013.01); *H01L 29/0657* (2013.01); *H01L 29/1066* (2013.01); *H01L 29/2003* (2013.01); *H01L 29/41758* (2013.01); *H01L 29/42316* (2013.01); *H01L 2224/81* (2013.01); *H01L 2224/85* (2013.01)

(58) Field of Classification Search
CPC . H01L 29/7786; H01L 29/872; H01L 29/063; H01L 29/0619; H01L 29/861; H01L 29/0657; H01L 2224/81; H01L 2224/85; H01L 29/1066; H01L 29/2003; H01L 29/423

USPC .......................................................... 257/76
See application file for complete search history.

(56) References Cited

U.S. PATENT DOCUMENTS

| 2004/0188693 | A1* | 9/2004 | Nakayama | H01L 21/0237 |
|---|---|---|---|---|
| | | | | 257/94 |
| 2007/0114513 | A1* | 5/2007 | Ohta | B82Y 20/00 |
| | | | | 257/13 |
| 2008/0149965 | A1* | 6/2008 | Kaibara | H01L 29/1066 |
| | | | | 257/192 |
| 2009/0114948 | A1 | 5/2009 | Ishida | |
| 2009/0212325 | A1* | 8/2009 | Sato | H01L 29/1066 |
| | | | | 257/192 |
| 2012/0299060 | A1* | 11/2012 | Kohda | H01L 21/02381 |
| | | | | 257/190 |
| 2013/0043492 | A1* | 2/2013 | Takizawa | H01L 29/155 |
| | | | | 257/77 |
| 2013/0126942 | A1 | 5/2013 | Nakajima et al. | |

FOREIGN PATENT DOCUMENTS

| JP | 2011109761 | 6/2011 |
| JP | 2013239735 | 11/2013 |
| WO | WO2011162243 | 12/2011 |

OTHER PUBLICATIONS

GaN-Based Super Heterojunction Field Effect Transistors Using the Polarization Junction Concept, Nakajima, et al., Electron Device Letters, Vo. 32, No. 4, Apr. 2011.
English translation of the Written Opinion issued in corresponding international application No. PCT/JP2014/080436, dated Jan. 6, 2015 (6 pages).
Toshiba Review vol. 59, No. 7, 2004. pp. 35-38.
Ishida et al. Unlimited High Breakdown Voltage by Natural Super Junction of POlarized Semiconductor. IEEE Electron Device Letters, vol. 29, No. 10, Oct. 2008, p. 1087-1089.
Nakajima, Akira. High Density Two-Dimensional Hole Gas Induced by Negative Polarization at GaN/AlGaN Heterointerface Applied Physics Express vol. 3, (2012) 121004-1-121004-3.
Nakajima, Akira. GaN Based Super HFETs over 700V Using the Polarization Junction Concept. Proceedings of the 23rd International Symposium on Power Semiconductor Devices & IC's May 23-26, 2011 San Diego, CA. pp. 280-283.
Office Action issued in JP Application 2014-085984 dated Jul. 15, 2014. 3 pages.

* cited by examiner (Prior Art)

(Prior Art)

(Prior Art)

(Prior Art)

(Prior Art)

SEMICONDUCTOR DEVICE HAVING A POLARIZATION SUPER JUNCTION FIELD EFFECT TRANSISTOR, ELECTRIC EQUIPMENT, BIDIRECTIONAL FIELD EFFECT TRANSISTOR, AND MOUNTED STRUCTURE BODY HAVING THE SAME

CROSS REFERENCES TO RELATED APPLICATIONS

The present application is a national stage of International Application No. PCT/JP2014/080436 filed on Nov. 18, 2014 and claims priority to Japanese Patent Application No. 2014-085984 filed on Apr. 18, 2014, the disclosure of which is incorporated herein by reference.

BACKGROUND

The present invention relates to a semiconductor device, an electric equipment, a bidirectional field effect transistor, and amounted structure body and, more particularly to a semiconductor device using a gallium nitride (GaN)-based semiconductor, an electric equipment using the semiconductor device, a bidirectional field effect transistor, an electric equipment using the bidirectional field effect transistor, and a mounted structure body comprising the semiconductor device or the bidirectional field effect transistor.

With increasing the importance of electric energy to realize energy saving society, in the twenty first-century, it is going to rely on electric power further. The key devices of electric and electronic equipments are semiconductor devices such as transistors and diodes. Therefore, energy saving characteristic of these semiconductor devices is very important. At present, a silicon (Si) semiconductor device is used as a power conversion device, but the silicon semiconductor device has been improved its performance to the limit of physical properties. Therefore, it is under difficult situation to save energy further.

For this, the research and development has been carried out intensively on the power conversion devices with a wide-gap semiconductor such as silicon carbide (SiC) and gallium nitride (GaN) in place of Si. Among them, GaN has remarkably better physical properties in power efficiency and voltage-resistance property than SiC. Therefore, the research and development for GaN-based semiconductor devices has been carried out energetically.

With regard to the GaN-based semiconductor device, a lateral type field effect transistor (FET), that is, a device with a structure formed with a transporting channel parallel to a substrate has been developed. For example, such a device is a device wherein upon a base substrate made of sapphire, SiC, etc., an undoped GaN layer is stacked with a few-μm-thick, and on it, an AlGaN layer with an Al composition of about 25% is stacked with about 25 to 30-nm-thick, and a two-dimensional electron gas (2DEG) formed at an AlGaN/GaN hetero-interface is used. The device is generally called a HFET (hetero-junction FET).

The AlGaN/GaN HFET has a technical problem of control of current collapse. The phenomenon of current collapse is a phenomenon that for the drain current at a low drain voltage up to several volts, the drain current after a high voltage is applied decreases. The phenomenon means in real circuits a phenomenon that the drain current at an on time decreases when an operation voltage of switching becomes high. The current collapse is not a unique phenomenon in a GaN-based FET, but comes to appear remarkably with enabling to apply a high voltage between a source and a drain in the GaN-based FET, and is originally a phenomenon generally arising in horizontal type devices.

The cause of generation of current collapse is explained as follows. When a high voltage is applied between a gate and a drain of a FET, or between a cathode and an anode of a diode, a high electric field area is generated just below the gate or just below the anode, and electrons transfer to the surface or surface vicinity of a part of the high electric field to be trapped. The source of electrons is electrons which drift on the surface of a semiconductor from a gate electrode, or channel electrons which transfer to the surface by a high electric field, etc. By being biased to negative by the negative charges of the electrons, the electron concentration of the electronic channel decreases and the channel resistance goes up.

With regard to electrons generated by gate leakage, by making passivation by the dielectric film on the surface, electron transfer is limited and the current collapse is controlled. However, current collapse cannot be sufficiently controlled only by the dielectric film.

Therefore, focusing on that the current collapse results from a high electric field in the vicinity of a gate, a technology to control the intensity of electric field, especially peak electric field, has been developed. This is called the Field Plate (FP) technology, which is the heretofore known technology already in practical use in a Si-based or a GaAs-based FET (for example, see non-patent literature 1.).

FIG. 1A shows a conventional AlGaN/GaN HFET using the field plate technology. As shown in FIG. 1A, with regard to the AlGaN/GaN HFET, on a base substrate 101, a GaN layer 102 and an AlGaN layer 103 are stacked in order, and on the AlGaN layer 103, a gate electrode 104, a source electrode 105, and a drain electrode 106 are formed. In this case, the upper part of the gate electrode 104 and the upper part of the source electrode 105 extend to the side of the drain electrode 106 like a hat brim, and form field plates. By the field plates formed to the gate electrode 104 and the source electrode 105, based on the principle of electromagnetism, the peak electric field intensity of the end of a depletion layer of a channel can be lowered. FIG. 1B shows the electric field distribution of cases with and without field plates corresponding to FIG. 1A. As the area of electric field distribution is equal to a drain voltage, by dispersing the peak electric field, the improvement of voltage resistance of the AlGaN/GaN HFET and a control of current collapse can be made.

However, by the field plate technology, the electric field cannot be leveled over all the channel area. Also, a practical semiconductor device as a power device is applied a voltage of 600 V or more, therefore, the issue cannot be fundamentally solved even if the field plate technology is applied.

On the other hand, there is a super junction structure, one of the heretofore known technologies, which improves voltage resistance by equalizing the electric field distribution, and making the peak electric field unlikely occur (for example, see non-patent literature 2.). The super junction is explained.

FIG. 2A shows a conventional pn junction applied a small reverse bias voltage. FIG. 3A shows a unit of a super junction applied a small reverse bias voltage.

As shown in FIG. 2A, in the conventional pn junction, a p-type layer 151 and an n-type layer 152 are joined, a p-electrode 153 is formed on the p-type layer 151, an n-electrode 154 is formed on the n-type layer 152, and the junction plane of the pn junction is parallel to the p-electrode 153 and the n-electrode 154. In the vicinity part of the junction plane of the p-type layer 151, a depletion layer 151a is formed, and the other part is a p-type neutral region. On the vicinity part of the junction plane of the n-type layer 152, a depletion layer 152a is formed, and the other part is an n-type neutral region.

In contrast with this, as shown in FIG. 3A, in the super junction, a pn junction is formed by a p-type layer 201 and an n-type layer 202 as the same as the conventional pn junction, but a p-electrode 203 formed on the p-type layer 201 and an n-electrode 204 formed on the n-type layer 202 are formed such that they intersect at right angle for the main junction plane stretching in a plane between the p-type layer 201 and the n-type layer 202. At the both end parts of the pn junction, the junction plane is curved to the opposite direction each other for the main junction plane. In the vicinity part of the junction plane of the p-type layer 201, a depletion layer 201a is formed, and the other part is a p-type neutral region. In the vicinity part of the junction plane of the n-type layer 202, a depletion layer 202a is formed, and the other part is an n-type neutral region.

FIG. 2B shows the electric field distribution of the conventional pn junction applied a small reverse bias voltage between the p-electrode 153 and the n-electrode 154 corresponding to FIG. 2A. Also, FIG. 3B shows the electric field distribution of the super junction applied a small reverse bias voltage between the p-electrode 203 and the n-electrode 204 corresponding to FIG. 3A.

FIG. 4A shows that a large reverse bias voltage is applied to the conventional pn junction. FIG. 5A shows that a large reverse bias voltage is applied to the super junction.

FIG. 4B shows the electric field distribution of the conventional pn junction applied a large reverse bias voltage between the p-electrode 153 and the n-electrode 154 corresponding to FIG. 4A. Also, FIG. 5B shows the electric field distribution of the super junction applied a large reverse bias voltage between the p-electrode 203 and the n-electrode 204 corresponding to FIG. 5A.

In the conventional pn junction and the super junction, the expansion of the depletion layers 151a, 152a, 201a, and 202a occurs starting at the pn junction plane. In the conventional pn junction, the electric field distribution by fixed charge of acceptor ions, donor ions, etc. in the depletion layers 151a, 152a becomes triangle shape as shown in FIG. 2B and FIG. 4B, and the peak electric field distribution occurs. In contrast with this, in the super junction, as shown in FIG. 3B and FIG. 5B, when the depletion layers 201a, 202a expand, the electric field (value of integral of charge) distributes with a constant value in the direction connecting between the p-electrode 203 and the n-electrode 204, and it is understood that concentration of electric field does not occur.

As the applied voltage is the value of integral of electric field (corresponding to the area of electric field in FIG. 2B, FIG. 3B, FIG. 4B, and FIG. 5B), in the conventional pn junction, the voltage resistance is controlled by the maximum electric field intensity occurring at the junction plane. On the other hand, the super junction can withstand the applied voltage over the whole semiconductor with homogeneous electric field. The super junction is applied to a drift layer of a Si-MOS power transistor and a Si power diode with a vertical type or a horizontal type structure.

Also, there is the principle of polarization junction as a method to produce distribution of positive charge and negative charge as the same as the super junction without depending on the pn junction (for example, see patent literature 1.). Also, there is proposed a technology aiming high voltage resistance by making use of the polarization (for example, see patent literature 2.).

However, it is proved that the two-dimensional hole concentration of the polarization junction described in the patent literatures 1 and 2 is insufficient for high performance operation. Its reason is as follows. Negative polarization electric charge at the hetero-interface resulting the two-dimensional hole at the hetero-interface is compensated by surface defects or surface levels. As a result, the band is pushed downwardly, resulting the reduction of the concentration of the two-dimensional hole to be present at the AlGaN/GaN hetero-interface.

Therefore, a semiconductor device that can improve the problem of the polarization junction described in the patent literatures 1 and 2 was proposed (see patent literature 3 and non-patent literature 3.). The semiconductor device has a structure in which an $In_zGa_{1-z}N$ layer (where $0 \le z < 1$), an $Al_xGa_{1-x}N$ layer (where $0 < x < 1$), an $In_yGa_{1-y}N$ layer (where $0 \le y < 1$) and a p-type $In_wGa_{1-w}N$ layer (where $0 \le w < 1$) are stacked in order. In the semiconductor device, a two-dimensional hole gas is formed in the $In_yGa_{1-y}N$ layer in the vicinity part of a hetero-interface between the $Al_xGa_{1-x}N$ layer and the $In_yGa_{1-y}N$ layer, and a two-dimensional electron gas is formed in the $In_zGa_{1-z}N$ layer in the vicinity part of a hetero-interface between the $In_zGa_{1-z}N$ layer and the $Al_xGa_{1-x}N$ layer at a non-operating time. More specifically, according to the semiconductor device, for example, the surface GaN layer is doped with Mg, and the band near the surface is lifted up by negative fixed electric charge of Mg acceptors, so that a sufficient two-dimensional hole gas is formed in the AlGaN/GaN hetero-interface on the surface side. And a transistor utilizing essentially the polarization effect was published for the first time (see non-patent literature 4.).

PRIOR ART LITERATURE

Patent Literature

[PATENT LITERATURE 1] Laid-open gazette 2007-134607
[PATENT LITERATURE 2] Laid-open gazette 2009-117485
[PATENT LITERATURE 3] International publication 2011/162243

Non-Patent Literature

[NON-PATENT LITERATURE 1] Toshiba Review Vol. 59 No. 7 (2004) p. 35
[NON-PATENT LITERATURE 2] IEEE ELECTRON DEVICE LETTERS, VOL. 29, NO. 10, OCTOBER 2008, p. 1087
[NON-PATENT LITERATURE 3] Applied Physics Express vol. 3, (2012) 121004
[NON-PATENT LITERATURE 4] Proceedings of the 23$^{rd}$ International Symposium on Power Semiconductor Devices & ICs May 23-26, 2011 San Diego, Calif.

SUMMARY

Subjects to be Solved by Invention

According to the semiconductor device using a polarization super junction (PSJ) proposed in patent literature 3 and non-patent literature 3, since it uses the principle as the same as a Si super junction device, it is possible to obtain a super high voltage resistance device more easily in principle than the field plate technology conventionally proposed. However, according to the examination originally conducted by the present inventors, it turns out that its operation (dynamics and dynamic characteristics) is limited by moving velocity of holes.

That is, the surface p-type GaN layer in the semiconductor device of patent literature 3 and non-literature 3 is introduced to compensate its surface levels, and there is a suitable amount for the total amount of acceptors. If the total amount of acceptors is too much, many holes originating from acceptors are generated in addition to a two-dimensional electron gas of the channel, so that charge balance with electrons of the channel is upset and the voltage resistance decreases. Even though a p-side ohmic electrode (p-electrode) to pull out or introduce holes upon operation of the device is formed on a part of the surface of the p-type GaN layer, if the surface hole concentration is low, a good ohmic contact cannot be obtained. If the ohmic contact resistance of the p-electrode is high, CR time constant of the device increases, so that a phenomenon that the dynamic characteristics deteriorate appears. As a result, with respect to the hole concentration of the p-type GaN layer, it turns out that there is a tradeoff relation between the high voltage resistance and the dynamic characteristics. However, polarization super junction devices conventionally proposed cannot realize both optimization of the super junction region and optimization of the contact part of the p-electrode.

Therefore, the subject to be solved by the invention is to provide a semiconductor device and a bidirectional field effect transistor which can easily overcome the tradeoff relation between the high voltage resistance and high speed in the semiconductor device using a polarization super junction proposed in patent literature 3 and non-patent literature 3, realize both the high voltage resistance and elimination of the occurrence of current collapse and operate at a high speed, and further the loss is low.

Another subject to be solved by the invention is to provide a high performance electric equipment using the above semiconductor device or bidirectional field effect transistor.

Still another subject to be solved by the invention is to provide a mounted structure body comprising the above semiconductor device or bidirectional field effect transistor.

Means to Solve the Subjects

In order to solve the subjects, according to the invention, there is provided a semiconductor device, comprising:
a polarization super junction region and a p-electrode contact region which are provided separately each other,
the polarization super junction region, comprising:
the first undoped GaN layer,
an undoped $Al_xGa_{1-x}N$ layer ($0.17 \leq x \leq 0.35$) with a thickness not smaller than 25 nm and not larger than 47 nm on the first GaN layer,
the second undoped GaN layer on the undoped $Al_xGa_{1-x}N$ layer; and
a Mg-doped p-type GaN layer on the second undoped GaN layer, $$tR \geq 0.864/(x-0.134)+46.0 \text{ [nm]}$$

being satisfied when the thickness of the second undoped GaN layer is denoted as $u$ [nm], the thickness of the p-type GaN layer is denoted as $v$ [nm], the Mg concentration of the p-type GaN layer is denoted as $w$ [cm$^{-3}$] and the reduced thickness tR is defined as $$tR = u + v(1 + w \times 10^{-18}),$$

the p-electrode contact region, comprising:
a p-type GaN contact layer which is doped with Mg heavier than the p-type GaN layer, provided in contact with the p-type GaN layer only in the p-electrode contact region; and
a p-electrode which is in ohmic contact with the p-type GaN contact layer,
a two-dimensional hole gas being formed in the second undoped GaN layer in the vicinity part of a hetero-interface between the undoped $Al_xGa_{1-x}N$ layer and the second undoped GaN layer, and a two-dimensional electron gas being formed in the first undoped GaN layer in the vicinity part of a hetero-interface between the first undoped GaN layer and the undoped $Al_xGa_{1-x}N$ layer at a non-operating time.

The p-type GaN contact layer may be provided in any way as far as it is in contact with the p-type GaN layer. For example, the p-type GaN contact layer may be formed as a mesa, or may be buried in the p-type GaN layer etc. With respect to the latter case, for example, a groove is provided in the undoped $Al_xGa_{1-x}N$ layer, the second undoped GaN layer and the p-type GaN layer to a depth reaching at least the undoped $Al_xGa_{1-x}N$ layer, the p-type GaN contact layer is buried inside the groove, so that the p-type GaN contact layer and the two-dimensional hole gas forms a junction.

According to the semiconductor device, typically, the first undoped GaN layer, the undoped $Al_xGa_{1-x}N$ layer, the second undoped GaN layer and the p-type GaN layer are grown in order on a base substrate on which GaN-based semiconductor can be grown in C-plane orientation.

In the semiconductor device, as necessary, an $Al_uGa_{1-u}N$ layer (where $0<u<1$, $u>x$), typically undoped, for example, an AlN layer is provided between the first undoped GaN layer and the undoped $Al_xGa_{1-x}N$ layer and/or between the second undoped GaN layer and the undoped $Al_xGa_{1-x}N$ layer. By providing the $Al_uGa_{1-u}N$ layer between the second undoped GaN layer and the undoped $Al_xGa_{1-x}N$ layer, permeation of the two-dimensional hole gas formed in the second undoped GaN layer in the vicinity part of the hetero-interface between the second undoped GaN layer and the undoped $Al_xGa_{1-x}N$ layer into the undoped $Al_xGa_{1-x}N$ layer side can be reduced, and mobility of holes can be increased dramatically. Also, by providing the $Al_uGa_{1-u}N$ layer between the first undoped GaN layer and the undoped $Al_xGa_{1-x}N$ layer, permeation of the two-dimensional electron gas formed in the first undoped GaN layer in the vicinity part of the hetero-interface between the first undoped GaN layer and the undoped $Al_xGa_{1-x}N$ layer into the undoped $Al_xGa_{1-x}N$ layer side can be reduced, and mobility of electrons can be increased dramatically. The $Al_uGa_{1-u}N$ layer or the AlN layer may be generally sufficiently thin, for example, about 1 to 2 nm.

The semiconductor device can be used as various devices, typically, a field effect transistor (FET), a diode, etc.

In a case where the semiconductor device is a field effect transistor, the field effect transistor can be constructed, for example, as follows. In the first example, the second undoped GaN layer and the p-type GaN layer on the undoped $Al_xGa_{1-x}N$ layer are patterned as a mesa, the p-type GaN contact layer is formed as a mesa on the p-type GaN layer, a source electrode and a drain electrode are formed on the undoped $Al_xGa_{1-x}N$ layer so as to sandwich the second undoped GaN layer and the p-type GaN layer, a gate electrode is formed on the undoped $Al_xGa_{1-x}N$ layer of a part between the source electrode and the second undoped GaN layer and the p-type GaN layer, and the p-electrode is formed on the p-type GaN contact layer. In the second example, the second undoped GaN layer and the p-type GaN layer on the undoped $Al_xGa_{1-x}N$ layer are patterned as a mesa, the p-type GaN contact layer is formed on the p-type GaN layer as a mesa, a source electrode and a drain electrode are formed on the undoped $Al_xGa_{1-x}N$ layer so as to sandwich the second undoped GaN layer and the p-type GaN layer, a gate electrode which also serves as the p-electrode is formed on a part of the undoped $Al_xGa_{1-x}N$ layer between the source electrode and the second undoped GaN layer and the p-type GaN layer such that it extends from the side of the second undoped GaN layer and the p-type GaN layer on the p-type GaN contact layer. In the third example, the second undoped GaN layer and the p-type GaN layer on the undoped $Al_xGa_{1-x}N$ layer are patterned as a mesa, the p-type GaN contact layer is formed on the p-type GaN layer as a mesa, a source electrode and a drain electrode are formed on the undoped $Al_xGa_{1-x}N$ layer so as to sandwich the second undoped GaN layer and the p-type GaN layer, a groove is formed in a part of the undoped $Al_xGa_{1-x}N$ layer between the source electrode and the second undoped GaN layer and the p-type GaN layer such that it continues to the side of the second undoped GaN layer and the p-type GaN layer, and a gate electrode which also serves as the p-electrode is buried in the inside of the groove and further extends from the side of the second undoped GaN layer and the p-type GaN layer on the p-type GaN contact layer. In the fourth example, the second undoped GaN layer and the p-type GaN layer on the undoped $Al_xGa_{1-x}N$ layer are patterned as a mesa, the p-type GaN contact layer is formed on the p-type GaN layer as a mesa, the source electrode and the drain electrode are formed on the undoped $Al_xGa_{1-x}N$ layer so as to sandwich the second undoped GaN layer and the p-type GaN layer, and the p-electrode which also serves as a gate electrode is formed on the p-type GaN contact layer. In the fifth example, a groove is formed in the undoped $Al_xGa_{1-x}N$ layer, the second undoped GaN layer and p-type GaN layer to a depth reaching at least the undoped $Al_xGa_{1-x}N$ layer, the p-type GaN contact layer is buried in the inside of the groove, the p-type GaN contact layer and the two-dimensional hole gas forms a junction, the second undoped GaN layer and the p-type GaN layer on the undoped $Al_xGa_{1-x}N$ layer are patterned as a mesa, the source electrode and the drain electrode are formed on the undoped $Al_xGa_{1-x}N$ layer so as to sandwich the second undoped GaN layer and the p-type GaN layer, and the p-electrode which also serves as a gate electrode is formed on the p-type GaN contact layer.

In a case where the semiconductor device is a diode, the diode can be constructed, for example, as follows. In the first example, the second undoped GaN layer and the p-type GaN layer on the undoped $Al_xGa_{1-x}N$ layer are patterned as a mesa, the p-type GaN contact layer is formed on the p-type GaN layer as a mesa, an anode electrode and a cathode electrode are formed so as to sandwich the second undoped GaN layer and the p-type GaN layer, the anode electrode is buried in a groove which is formed at least in the undoped $Al_xGa_{1-x}N$ layer, the cathode electrode is formed on the undoped $Al_xGa_{1-x}N$ layer, the p-electrode is formed on the p-type GaN contact layer, and the anode electrode and the p-electrode are electrically connected each other. In the second example, the second undoped GaN layer and the p-type GaN layer on the undoped $Al_xGa_{1-x}N$ layer are patterned as a mesa, the p-type GaN contact layer is formed on the p-type GaN layer as a mesa, an anode electrode and a cathode electrode are formed on the undoped $Al_xGa_{1-x}N$ layer so as to sandwich the second undoped GaN layer and the p-type GaN layer, a groove is formed in a part of the undoped $Al_xGa_{1-x}N$ layer between the anode electrode and the second undoped GaN layer and the p-type GaN layer such that it continues to the side of the second undoped GaN layer and the p-type GaN layer, the p-electrode is buried in the inside of the groove, and further extends from the side of the second undoped GaN layer and the p-type GaN layer on the p-type GaN contact layer and is electrically connected with the anode electrode. In the third example, a groove is formed in the undoped $Al_xGa_{1-x}N$ layer, the second undoped GaN layer and the p-type GaN layer to a depth reaching at least the undoped $Al_xGa_{1-x}N$ layer, the p-type GaN contact layer is buried in the inside of the groove, the p-type GaN contact layer and the two-dimensional hole gas form a junction, the second undoped GaN layer and the p-type GaN layer on the undoped $Al_xGa_{1-x}N$ layer are patterned as a mesa, an anode electrode and a cathode electrode are formed so as to sandwich the second undoped GaN layer and the p-type GaN layer, another groove with a depth reaching at least the first undoped GaN layer is formed such that it continues to the p-type GaN contact layer, a gate electrode is buried in the inside of another groove and further extends on the p-type GaN contact layer and the cathode electrode is formed on the undoped $Al_xGa_{1-x}N$ layer.

Furthermore, according to the invention, there is provided a semiconductor device, comprising:

a polarization super junction region and a p-electrode contact region which are provided separately each other, the polarization super junction region, comprising:

the first undoped GaN layer, an undoped or doped $Al_xGa_{1-x}N$ layer (0<x<1) on the first undoped GaN layer, the second undoped GaN layer on the undoped or doped $Al_xGa_{1-x}N$ layer; and a Mg-doped p-type GaN layer on the second undoped GaN layer, the undoped or doped $Al_xGa_{1-x}N$ layer having an Al composition x and a thickness such that the concentration of a two-dimensional electron gas of a reference HEMT with a structure comprising the first undoped GaN layer and the undoped or doped $Al_xGa_{1-x}N$ layer on the first undoped GaN layer is not smaller than $0.89 \times 10^{13}$ cm$^{-2}$ and not larger than $1.70 \times 10^{13}$ cm$^{-2}$, and $$tR \geq 24.2/(n_s - 7.83) + 47.4 \text{ [nm]}$$

being satisfied when the thickness of the second undoped GaN layer is denoted as u [nm], the thickness of the p-type GaN layer is denoted as v [nm], the Mg concentration of the p-type GaN layer is denoted as w [cm$^{-3}$], the concentration of the two-dimensional electron gas of the reference HEMT is denoted as $n_s$ in unit of $10^{12}$ cm$^{-2}$ and the reduced thickness tR is defined as $$tR = u + v(1 + w \times 10^{-18}),$$

the p-electrode contact region, comprising:

a p-type GaN contact layer which is doped with Mg heavier than the p-type GaN layer, provided in contact with the p-type GaN layer only in the p-electrode contact region; and a p-electrode which is in ohmic contact with the p-type GaN contact layer, a two-dimensional hole gas being formed in the second undoped GaN layer in the vicinity part of a hetero-interface between the undoped or doped $Al_xGa_{1-x}N$ layer and the second undoped GaN layer, and a two-dimensional electron gas being formed in the first undoped GaN layer in the vicinity part of a hetero-interface between the first undoped GaN layer and the undoped or doped $Al_xGa_{1-x}N$ layer at a non-operating time.

In this invention of the semiconductor device, the explanation concerning the above invention of the semiconductor device comes into effect unless it is contrary to its character.

Furthermore, in the two inventions of the semiconductor device, the explanation in patent literature 3 comes into effect unless it is contrary to its character.

Furthermore, according to the invention, there is provided an electric equipment, comprising:

at least a semiconductor device, the semiconductor device, comprising:

a polarization super junction region and a p-electrode contact region which are provided separately each other, the polarization super junction region, comprising:

the first undoped GaN layer, an undoped $Al_xGa_{1-x}N$ layer ($0.17 \leq x \leq 0.35$) with a thickness not smaller than 25 nm and not larger than 47 nm on the first undoped GaN layer, the second undoped GaN layer on the undoped $Al_xGa_{1-x}N$ layer; and a Mg-doped p-type GaN layer on the second undoped GaN layer, $$tR \geq 0.864/(x-0.134)+46.0 \text{ [nm]}$$

being satisfied when the thickness of the second undoped GaN layer is denoted as u [nm], the thickness of the p-type GaN layer is denoted as v [nm], the Mg concentration of the p-type GaN layer is denoted as w [cm$^{-3}$] and the reduced thickness tR is defined as $$tR = u + v(1 + w \times 10^{-18}),$$

the p-electrode contact region, comprising:

a p-type GaN contact layer which is doped with Mg heavier than the p-type GaN layer, provided in contact with the p-type GaN layer only in the p-electrode contact region; and a p-electrode which is in ohmic contact with the p-type GaN contact layer, a two-dimensional hole gas being formed in the second undoped GaN layer in the vicinity part of a hetero-interface between the undoped $Al_xGa_{1-x}N$ layer and the second undoped GaN layer, and a two-dimensional electron gas being formed in the first undoped GaN layer in the vicinity part of a hetero-interface between the first undoped GaN layer and the undoped $Al_xGa_{1-x}N$ layer at a non-operating time.

Furthermore, according to the invention, there is provided an electric equipment, comprising:

at least a semiconductor device, the semiconductor device, comprising:

a polarization super junction region and a p-electrode contact region which are provided separately each other, the polarization super junction region, comprising:

the first undoped GaN layer, an undoped or doped $Al_xGa_{1-x}N$ layer ($0<x<1$) on the first undoped GaN layer, the second undoped GaN layer on the undoped or doped $Al_xGa_{1-x}N$ layer; and a Mg-doped p-type GaN layer on the second undoped GaN layer, the undoped or doped $Al_xGa_{1-x}N$ layer having an Al composition x and a thickness such that the concentration of a two-dimensional electron gas of a reference HEMT with a structure comprising the first undoped GaN layer and the undoped or doped $Al_xGa_{1-x}N$ layer on the first undoped GaN layer is not smaller than $0.89 \times 10^{13}$ cm$^{-2}$ and not larger than $1.70 \times 10^{13}$ cm$^{-2}$, $$tR \geq 24.2/(n_s-7.83)+47.4 \text{ [nm]}$$

being satisfied when the thickness of the second undoped GaN layer is denoted as u [nm], the thickness of the p-type GaN layer is denoted as v [nm], the Mg concentration of the p-type GaN layer is denoted as w [cm$^{-3}$], the concentration of the two-dimensional electron gas of the reference HEMT is denoted as $n_s$ in unit of $10^{12}$ cm$^{-2}$ and the reduced thickness tR is defined as $$tR = u + v(1 + w \times 10^{-18}),$$

the p-electrode contact region, comprising:

a p-type GaN contact layer which is doped with Mg heavier than the p-type GaN layer, provided in contact with the p-type GaN layer only in the p-electrode contact region; and a p-electrode which is in ohmic contact with the p-type GaN contact layer, a two-dimensional hole gas being formed in the second undoped GaN layer in the vicinity part of a hetero-interface between the undoped or doped $Al_xGa_{1-x}N$ layer and the second undoped GaN layer, and a two-dimensional electron gas being formed in the first undoped GaN layer in the vicinity part of a hetero-interface between the first undoped GaN layer and the undoped or doped $Al_xGa_{1-x}N$ layer at a non-operating time.

Here, the electric equipment includes all equipments using electricity and their uses, functions, sizes, etc. are not limited. They are, for example, electronic equipments, mobile bodies, power plants, construction machinery, machine tools, etc. The electronic equipments are, for example, robots, computers, game equipments, car equipments, home electric products (air conditioners etc.), industrial products, mobile phones, mobile equipments, IT equipments (servers etc.), power conditioners used in solar power generation systems, power supplying systems, etc. The mobile bodies are railroad cars, motor vehicles (electric cars etc.), motorcycles, aircrafts, rockets, spaceships, etc.

Furthermore, according to the invention, there is provided a bidirectional field effect transistor, comprising:

a polarization super junction region and a p-electrode contact region which are provided separately each other, the polarization super junction region, comprising:

the first undoped GaN layer, an undoped $Al_xGa_{1-x}N$ layer ($0.17 \leq x \leq 0.35$) with a thickness not smaller than 25 nm and not larger than 47 nm on the first undoped GaN layer, the second undoped GaN layer on the undoped $Al_xGa_{1-x}N$ layer; and a Mg-doped p-type GaN layer on the second undoped GaN layer, $$tR \geq 0.864/(x-0.134)+46.0 \text{ [nm]}$$

being satisfied when the thickness of the second undoped GaN layer is denoted as u [nm], the thickness of the p-type GaN layer is denoted as v [nm], the Mg concentration of the p-type GaN layer is denoted as w [cm$^{-3}$] and the reduced thickness tR is defined as $$tR = u + v(1 + w \times 10^{-18}),$$

the second undoped GaN layer and the p-type GaN layer having a shape of a mesa, the first source electrode and the second source electrode being provided on the undoped $Al_xGa_{1-x}N$ layer so as to sandwich the second undoped GaN layer and the p-type GaN layer, the p-electrode contact region, comprising:

the first p-type GaN contact layer which is doped with Mg heavier than the p-type GaN layer, provided in contact with the p-type GaN layer only in the p-electrode contact region, the second p-type GaN contact layer which is doped with Mg heavier than the p-type GaN layer, provided in contact with the p-type GaN layer only in the p-electrode contact region and separately from the first p-type GaN contact layer, the first p-electrode constituting the first gate electrode which is in ohmic contact with the first p-type GaN contact layer; and the second p-electrode constituting the second gate electrode which is in ohmic contact with the second p-type GaN contact layer, a two-dimensional hole gas being formed in the second undoped GaN layer in the vicinity part of a hetero-interface between the undoped $Al_xGa_{1-x}N$ layer and the second undoped GaN layer, and a two-dimensional electron gas being formed in the first undoped GaN layer in the vicinity part of a hetero-interface between the first undoped GaN layer and the undoped $Al_xGa_{1-x}N$ layer at a non-operating time.

Furthermore, according to the invention, there is provided a bidirectional field effect transistor, comprising:

a polarization super junction region and a p-electrode contact region which are provided separately each other, the polarization super junction region, comprising:

the first undoped GaN layer, an undoped or doped $Al_xGa_{1-x}N$ layer (0<x<1) on the first undoped GaN layer, the second undoped GaN layer on the undoped or doped $Al_xGa_{1-x}N$ layer; and a Mg-doped p-type GaN layer on the second undoped GaN layer, the undoped or doped $Al_xGa_{1-x}N$ layer having an Al composition x and a thickness such that the concentration of a two-dimensional electron gas of a reference HEMT with a structure comprising the first undoped GaN layer and the undoped or doped $Al_xGa_{1-x}N$ layer on the first undoped GaN layer is not smaller than $0.89 \times 10^{13}$ cm$^{-2}$ and not larger than $1.70 \times 10^{13}$ cm$^{-2}$, and $$tR \geq 24.2/(n_s-7.83)+47.4 \text{ [nm]}$$

being satisfied when the thickness of the second undoped GaN layer is denoted as u [nm], the thickness of the p-type GaN layer is denoted as v [nm], the Mg concentration of the p-type GaN layer is denoted as w [cm$^{-3}$], the concentration of the two-dimensional electron gas of the reference HEMT is denoted as $n_s$ in unit of $10^{12}$ cm$^{-2}$ and the reduced thickness tR is defined as $$tR=u+v(1+w \times 10^{-18}),$$

the second undoped GaN layer and the p-type GaN layer having a shape of a mesa, the first source electrode and the second source electrode being provided on the undoped or doped $Al_xGa_{1-x}N$ layer so as to sandwich the second undoped GaN layer and the p-type GaN layer, the p-electrode contact region, comprising:

the first p-type GaN contact layer which is doped with Mg heavier than the p-type GaN layer, provided in contact with the p-type GaN layer only in the p-electrode contact region, the second p-type GaN contact layer which is doped with Mg heavier than the p-type GaN layer, provided in contact with the p-type GaN layer only in the p-electrode contact region and separately from the first p-type GaN contact layer, the first p-electrode constituting the first gate electrode which is in ohmic contact with the first p-type GaN contact layer; and the second p-electrode constituting the second gate electrode which is in ohmic contact with the second p-type GaN contact layer, a two-dimensional hole gas being formed in the second undoped GaN layer in the vicinity part of a hetero-interface between the undoped or doped $Al_xGa_{1-x}N$ layer and the second undoped GaN layer, and a two-dimensional electron gas being formed in the first undoped GaN layer in the vicinity part of a hetero-interface between the first undoped GaN layer and the undoped or doped $Al_xGa_{1-x}N$ layer at a non-operating time.

Furthermore, according to the invention, there is provided an electric equipment, comprising:

one or more bidirectional switches, at least one of the bidirectional switches being a bidirectional field effect transistor, comprising:

a polarization super junction region and a p-electrode contact region which are provided separately each other, the polarization super junction region, comprising:

the first undoped GaN layer, an undoped $Al_xGa_{1-x}N$ layer ($0.17 \leq x \leq 0.35$) with a thickness not smaller than 25 nm and not larger than 47 nm on the first undoped GaN layer, the second undoped GaN layer on the undoped $Al_xGa_{1-x}N$ layer; and a Mg-doped p-type GaN layer on the second undoped GaN layer, $$tR \geq 0.864/(x-0.134)+46.0 \text{ [nm]}$$

being satisfied when the thickness of the second undoped GaN layer is denoted as u [nm], the thickness of the p-type GaN layer is denoted as v [nm], the Mg concentration of the p-type GaN layer is denoted as w [cm$^{-3}$] and the reduced thickness tR is defined as $$tR=u+v(1+w \times 10^{-18}),$$

the second undoped GaN layer and the p-type GaN layer having a shape of a mesa, the first source electrode and the second source electrode being provided on the undoped $Al_xGa_{1-x}N$ layer so as to sandwich the second undoped GaN layer and the p-type GaN layer, the p-electrode contact region, comprising:

the first p-type GaN contact layer which is doped with Mg heavier than the p-type GaN layer, provided in contact with the p-type GaN layer only in the p-electrode contact region, the second p-type GaN contact layer which is doped with Mg heavier than the p-type GaN layer, provided in contact with the p-type GaN layer only in the p-electrode contact region and separately from the first p-type GaN contact layer, the first p-electrode constituting the first gate electrode which is in ohmic contact with the first p-type GaN contact layer; and the second p-electrode constituting the second gate electrode which is in ohmic contact with the second p-type GaN contact layer, a two-dimensional hole gas being formed in the second undoped GaN layer in the vicinity part of a hetero-interface between the undoped $Al_xGa_{1-x}N$ layer and the second undoped GaN layer, and a two-dimensional electron gas being formed in the first undoped GaN layer in the vicinity part of a hetero-interface between the first undoped GaN layer and the undoped $Al_xGa_{1-x}N$ layer at a non-operating time.

Furthermore, according to the invention, there is provided an electric equipment, comprising:

one or more bidirectional switches,
at least one of the bidirectional switches being
a bidirectional field effect transistor, comprising:
a polarization super junction region and a p-electrode contact region which are provided separately each other,
the polarization super junction region, comprising:
the first undoped GaN layer,
an undoped or doped $Al_xGa_{1-x}N$ layer ($0<x<1$) on the first undoped GaN layer,
the second undoped GaN layer on the undoped or doped $Al_xGa_{1-x}N$ layer; and
a Mg-doped p-type GaN layer on the second undoped GaN layer,
the undoped or doped $Al_xGa_{1-x}N$ layer having an Al composition x and a thickness such that the concentration of a two-dimensional electron gas of a reference HEMT with a structure comprising the first undoped GaN layer and the undoped or doped $Al_xGa_{1-x}N$ layer on the first undoped GaN layer is not smaller than $0.89 \times 10^{13}$ cm$^{-2}$ and not larger than $1.70 \times 10^{13}$ cm$^{-2}$, and $$tR \geq 24.2/(n_s - 7.83) + 47.4 \text{ [nm]}$$

being satisfied when the thickness of the second undoped GaN layer is denoted as u [nm], the thickness of the p-type GaN layer is denoted as v [nm], the Mg concentration of the p-type GaN layer is denoted as w [cm$^{-3}$], the concentration of the two-dimensional electron gas of the reference HEMT is denoted as $n_s$ in unit of $10^{12}$ cm$^{-2}$ and the reduced thickness tR is defined as $$tR = u + v(1 + w \times 10^{-18}),$$

the second undoped GaN layer and the p-type GaN layer having a shape of a mesa,
the first source electrode and the second source electrode being provided on the undoped or doped $Al_xGa_{1-x}N$ layer so as to sandwich the second undoped GaN layer and the p-type GaN layer,
the p-electrode contact region, comprising:
the first p-type GaN contact layer which is doped with Mg heavier than the p-type GaN layer, provided in contact with the p-type GaN layer only in the p-electrode contact region,
the second p-type GaN contact layer which is doped with Mg heavier than the p-type GaN layer, provided in contact with the p-type GaN layer only in the p-electrode contact region and separately from the first p-type GaN contact layer,
the first p-electrode constituting the first gate electrode which is in ohmic contact with the first p-type GaN contact layer; and
the second p-electrode constituting the second gate electrode which is in ohmic contact with the second p-type GaN contact layer,
a two-dimensional hole gas being formed in the second undoped GaN layer in the vicinity part of a hetero-interface between the undoped or doped $Al_xGa_{1-x}N$ layer and the second undoped GaN layer, and a two-dimensional electron gas being formed in the first undoped GaN layer in the vicinity part of a hetero-interface between the first undoped GaN layer and the undoped or doped $Al_xGa_{1-x}N$ layer at a non-operating time.

The electric equipment using the bidirectional field effect transistor includes a matrix converter, a multi-level inverter, etc. in addition to those exemplified above.

Furthermore, according to the invention, there is provided a mounted structure body, comprising:
a chip constituting a semiconductor device; and
a mount board on which the chip is flip chip mounted,
the semiconductor device being
a semiconductor device, comprising:
a polarization super junction region and a p-electrode contact region which are provided separately each other,
the polarization super junction region, comprising:
the first undoped GaN layer,
an undoped $Al_xGa_{1-x}N$ layer ($0.17 \leq x \leq 0.35$) with a thickness not smaller than 25 nm and not larger than 47 nm on the first undoped GaN layer,
the second undoped GaN layer on the undoped $Al_xGa_{1-x}N$ layer; and
a Mg-doped p-type GaN layer on the second undoped GaN layer, $$tR \geq 0.864/(x - 0.134) + 46.0 \text{ [nm]}$$

being satisfied when the thickness of the second undoped GaN layer is denoted as u [nm], the thickness of the p-type GaN layer is denoted as v [nm], the Mg concentration of the p-type GaN layer is denoted as w [cm$^{-3}$] and the reduced thickness tR is defined as $$tR = u + v(1 + w \times 10^{-18}),$$

the p-electrode contact region, comprising:
a p-type GaN contact layer which is doped with Mg heavier than the p-type GaN layer, provided in contact with the p-type GaN layer only in the p-electrode contact region,
a p-electrode which is in ohmic contact with the p-type GaN contact layer,
a two-dimensional hole gas being formed in the second undoped GaN layer in the vicinity part of a hetero-interface between the undoped $Al_xGa_{1-x}N$ layer and the second undoped GaN layer, and a two-dimensional electron gas being formed in the first undoped GaN layer in the vicinity part of a hetero-interface between the first undoped GaN layer and the undoped $Al_xGa_{1-x}N$ layer at a non-operating time.

Furthermore, according to the invention, there is provided a mounted structure body, comprising:
a chip constituting a semiconductor device; and
a mount board on which the chip is flip chip mounted,
the semiconductor device being
a semiconductor device, comprising:
a polarization super junction region and a p-electrode contact region which are provided separately each other,
the polarization super junction region, comprising:
the first undoped GaN layer,
an undoped or doped $Al_xGa_{1-x}N$ layer ($0<x<1$) on the first undoped GaN layer,
the second undoped GaN layer on the undoped or doped $Al_xGa_{1-x}N$ layer; and
a Mg-doped p-type GaN layer on the second undoped GaN layer,
the undoped or doped $Al_xGa_{1-x}N$ layer having an Al composition x and a thickness such that the concentration of a two-dimensional electron gas of a reference HEMT with a structure comprising the first undoped GaN layer and the undoped or doped $Al_xGa_{1-x}N$ layer on the first undoped GaN layer is not smaller than $0.89 \times 10^{13}$ cm$^{-2}$ and not larger than $1.70 \times 10^{13}$ cm$^{-2}$, and $$tR \geq 24.2/(n_s - 7.83) + 47.4 \text{ [nm]}$$

being satisfied when the thickness of the second undoped GaN layer is denoted as u [nm], the thickness of the p-type GaN layer is denoted as v [nm], the Mg concentration of the p-type GaN layer is denoted as w [cm$^{-3}$], the concentration of the two-dimensional electron gas of the reference HEMT is denoted as $n_s$ in unit of $10^{12}$ cm$^{-2}$ and the reduced thickness tR is defined as $$tR = u + v(1 + w \times 10^{-18}),$$

the p-electrode contact region, comprising:

a p-type GaN contact layer which is doped with Mg heavier than the p-type GaN layer, provided in contact with the p-type GaN layer only in the p-electrode contact region; and a p-electrode which is in ohmic contact with the p-type GaN contact layer, a two-dimensional hole gas being formed in the second undoped GaN layer in the vicinity part of a hetero-interface between the undoped or doped Al$_x$Ga$_{1-x}$N layer and the second undoped GaN layer, and a two-dimensional electron gas being formed in the first undoped GaN layer in the vicinity part of a hetero-interface between the first undoped GaN layer and the undoped or doped Al$_x$Ga$_{1-x}$N layer at a non-operating time.

Furthermore, according to the invention, there is provided a mounted structure body, comprising:

a chip constituting a semiconductor device; and
a mount board on which the chip is flip chip mounted, the semiconductor device being
a bidirectional field effect transistor, comprising:
a polarization super junction region and a p-electrode contact region which are provided separately each other,
the polarization super junction region, comprising:
the first undoped GaN layer,
an undoped Al$_x$Ga$_{1-x}$N layer ($0.17 \leq x \leq 0.35$) with a thickness not smaller than 25 nm and not larger than 47 nm on the first undoped GaN layer,
the second undoped GaN layer on the undoped Al$_x$Ga$_{1-x}$N layer; and
a Mg-doped p-type GaN layer on the second undoped GaN layer, $$tR \geq 0.864/(x - 0.134) + 46.0 \text{ [nm]}$$

being satisfied when the thickness of the second undoped GaN layer is denoted as u [nm], the thickness of the p-type GaN layer is denoted as v [nm], the Mg concentration of the p-type GaN layer is denoted as w [cm$^{-3}$] and the reduced thickness tR is defined as $$tR = u + v(1 + w \times 10^{-18}),$$

the second undoped GaN layer and the p-type GaN layer having a shape of a mesa, the first source electrode and the second source electrode being provided on the undoped Al$_x$Ga$_{1-x}$N layer so as to sandwich the second undoped GaN layer and the p-type GaN layer, the p-electrode contact region, comprising:

the first p-type GaN contact layer which is doped with Mg heavier than the p-type GaN layer, provided in contact with the p-type GaN layer only in the p-electrode contact region, the second p-type GaN contact layer which is doped with Mg heavier than the p-type GaN layer, provided in contact with the p-type GaN layer only in the p-electrode contact region and separately from the first p-type GaN contact layer, the first p-electrode constituting the first gate electrode which is in ohmic contact with the first p-type GaN contact layer; and the second p-electrode constituting the second gate electrode which is in ohmic contact with the second p-type GaN contact layer, a two-dimensional hole gas being formed in the second undoped GaN layer in the vicinity part of a hetero-interface between the undoped Al$_x$Ga$_{1-x}$N layer and the second undoped GaN layer, and a two-dimensional electron gas being formed in the first undoped GaN layer in the vicinity part of a hetero-interface between the first undoped GaN layer and the undoped Al$_x$Ga$_{1-x}$N layer at a non-operating time.

Furthermore, according to the invention, there is provided a mounted structure body, comprising:

a chip constituting a semiconductor device; and
a mount board on which the chip is flip chip mounted,
the semiconductor device being
a bidirectional field effect transistor, comprising:
a polarization super junction region and a p-electrode contact region which are provided separately each other,
the polarization super junction region, comprising:
the first undoped GaN layer,
an undoped or doped Al$_x$Ga$_{1-x}$N layer ($0<x<1$) on the first undoped GaN layer,
the second undoped GaN layer on the undoped or doped Al$_x$Ga$_{1-x}$N layer; and
a Mg-doped p-type GaN layer on the second undoped GaN layer, the undoped or doped Al$_x$Ga$_{1-x}$N layer having an Al composition x and a thickness such that the concentration of a two-dimensional electron gas of a reference HEMT with a structure comprising the first undoped GaN layer and the undoped or doped Al$_x$Ga$_{1-x}$N layer on the first undoped GaN layer is not smaller than $0.89 \times 10^{13}$ cm$^{-2}$ and not larger than $1.70 \times 10^{13}$ cm$^{-2}$, and $$tR \geq 24.2/(n_s - 7.83) + 47.4 \text{ [nm]}$$

being satisfied when the thickness of the second undoped GaN layer is denoted as u [nm], the thickness of the p-type GaN layer is denoted as v [nm], the Mg concentration of the p-type GaN layer is denoted as w [cm$^{-3}$], the concentration of the two-dimensional electron gas of the reference HEMT is denoted as $n_s$ in unit of $10^{12}$ cm$^{-2}$ and the reduced thickness tR is defined as $$tR = u + v(1 + w \times 10^{-18}),$$

the second undoped GaN layer and the p-type GaN layer having a shape of a mesa, the first source electrode and the second source electrode being provided on the undoped Al$_x$Ga$_{1-x}$N layer so as to sandwich the second undoped GaN layer and the p-type GaN layer, the p-electrode contact region, comprising:

the first p-type GaN contact layer which is doped with Mg heavier than the p-type GaN layer, provided in contact with the p-type GaN layer only in the p-electrode contact region, the second p-type GaN contact layer which is doped with Mg heavier than the p-type GaN layer, provided in contact with the p-type GaN layer only in the p-electrode contact region and separately from the first p-type GaN contact layer, the first p-electrode constituting the first gate electrode which is in ohmic contact with the first p-type GaN contact layer; and the second p-electrode constituting the second gate electrode which is in ohmic contact with the second p-type GaN contact layer, a two-dimensional hole gas being formed in the second undoped GaN layer in the vicinity part of a hetero-interface between the undoped or doped Al$_x$Ga$_{1-x}$N layer and the second undoped GaN layer, and a two-dimensional electron gas being formed in the first undoped GaN layer in the vicinity part of a hetero-interface between the first undoped GaN layer and the undoped or doped $Al_xGa_{1-x}N$ layer at a non-operating time.

In the inventions of the electric equipment, the bidirectional field effect transistor and the mounted structure body, the explanation concerning the above two inventions of the semiconductor device comes into effect unless it is contrary its character. As the mount board, a board having good thermal conductivity is used and selected from conventionally known boards as needed.

Effect of the Invention

According to the invention, it is possible to obtain the concentration of the two-dimensional hole gas formed in the second undoped GaN layer in the vicinity part of the hetero-interface between the undoped $Al_xGa_{1-x}N$ layer and the second undoped GaN layer equal to or higher than $1 \times 10^{12}$ cm$^{-2}$ at a non-operating time. With this, it is possible to easily overcome the tradeoff relation between the high voltage resistance and high speed in the semiconductor device using a polarization super junction proposed in patent literature 3 and non-patent literature 3. Therefore, it is possible to easily realize the semiconductor device or the bidirectional field effect transistor which can fundamentally ease the peak electric field occurring at a portion of the conducting channel, obtain the high voltage resistance, eliminate the occurrence of current collapse, operate at a high speed and is low loss. And it is possible to realize a high performance electric equipment using the semiconductor device or the bidirectional field effect transistor. In addition, by the mounted structure body in which the chip constituting the semiconductor device or the bidirectional field effect transistor is flip chip mounted on the mount board, it is possible to obtain excellent heat dissipation even when the semiconductor device or the bidirectional field effect transistor is formed on an insulating substrate.

Additional features and advantages are described herein, and will be apparent from the following Detailed Description and the figures.

DETAILED DESCRIPTION

Modes for carrying out the invention (hereinafter referred as embodiments) will now be explained below.

1. The First Embodiment

Figure 6:
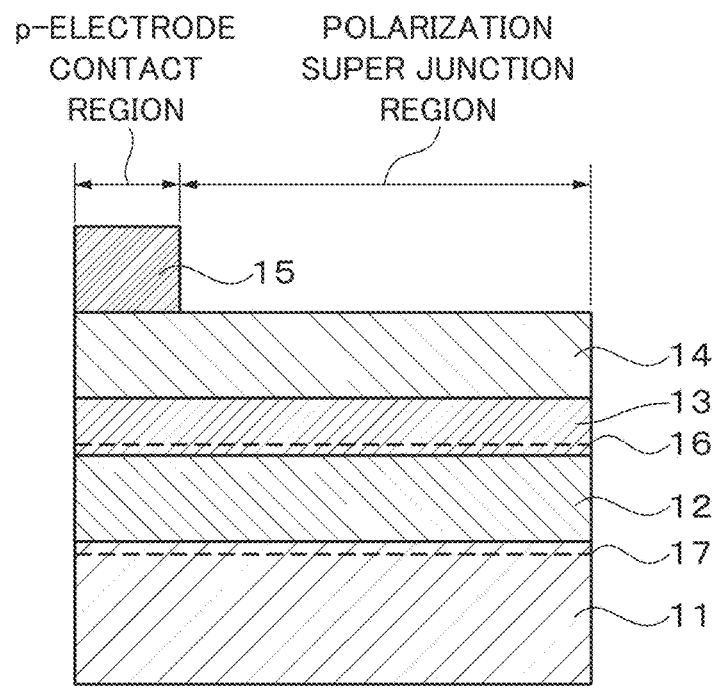
FIG. 6 A cross-sectional view showing the base structure of a GaN-based semiconductor device according to the first embodiment of the invention.

The GaN-based semiconductor device according to the first embodiment is described. The GaN-based semiconductor device is a polarization super junction device. FIG. 6 shows the basic structure of the GaN-based semiconductor device.

As shown in FIG. 6, the GaN-based semiconductor device comprises a polarization super junction region and a p-electrode contact region which are provided separately each other. In the polarization super junction region, an undoped GaN layer 11, an undoped $Al_xGa_{1-x}N$ layer 12 ($0.17 \leq x \leq 0.35$) with a thickness not smaller than 25 nm and not larger than 47 nm, an undoped GaN layer 13 and a Mg-doped p-type GaN layer 14 are stacked in order on a base substrate (not shown) such as, for example, a C-plane sapphire substrate on which GaN-based semiconductor grows in C-plane orientation. In the p-electrode contact region, further provided is a p-type GaN contact layer (hereinafter referred as "a $p^+$-type GaN contact layer") in which Mg is doped heavier than the p-type GaN layer 14 in contact with the p-type GaN layer 14 only in the p-electrode contact region. A p-electrode is electrically connected with the p-type GaN contact layer. In FIG. 6, as an example, a case where the $p^+$-type GaN contact layer 15 with a shape of a mesa is stacked on the p-type GaN layer 14.

In the GaN-based semiconductor device, at a non-operating time, due to piezopolarization and spontaneous polarization, positive fixed charge is induced in the undoped $Al_xGa_{1-x}N$ layer 12 in the vicinity part of a hetero-interface between the undoped GaN layer 11 and the undoped $Al_xGa_{1-x}N$ layer 12 on the side of the base substrate, and negative fixed charge is induced in the undoped $Al_xGa_{1-x}N$ layer 12 in the vicinity part of a hetero-interface between the undoped $Al_xGa_{1-x}N$ layer 12 and the undoped GaN layer 13 on the opposite side of the base substrate. As a result, in the GaN-based semiconductor device, at a non-operating time, a two-dimensional hole gas (2DHG) 16 is formed in the undoped GaN layer 13 in the vicinity part of the hetero-interface between the undoped $Al_xGa_{1-x}N$ layer 12 and the undoped GaN layer 13 and a two-dimensional electron gas (2DEG) 17 is formed in the undoped GaN layer 11 in the vicinity part of the hetero-interface between the undoped GaN layer 11 and the undoped $Al_xGa_{1-x}N$ layer 12.

Figure 7:
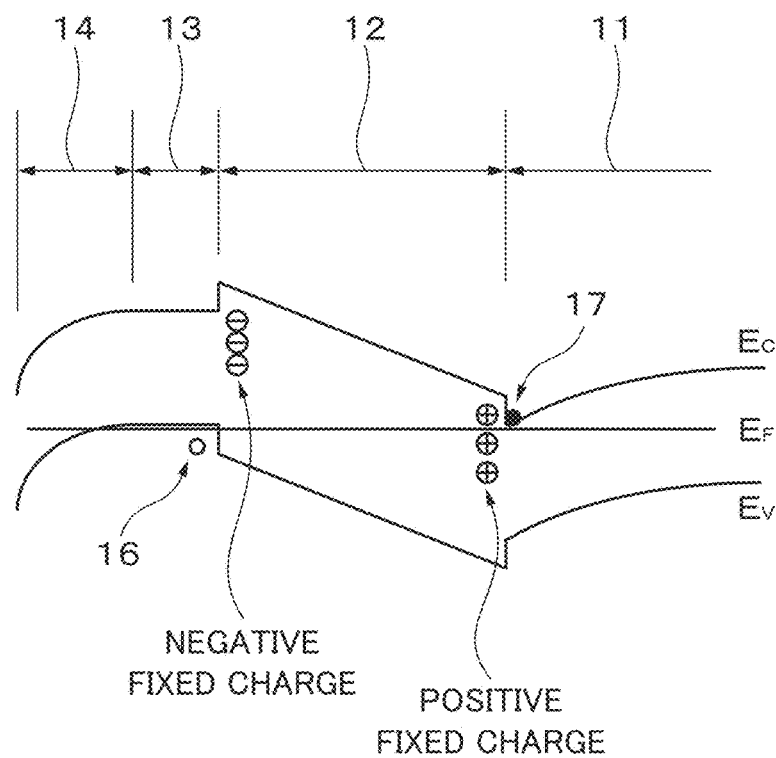
FIG. 7 A schematic view showing an energy band structure of the GaN-based semiconductor device according to the first embodiment of the invention.

FIG. 7 shows the energy band structure of the GaN-based semiconductor device. In FIG. 7, $E_v$ denotes the energy of the top of the valence band, $E_c$ denotes the energy of the bottom of the conduction band, and $E_F$ denotes the Fermi level. By setting at least one of the thickness and the Al composition x of the undoped $Al_xGa_{1-x}N$ layer 12 larger than that of the conventional HFET, the potential differences resulting from the polarization at the hetero-interface between the undoped $Al_xGa_{1-x}N$ layer 12 and the undoped GaN layer 13 and the hetero-interface between the undoped GaN layer 11 and the undoped $Al_xGa_{1-x}N$ layer 12 are increased and thereby the energy $E_v$ of the top of the valence band of the undoped $Al_xGa_{1-x}N$ layer 12 is increased to the Fermi level $E_F$. In this case, if only the undoped GaN layer 13 is provided on the undoped $Al_xGa_{1-x}N$ layer 12, the negative fixed charge due to the polarization is compensated by surface levels only by the undoped GaN layer 13, and therefore the 2DHG 16 is not formed in the undoped GaN layer 13 in the vicinity part of the hetero-interface between the undoped $Al_xGa_{1-x}N$ layer 12 and the undoped GaN layer 13. Therefore, by providing the p-type GaN layer 14 on the undoped GaN layer 13, the energy $E_v$ of the top of the valence band of the p-type GaN layer 14 is increased to the Fermi level $E_F$. As a result, the 2DHG 16 is formed in the undoped GaN layer 13 in the vicinity part of the hetero-interface between the undoped $Al_xGa_{1-x}N$ layer 12 and the undoped GaN layer 13. In addition, the 2DEG 17 is formed in the undoped GaN layer 11 in the vicinity part of the hetero-interface between the undoped GaN layer 11 and the undoped $Al_xGa_{1-x}N$ layer 12.

Figure 8A:
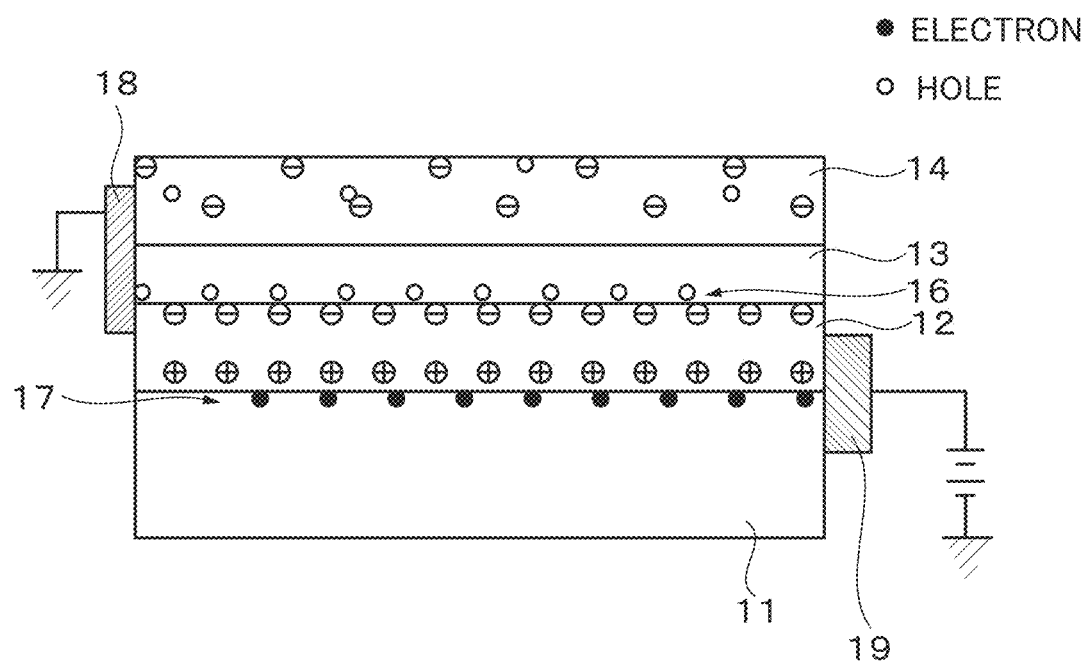
FIG. 8A A schematic view for explaining operation of the GaN-based semiconductor device according to the first embodiment of the invention.
Figure 8B:
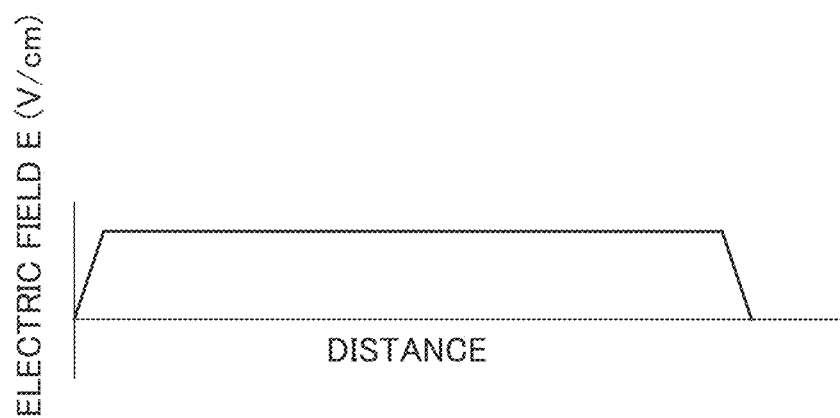
FIG. 8B A schematic view for explaining operation of the GaN-based semiconductor device according to the first embodiment of the invention.

Suppose now, for example, as shown in FIG. 8A, considered is a case where an anode electrode 18 is formed on one end surface of the p-type GaN layer 14 such that it extends to the position of the 2DHG 16, and a cathode electrode 19 is formed on one end surface of the undoped $Al_xGa_{1-x}N$ layer 12 such that it extends to the position of the 2DEG 17. The anode electrode 18 is made of, for example, Ni and the cathode electrode 19 is made of, for example, a Ti/Al/Au multilayer film. A reverse bias voltage is applied between the anode electrode 18 and the cathode electrode 19. FIG. 8B shows the electric field distribution along the undoped $Al_xGa_{1-x}N$ layer 12 at this time. As shown in FIG. 8B, by applying the reverse bias voltage, both concentrations of the 2DHG 16 and the 2DEG 17 are decreased by the same amount and both end portions of the 2DHG 16 and the 2DEG 17 are depleted. If the concentrations of the 2DHG 16 and the 2DEG 17 change by the same amount, the change amount of charge is essentially zero. Therefore, the electric field distribution becomes the electric field distribution of the super junction and no peak of the electric field occurs. As a result, it is possible to improve the high voltage resistance and low current collapse performance.

Described below are structure parameters in the GaN-based semiconductor device in which the 2DHG 16 and the 2DEG 17 simultaneously exist.

That is, in the GaN-based semiconductor device, when the thickness of the undoped GaN layer 13 is denoted as u [nm], the thickness of the p-type GaN layer 14 is denoted as v [nm], the Mg concentration of the p-type GaN layer 14 is denoted as w [$cm^{-3}$] and the reduced thickness tR is defined as:

$$tR = u + v(1 + w \times 10^{-18}),$$

if $$tR \geq 0.864/(x - 0.134) + 46.0 \text{ [nm]}$$

is satisfied for the undoped $Al_xGa_{1-x}N$ layer 12 ($0.17 \leq x \leq 0.35$) with a thickness not smaller than 25 nm and not larger than 47 nm, it is possible to generate the 2DHG 16 with a concentration equal to or higher than $1 \times 10^{12}$ $cm^{-2}$.

Described below is the reason why the polarization super junction region and the p-electrode contact region are provided separately each other and the $p^+$-type GaN contact layer 15 is provided in contact with the p-type GaN layer 14 only in the p-electrode contact region and further tR is set as tR≥0.864/(x−0.134)+46.0 [nm].

In order to investigate the requirements (the acceptor concentration and the thickness) of the $p^+$-type GaN contact layer, samples 1 to 4 were prepared.

[Experiment 1]

Figure 9:
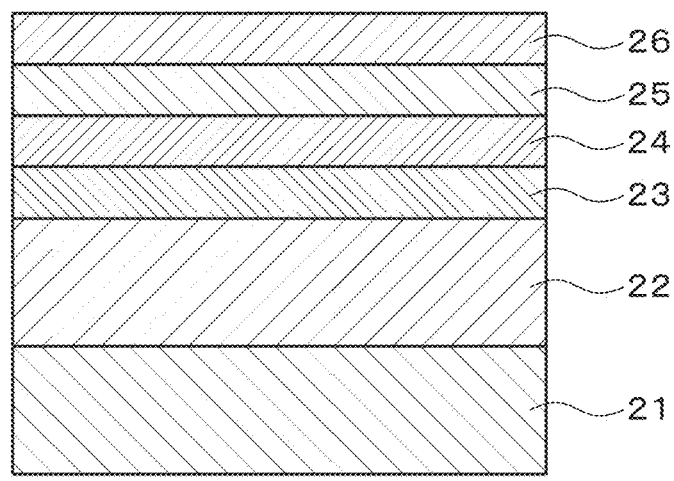
FIG. 9 A cross-sectional view showing samples 1 and 2 which were used in an experiment 1 conducted to consider the GaN-based semiconductor device according to the first embodiment of the invention.

The sample 1 was prepared as follows. As shown in FIG. 9, stacked on a (0001)-plane, that is, C-plane sapphire substrate 21 was a low temperature growth (530° C.) GaN buffer layer (not shown) with a thickness of 30 nm by the conventionally known MOCVD (metal organic chemical vapor deposition) method using TMG (trimethyl gallium) as Ga source, TMA (trimethyl aluminium) as Al source, $NH_3$ (ammonia) as nitrogen source, $N_2$ gas and $H_2$ gas as carrier gas. Then the growth temperature was raised to 1100° C. and an undoped GaN layer 22 with a thickness of 800 nm, an undoped $Al_xGa_{1-x}N$ layer 23 with a thickness of 47 nm and x=0.23, an undoped GaN layer 24 with a thickness of 25 nm, a Mg-doped p-type GaN layer 25 with a Mg concentration of $1.5×10^{19}$ $cm^{-3}$ and a thickness of 40 nm and a Mg-doped $p^+$-type GaN contact layer 26 with a Mg concentration of $5.0×10^{19}$ $cm^{-3}$ and a thickness of 50 nm were grown.

The sample 2 was prepared as the same as the sample 1 except that the thickness of the $p^+$-type GaN contact layer 26 is 120 nm.

Figure 10:
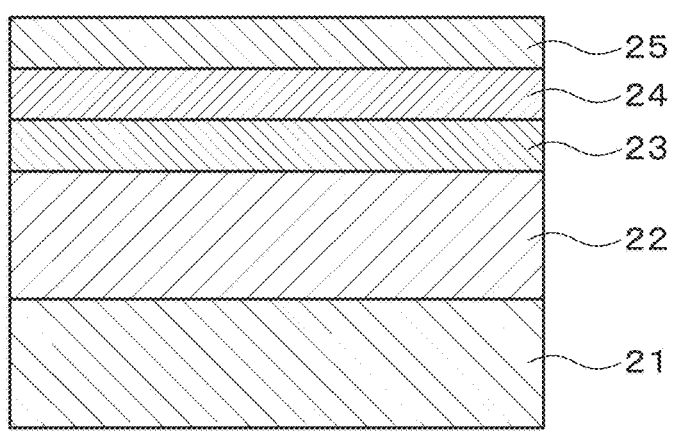
FIG. 10 A cross-sectional view showing a sample 3 which was used in the experiment 1 conducted to consider the GaN-based semiconductor device according to the first embodiment of the invention.

The sample 3 is a control sample for the sample 1 and 2 and was prepared as follows. As shown in FIG. 10, the low temperature growth (530° C.) GaN buffer layer (not shown) with a thickness of 30 nm was stacked on the C-plane sapphire substrate 21 by the MOCVD method, then the growth temperature was raised to 1100° C. and the undoped GaN layer 22 with a thickness of 800 nm, the undoped $Al_xGa_{1-x}N$ layer 23 with a thickness of 47 nm and x=0.23, the undoped GaN layer 24 with a thickness of 25 nm and the Mg-doped p-type GaN layer 25 with a Mg concentration of $5.0×10^{19}$ $cm^{-3}$ and a thickness of 20 nm were grown.

Figure 11:
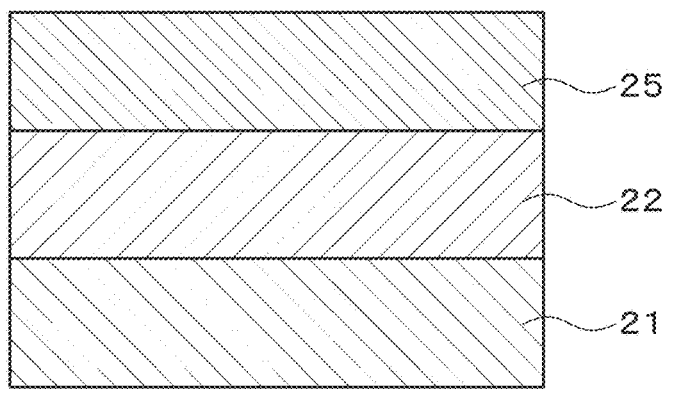
FIG. 11 A cross-sectional view showing a sample 4 which was used in the experiment 1 conducted to consider the GaN-based semiconductor device according to the first embodiment of the invention.

The sample 4 was a reference sample and prepared as follows. As shown in FIG. 11, the low temperature growth (530° C.) GaN buffer layer (not shown) with a thickness of 30 nm was stacked on the C-plane sapphire substrate 21 by the MOCVD method, then the growth temperature was raised to 1100° C. and the undoped GaN layer 22 with a thickness of 800 nm and the Mg-doped p-type GaN layer 25 with a Mg concentration of $5.0×10^{19}$ $cm^{-3}$ and a thickness of 600 nm were grown.

Figure 12A:
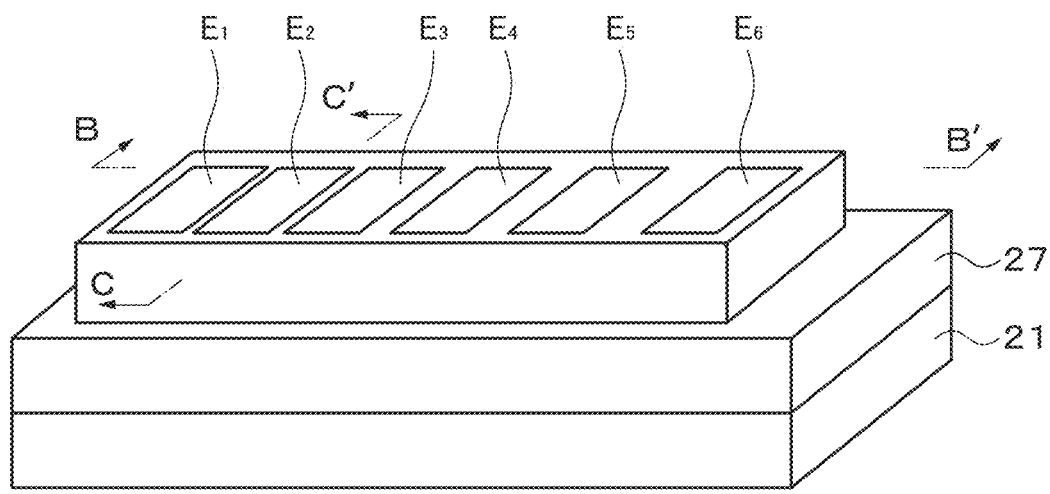
FIG. 12A A perspective view showing a sample for TLM measurement which was used in the experiment 1 conducted to consider the GaN-based semiconductor device according to the first embodiment of the invention.
Figure 12B:
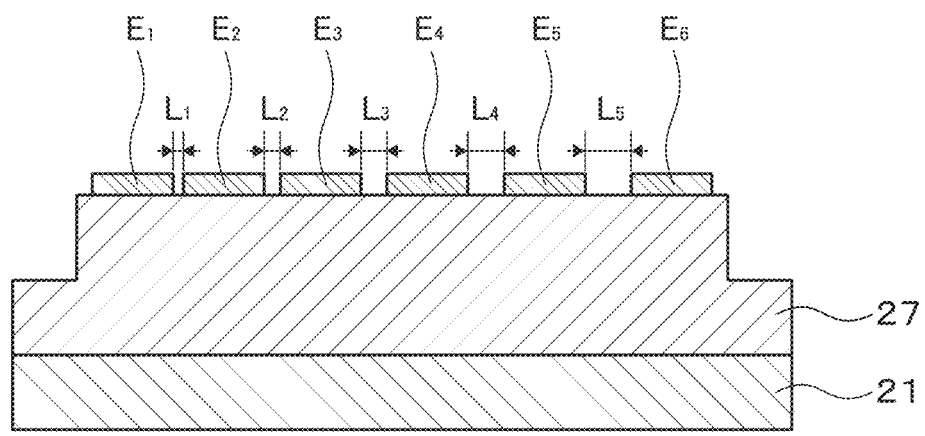
FIG. 12B A cross-sectional view showing the sample for TLM measurement which was used in the experiment 1 conducted to consider the GaN-based semiconductor device according to the first embodiment of the invention.
Figure 12C:
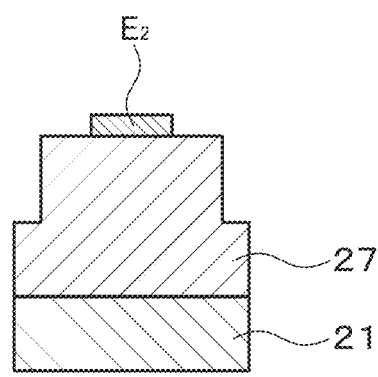
FIG. 12C A cross-sectional view showing the sample for TLM measurement which was used in the experiment 1 conducted to consider the GaN-based semiconductor device according to the first embodiment of the invention.

A TLM (Transmission Line Method) measurement sample was prepared by using the samples 1 to 4. Here, TLM is the standard method to separate and extract the contact resistance and the resistance of the conductor layer. As shown in FIG. 12A to FIG. 12c, a GaN-based semiconductor layer 27 on the C-plane sapphire substrate 21 was patterned into the predetermined shape by etching and the standard lithographic technology, and then electrodes $E_1$ to $E_6$ were formed on the GaN-based semiconductor layer 27 patterned. Here, FIG. 12A is a perspective view, FIG. 12B is a cross-sectional view along the B-B' line of FIG. 12A and FIG. 12C is a cross-sectional view along the C-C' line of FIG. 12A. The GaN-based semiconductor layer 27 means all GaN-based semiconductor layers grown on the C-plane sapphire substrate 21. The etching depth of the GaN-based semiconductor layer 27 was 600 nm. The electrodes $E_1$ to $E_6$ were made of an Ni/Au electrode and their sizes were 200 μm×200 μm. With respect to distance between electrodes, the distance $L_1$ between the electrode $E_1$ and the electrode $E_2$ is 7 μm, the distance $L_2$ between the electrode $E_2$ and the electrode $E_3$ was 10 μm and the distance $L_3$ between the electrode $E_3$ and the electrode $E_4$ was 15 μm, the distance $L_4$ between the electrode $E_4$ and the electrode $E_5$ was 30 μm and the distance $L_5$ between the electrode $E_5$ and the electrode $E_6$ was 50 μm.

Figure 13:
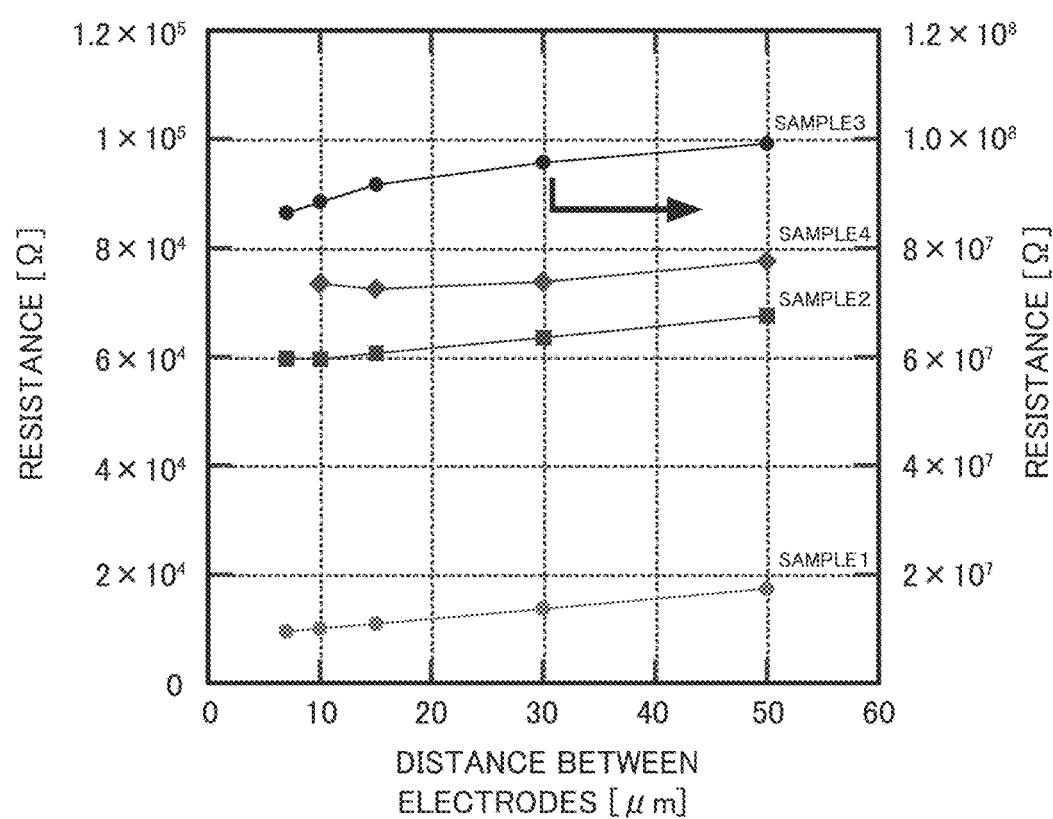
FIG. 13 A schematic view showing the relation between the distance between electrodes and the resistance which was measured by using the sample for TLM measurement prepared by using the samples 1 to 4.

FIG. 13 shows the result of measurement of the electric resistance for the distance between electrodes. In FIG. 13, the slope of the straight line obtained includes information of resistance of the conductor layer and coordinates of the point of intersection of the straight line going through the vertical axis with the horizontal axis includes information concerning contact resistance. As understood from FIG. 13, resistances of the sample 1, the sample 2 and the sample 4 were small. In contrast with this, the resistance of the sample 3 in which the thickness of the p-type GaN layer 25, which is the topmost p-layer, is 20 nm and very thin was large three orders of magnitude as compared with the sample 1.

The contact resistance and the sheet resistance were extracted from the data by the standard method. The result is shown in table 1.

TABLE 1

| SAMPLE NUMBER | SHEET RESISTANCE [kΩ/□] | CONTACT RESISTANCE [Ω · cm²] |
|---|---|---|
| 1 | 36.6 | $1.84 × 10^{-1}$ |
| 2 | 38.0 | $8.85 × 10^{0}$ |
| 3 | 56,600 | $1.3 × 10^{4}$ |
| 4 | 23.1 | $2.2 × 10^{1}$ |

As understood from table 1, the contact resistance of the sample 3 was very large. This shows that for the same surface concentration 20 nm is insufficient but 50 nm is sufficient as the thickness of the topmost p-type GaN layer. This means that a certain thickness of the topmast p-type GaN layer is necessary to obtain a low contact resistance. On the other hand, the contact resistance of the sample 2 in which the thickness of the $p^+$-type GaN contact layer 26 is 120 nm was rather large. With respect to the sample 4, although the structure was different, the contact resistance was not small for the p-type GaN layer 25 with a thickness of 600 nm. Its reason is considered that the sample 4 includes only the single layer p-type GaN layer 25 and its structure is different from those of the samples 1 and 2.

From the above result, it was known that when the Mg concentration, that is, acceptor concentration of the $p^+$-type GaN contact layer 26 is about $5.0×10^{19}$ $cm^{-3}$, the thickness of the $p^+$-type GaN contact layer 26 is necessary to be 20 nm or more.

[Experiment 2]

Based on the result of the experiment 1 additional experiment 2 was carried out. In the experiment 2, a sample 5 in which only surface Mg concentration was increased was prepared and its contact resistance was measured. More specifically, the sample 5 has a structure in which the $p^+$-type GaN contact layer 26 with a thickness of 50 nm in the structure of the sample 1 with the lowest contact resistance in the experiment 1 was divided into two layers of the upper layer and the lower layer and set as the upper layer/the lower layer=3 nm ($2×10^{20}$ $cm^{-3}$)/47 nm ($5×10^{19}$ $cm^{-3}$). The result is shown in table 2.

TABLE 2

| SAMPLE NUMBER | SHEET RESISTANCE [kΩ/□] | CONTACT RESISTANCE [Ω · cm²] |
|---|---|---|
| 5 | 35.0 | $6.5 × 10^{-2}$ |

From table 2, according to the sample 5, it was known that it is effective for reduction of contact resistance to increase the concentration of the topmost p$^+$-type GaN contact layer 26 more.

[Experiment 3]

In order to obtain necessary conditions of the polarization super junction region, an experiment 3 was carried out. In the experiment 3 the hole concentration of the polarization super junction region was measured by Hall measurement.

The polarization super junction device shows the maximum resistance voltage when the two-dimensional electron gas (2DEG) and the two-dimensional hole gas (2DHG) are respectively generated about equal amount by polarization effect. Actually, when the upper GaN layer includes only undoped layers, the band energy is influenced by surface levels, conversion of undoped layers into n-type layers, etc., so that few 2DHG is generated. In contrast with this, by compensating surface levels and lifting up the band near the surface by addition of Mg acceptors, it is possible to generate 2DHG in the upper hetero-interface of AlGaN/GaN.

Ideally, it is better that excess holes originating from Mg acceptors are not generated, the 2DEG concentration and the 2DHG concentration are the same and other holes do not exist. Therefore, it is necessary to design such a p-type GaN layer 25.

Especially in the samples 1 and 2 of the experiments 1 and 2, the total amount of Mg doped is large and holes originating from Mg acceptors exist excessively. Therefore, a Hall element shown in FIG. 14A and FIG. 14B (FIG. 14B shows a cross-sectional view along the A-A' line of FIG. 14A.) was prepared using the sample 1 shown in FIG. 9 and the relation between the thickness of the p-type GaN layer 25 and the hole concentration and the mobility was investigated.

Figure 14A:
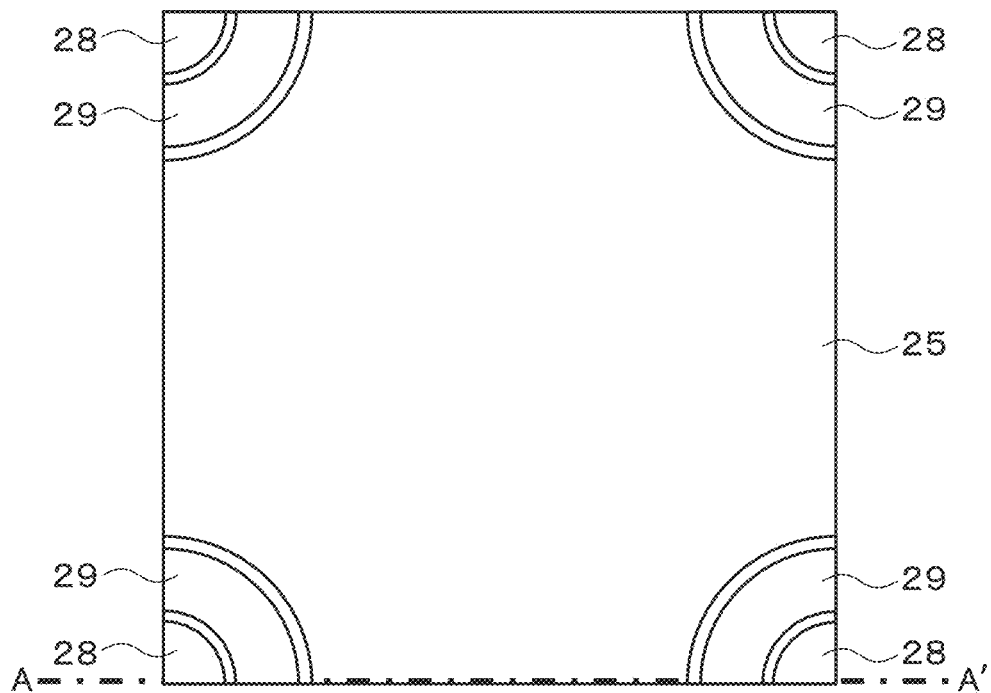
FIG. 14A A plan view showing the sample for Hall measurement which was prepared by using the sample 1 in an experiment 3 conducted to consider the GaN-based semiconductor device according to the first embodiment of the invention.
Figure 14B:
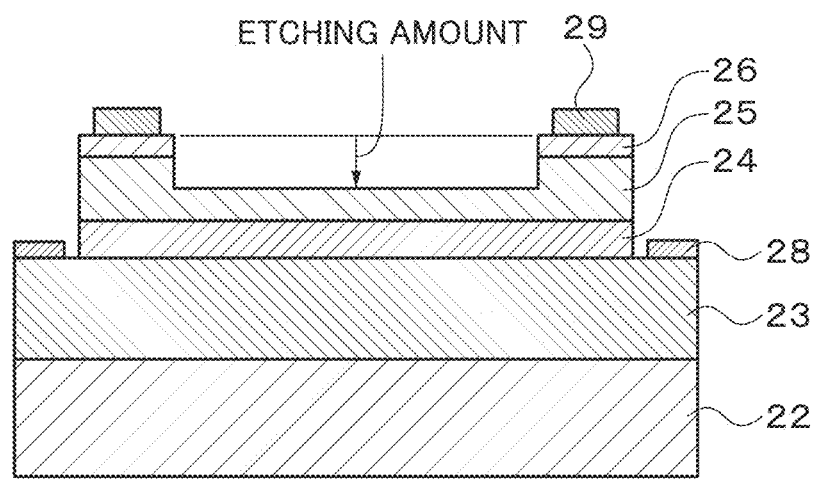
FIG. 14B A cross-sectional view of the sample for Hall measurement shown in FIG. 14A.

As shown in FIG. 14A and FIG. 14B, four corners of the undoped GaN layer 24, the p-type GaN layer 25 and the p$^+$-type GaN contact layer 26 of the sample 1 shown in FIG. 9 were patterned into the circular shape by etching, and then a Ti/Al/Au electrode 28 was formed on the surface of the undoped Al$_x$Ga$_{1-x}$N layer 23 exposed on the four corners and a Ni/Au electrode 29 was formed on the p$^+$-type GaN contact layer 26 of the four corners on its inside, thereby making possible the Hall measurement for two-dimensional holes and the Hall measurement for two-dimensional electrons.

Next, etching was carried out for the p$^+$-type GaN contact layer 26 except the four corners to a depth of 0 nm and 70 nm, respectively from its surface, and then the Hall measurement for holes and electrons was carried out. Here, a case where etching was carried out to the depth of 70 nm from the surface of the p$^+$-type GaN contact layer 26 corresponds to a case where not only the p$^+$-type GaN contact layer 26 but also the upper portion of the p-type GaN layer 25 thereunder was removed. The sample with an etching amount of 0 nm is referred as a sample 6 and the sample with an etching amount of 70 nm is referred as a sample 7.

Table 3 shows the sheet resistances, sheet concentrations and movilities of holes (2DHG) and electrons (2DHG) of the samples 6 and 7 at room temperature.

TABLE 3

| SAMPLE NUMBER | THICKNESS OF UNDOPED GaN LAYER 24 [nm] | Mg CONCENTRATION OF p$^+$-TYPE GaN LAYER 26/ p-TYPE GaN LAYER 25 [cm$^{-3}$] | THICKNESS OF p$^+$-TYPE GaN LAYER 26/ p-TYPE GaN LAYER 25 [nm] | HOLE SHEET RESISTANCE [Ω/□] | HOLE SHEET CONCENTRATION [cm$^{-2}$] | HOLE MOBILITY [cm$^2$/Vs] | ELECTRON SHEET RESISTANCE [Ω/□] | ELECTRON SHEET CONCENTRATION [cm$^{-2}$] | ELECTRON MOBILITY [cm$^2$/Vs] |
|---|---|---|---|---|---|---|---|---|---|
| 6 | 25 | 5.0 × 10$^{19}$/1.5 × 10$^{19}$ | 50/40 | 38,200 | 1.12 × 10$^{13}$ | 14.6 | 1160 | 5.21 × 10$^{12}$ | 1030 |
| 7 | 25 | 0/1.5 × 10$^{19}$ | 0/20 | 42,300 | 9.85 × 10$^{12}$ | 15.0 | 1120 | 5.27 × 10$^{12}$ | 1060 |

As understood from table 3, the hole concentration of the sample 6 with the etching amount of 0 nm was 1.12×10$^{13}$ cm$^{-2}$, while the electron concentration of the sample 6 was 5.21×10$^{12}$ cm$^{-2}$. When the thickness of the p$^+$-type GaN contact layer 26 is decreased by carrying out etching, the hole concentration was slightly decreased upon removing the p$^+$-type GaN contact layer 26, while the hole concentration was not decreased when the p-type GaN layer 25 thereunder was removed by 20 nm. The electron concentration showed a constant value of about 5.2×10$^{12}$ cm$^{-2}$ irrespective of etching amount. In the sample 7 with the etching amount of 70 nm, the hole concentration was 9.85×10$^{12}$ cm$^{-2}$.

Here, the sheet concentration of holes obtained is examined.

In the sample 6 with the etching amount of 0 nm, the total Mg doping amount of the whole of the p$^+$-type GaN contact layer 26 and the p-type GaN layer 25 is [Mg]=5.0×10$^{19}$ cm$^{-3}$×50×10$^{-7}$ cm+1.5×10$^{19}$ cm$^{-3}$×40×10$^{-7}$ cm=2.5×10$^{14}$ cm$^{-2}$+6×10$^{13}$ cm$^{-2}$=3.1×10$^{14}$ cm$^{-2}$. Assuming that the activation ratio of Mg acceptors at room temperature is 1.0%, the hole concentration is 3.1×10$^{14}$×1.0×10$^{-2}$=3.1×10$^{12}$ cm$^{-2}$. On the other hand, the experimental value was 1.12×10$^{13}$ cm$^{-2}$, as shown in table 3. Therefore, the hole concentration of the experiment was very large as compared with the above, and the difference {(11.2-3.1)×10$^{12}$ cm$^{-2}$}=8.1×10$^{12}$ cm$^{-2}$ corresponds to holes resulting from polarization.

Next, in the sample 7 with the etching amount of 70 nm, the total amount of Mg was [Mg]=1.5×10$^{19}$ cm$^{-3}$×20×10$^{-7}$ cm-3.0×10$^{13}$ cm$^{-2}$, and the resulting hole concentration was 3.0×10$^{11}$ cm$^{-2}$, assuming that the activation ratio of Mg acceptors at room temperature is 1.0%. However, the experimental value was 9.85×10$^{12}$ cm$^{-2}$. The difference between the value and the experimental value was (9.85-0.30)×10$^{12}$=9.55×10$^{12}$ cm$^{-2}$. From the result, it is understood that (9.55/9.85)×100=97.0% of holes of the sample 7 were not originated from Mg, that is, they were originated from polarization.

On the other hand, the concentration of two-dimensional electrons did not almost change by etching of the p$^+$-type GaN contact layer 26 and the p-type GaN layer 25 and was about 5.3×10$^{12}$ cm$^{-2}$.

Next, in order to demonstrate that the holes constitute the two-dimensional hole gas (2DHG) generated by polarization, the Hall measurement at low temperature was carried out. Since the level of Mg acceptor is 160 meV from the valence band and deep, holes drops to the Mg acceptor at a temperature lower than 200K and free holes do not exist. On the other hand, the 2DHG originating from polarization continues to exist at the hetero-interface since there exists no levels trapping it at low temperature. Therefore, the hole concentration at low temperature originates only from the 2DHG resulting from polarization. The result of measurement at liquid nitrogen temperature (77K) is shown in table 4.

concentration is 0 $cm^{-2}$, the polarization super junction device has the same structure as the ordinary AlGaN/GaN HEMT and in this state the peak electric field occurs at the anode end in a reverse-biased condition as well known. Finally, the intensity of the peak electric field depends on the balance of the 2DHG concentration and the 2DEG concentration. Essentially, when the 2DHG concentration is $\frac{1}{10}$ to $\frac{1}{5}$ of the 2DEG concentration, the polarization super junction effect is effective, that it, the device has the polarization super junction. When the 2DHG concentration is smaller than $\frac{1}{10}$ of the 2DEG concentration, it is assumed that there is no longer the difference between the device and the

TABLE 4

| | HOLE | | | ELECTRON | | |
|---|---|---|---|---|---|---|
| SAMPLE NUMBER | SHEET RESISTANCE [$\Omega/\square$] | SHEET CONCENTRATION [$cm^{-2}$] | MOBILITY [$cm^2/Vs$] | SHEET RESISTANCE [$\Omega/\square$] | SHEET CONCENTRATION [$cm^{-2}$] | MOBILITY [$cm^2/Vs$] |
| 6 | 11,900 | $9.2 \times 10^{12}$ | 57 | 315 | $5.2 \times 10^{12}$ | 2,200 |
| 7 | 13,400 | $9.0 \times 10^{12}$ | 52 | 284 | $5.2 \times 10^{13}$ | 2,200 |

Consider that at low temperature, the hole concentration is decreased by the amount originating from Mg. The 2DHG concentration at low temperature was $6.5 \times 10^{12}$ $cm^{-2}$ for the sample 6 with the etching amount of 0 nm and $6.0 \times 10^{12}$ $cm^{-2}$ for the sample 7 with the etching amount of 70 nm. The 2DHG concentration supposed from room temperature measurement data was demonstrated by measurement at 77K. The mobility of holes was improved by control of acoustic scattering and attained 52 to 57 $cm^2/Vs$.

[Experiment 4]

Next, minimizing the amount of Mg, in other words, the minimum amount of Mg necessary for the polarization super junction device was examined. That is, it is considered that the amount of Mg should be further reduced, and the limit of reduction was examined. For the purpose, an experiment 4 was carried out.

In the above experiments 1 to 3, the limit of the doping amount of Mg at which holes disappear was not yet found. Therefore, the limit experiment of the p-type GaN layer was carried out in the experiment 4. Here, the limit experiment aims to examine and explore a state where the 2DHG concentration cannot be measured and the polarization super junction device essentially loses performance.

ordinary HEMT. Here, $\frac{1}{5}$ of the 2DEG concentration is used as the criterion (effective limit value) of the 2DHG concentration.

Therefore, experimentally, first, an ordinary AlGaN/GaN HEMT structure was prepared as a reference sample, and its 2DEG concentration was confirmed. Then a polarization super junction structure was prepared by stacking an undoped GaN layer and a p-type GaN layer on an AlGaN layer as the same as the AlGaN layer of the AlGaN/GaN HEMT structure, and its 2DEG concentration was confirmed and the 2DHG concentration was measured.

More specifically, as the reference sample, a structure without the undoped GaN layer 24 and the p-type GaN layer 25, that is, the ordinary AlGaN/GaN HEMT structure was prepared for reference. Prepared on a sapphire substrate three kinds of HEMT sample (samples A-1, A-2 and A-3) with the HEMT structure comprising the undoped $Al_xGa_{1-x}N$ layer 23 with a thickness of 47 nm and x=0.23/ the undoped GaN layer 22, the thickness of the undoped GaN layer 22 being changed 500 nm, 600 nm and 800 nm, respectively. And the 2DEG concentration of the HEMT samples was measured. Table 5 shows the result.

TABLE 5

| SAMPLE NUMBER | Al COMPOSITION x OF UNDOPED $Al_xGa_{1-x}N$ LAYER 23 | THICKNESS OF UNDOPED $Al_xGa_{1-x}N$ LAYER 23 [nm] | THICKNESS OF UNDOPED GaN LAYER 22 [nm] | 2DEG CONCENTRATION [$cm^{-2}$] | MOBILITY [$cm^2/Vs$] |
|---|---|---|---|---|---|
| A-1 | 0.23 | 47 | 500 | $9.44 \times 10^{12}$ | 1022 |
| A-2 | 0.23 | 47 | 600 | $1.12 \times 10^{13}$ | 1041 |
| A-3 | 0.23 | 47 | 800 | $1.10 \times 10^{13}$ | 925 |

An effective state of the polarization super junction device is a state where 2DHG and 2DEG coexist so as to sandwich the undoped $Al_xGa_{1-x}N$ layer 23 and both 2DHG and 2DEG are simultaneously depleted at a reverse-biased condition. However, this does not require that the 2DHG concentration and the 2DEG concentration are equal each other. When the 2DHG concentration and the 2DEG concentration are unbalanced, the polarization super junction effect reduces accordingly. For example, in the extreme case where the 2DHG It is understood from table 5 that the 2DEG concentration changed a little depending on the thickness of the underlayer undoped GaN layer 22 and the 2DEG concentration was constant to be $1.1 \times 10^{13}$ $cm^{-2}$ when the thickness of the undoped GaN layer 22 was 600 nm or more.

Figure 15:
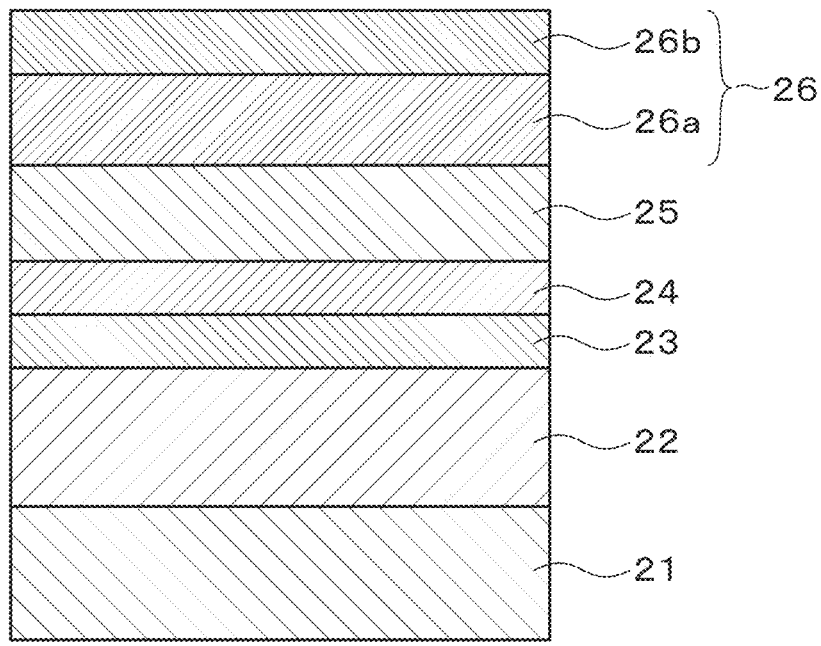
FIG. 15 A cross-sectional view showing samples 8 to 12 which were prepared in an experiment 4 conducted to consider the GaN-based semiconductor device according to the first embodiment of the invention.
Figure 16:
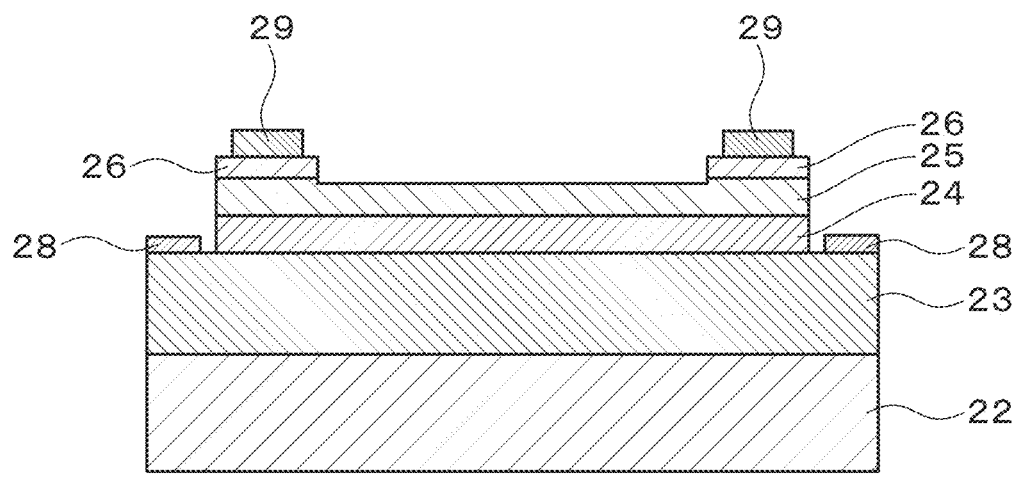
FIG. 16 A cross-sectional view showing the sample for Hall measurement which was prepared by using the samples 8 to 13.

Samples shown in FIG. 15 were prepared as new samples. As shown in FIG. 15, the samples have a structure similar to the sample 1. Prepared were five kinds of sample in which the thickness of the p-type GaN layer 25 is 40 nm, the Mg concentration of the p-type GaN layer 25 is changed as $5\times10^{18}$ cm$^{-3}$, $2\times10^{18}$ cm$^{-3}$, $5\times10^{17}$ cm$^{-3}$, $1\times10^{17}$ cm$^{-3}$, and 0 cm$^{-3}$ and the p$^+$-type GaN contact layer 26 comprises a lower p$^+$-type GaN contact layer 26a with a thickness of 47 nm and a Mg concentration of $5\times10^{19}$ cm$^{-3}$ and an upper p$^+$-type GaN contact layer 26b with a thickness of 3 nm and a Mg concentration of $2\times10^{20}$ cm$^{-3}$. A sample 13 was prepared by thinning the p-type GaN layer 25 of the sample 10 to a thickness of 20 nm by etching. As shown in FIG. 16, Hall measurement samples were prepared by using the samples 8 to 13 and Hall measurement was carried out by the same method as the experiment 4. The result is shown in table 6.

TABLE 6

| SAMPLE NUMBER | THICKNESS OF UNDOPED GaN LAYER 24 [nm] | Mg CONCENTRARION OF p-TYPE GaN LAYER 25 [cm$^{-3}$] | THICKNESS OF p-TYPE GaN LAYER 25 [nm] | HOLE | | | ELECTRON | | |
|---|---|---|---|---|---|---|---|---|---|
| | | | | SHEET RESISTANCE [Ω/□] | SHEET CONCENTRATION [cm$^{-2}$] | MOBILITY [cm$^2$/Vs] | SHEET RESISTANCE [Ω/□] | SHEET CONCENTRATION [cm$^{-2}$] | MOBILITY [cm$^2$/Vs] |
| 8 | 25 | $5 \times 10^{18}$ | 40 | 42,000 | $1.0 \times 10^{13}$ | 14.8 | 1,125 | $5.0 \times 10^{12}$ | 1,110 |
| 9 | 25 | $2 \times 10^{18}$ | 40 | 43,400 | $8 \times 10^{12}$ | 18 | 1,070 | $5.1 \times 10^{12}$ | 1,150 |
| 10 | 25 | $5 \times 10^{17}$ | 40 | 97,600 | $4 \times 10^{12}$ | 16 | 1,140 | $5.2 \times 10^{12}$ | 1,050 |
| 11 | 25 | $1 \times 10^{17}$ | 40 | 172,200 | $2.2 \times 10^{12}$ | 16.5 | 1,160 | $5.1 \times 10^{12}$ | 1,060 |
| 12 | 25 | 0 | 40 | ~325,500 | ~$1.2 \times 10^{12}$ | ~16 | 1,110 | $5.1 \times 10^{12}$ | 1,100 |
| 13 | 25 | $5 \times 10^{17}$ | 20 | UNMEASURABLE | UNMEASURABLE | UNMEASURABLE | 1,120 | $5.3 \times 10^{12}$ | 1,060 |

As shown in table 6, the sheet electron concentration was about $5.0\times10^{12}$ cm$^{-2}$-$5.3\times10^{12}$ cm$^{-2}$, which was only about ½ of the reference HEMT structure (the samples A-1, A-2 and A-3). The band rises by stacking the undoped GaN layer 24, the p-type GaN layer 25, etc., so that holes are generated and the electron concentration is reduced.

Prepared next were three kinds of samples 14 to 16 in which the thickness of the undoped GaN layer 24 is 25 nm, the thickness of the p-type GaN layer 25 is 20 nm and the Mg concentration is $2\times10^{18}$ cm$^{-3}$, $5\times10^{17}$ cm$^{-3}$ and 0 cm$^{-3}$, respectively. The result of Hall measurement of the samples 14 to 16 is shown in table 7.

TABLE 7

| SAMPLE NUMBER | THICKNESS OF UNDOPED GaN LAYER 24 [nm] | Mg CONCENTRARION OF p-TYPE GaN LAYER 25 [cm$^{-3}$] | THICKNESS OF p-TYPE GaN LAYER 25 [nm] | HOLE | | | ELECTRON | | |
|---|---|---|---|---|---|---|---|---|---|
| | | | | SHEET RESISTANCE [Ω/□] | SHEET CONCENTRATION [cm$^{-2}$] | MOBILITY [cm$^2$/Vs] | SHEET RESISTANCE [Ω/□] | SHEET CONCENTRATION [cm$^{-2}$] | MOBILITY [cm$^2$/Vs] |
| 14 | 25 | $2 \times 10^{18}$ | 20 | 102,800 | $3.8 \times 10^{12}$ | 16 | 955 | $5.5 \times 10^{12}$ | 1,190 |
| 15 | 25 | $5 \times 10^{17}$ | 20 | UNMEASURABLE | UNMEASURABLE | UNMEASURABLE | 937 | $5.8 \times 10^{12}$ | 1,150 |
| 16 | 25 | 0 | 20 | UNMEASURABLE | UNMEASURABLE | UNMEASURABLE | 883 | $6.0 \times 10^{12}$ | 1,180 |

As shown in table 7, it was impossible to measure the hole concentration in the sample 15 and the sample 16 with the small Mg concentration due to very high resistance. The electron concentration was $(5.5$-$6.0)\times10^{12}$ cm$^{-2}$, which was a little high.

Prepared then were three kind of samples 17 to 19 in which the thickness of the undoped GaN layer 24 was 15 nm, the thickness of the p-type GaN layer 25 was 15 nm and the Mg concentration was $2\times10^{18}$ cm$^{-3}$, $5\times10^{17}$ cm$^{-3}$ and 0 cm$^{-3}$, respectively. The result of Hall measurement of the samples 17 to 19 is shown in table 8.

TABLE 8

| SAMPLE NUMBER | THICKNESS OF UNDOPED GaN LAYER 24 [nm] | Mg CONCENTRARION OF p-TYPE GaN LAYER 25 [cm$^{-3}$] | THICKNESS OF p-TYPE GaN LAYER 25 [nm] | HOLE ||| ELECTRON |||
|---|---|---|---|---|---|---|---|---|---|
| | | | | SHEET RESISTANCE [Ω/□] | SHEET CONCENTRATION [cm$^{-2}$] | MOBILITY [cm$^2$/Vs] | SHEET RESISTANCE [Ω/□] | SHEET CONCENTRATION [cm$^{-2}$] | MOBILITY [cm$^2$/Vs] |
| 17 | 15 | $2 \times 10^{18}$ | 15 | 165,000 | $2.1 \times 10^{12}$ | 18 | 921 | $5.9 \times 10^{12}$ | 1,150 |
| 18 | 15 | $5 \times 10^{17}$ | 15 | UNMEASURABLE | UNMEASURABLE | UNMEASURABLE | 960 | $6.2 \times 10^{12}$ | 1,050 |
| 19 | 15 | 0 | 15 | UNMEASURABLE | UNMEASURABLE | UNMEASURABLE | 836 | $6.8 \times 10^{12}$ | 1,100 |

As shown in table 8, it was impossible to measure the hole concentration in the sample 18 and the sample 19 with the small Mg concentration due to very high resistance. The electron concentration was $(5.9\text{-}6.8) \times 10^{12}$ cm$^{-2}$.

[Experiment 5]

Figure 17:
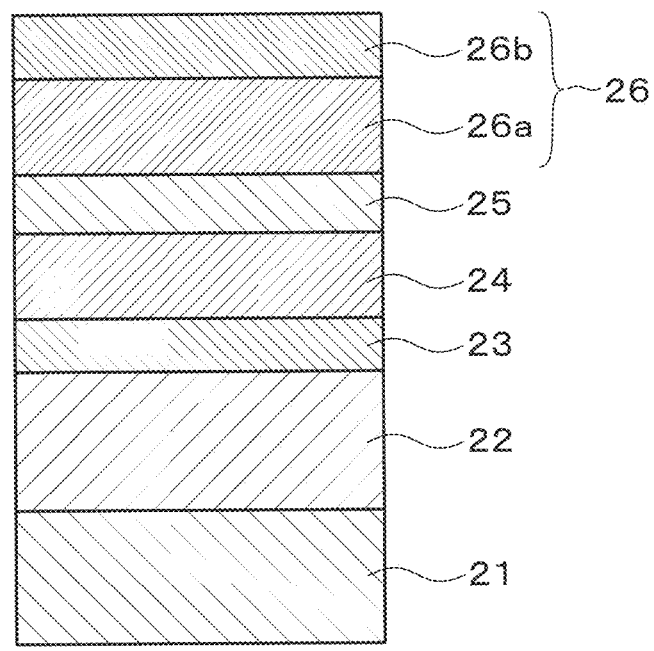
FIG. 17 A cross-sectional view showing a sample 20 which was used in an experiment 5 conducted to consider the GaN-based semiconductor device according to the first embodiment of the invention.
Figure 18:
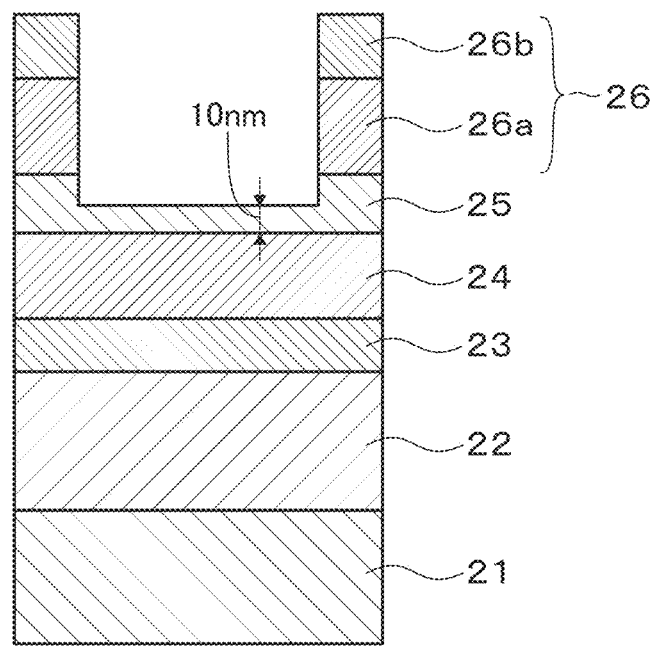
FIG. 18 A cross-sectional view showing a sample 21 which was used in the experiment 5 conducted to consider the GaN-based semiconductor device according to the first embodiment of the invention.
Figure 19:
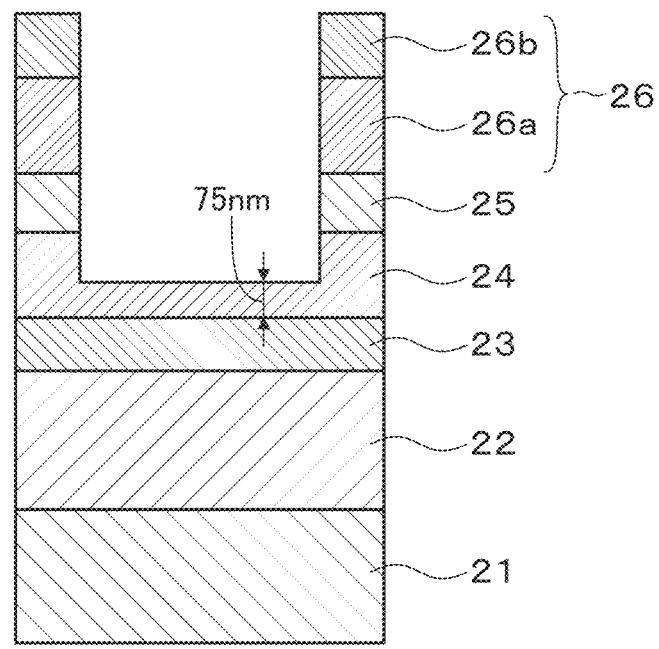
FIG. 19 A cross-sectional view showing a sample 22 which was used in the experiment 5 conducted to consider the GaN-based semiconductor device according to the first embodiment of the invention.
Figure 20:
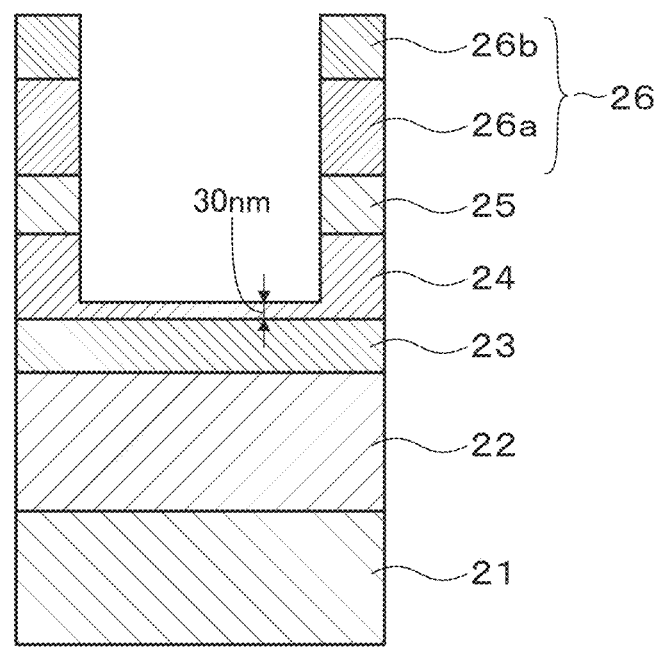
FIG. 20 A cross-sectional view showing a sample 23 which was used in the experiment 5 conducted to consider the GaN-based semiconductor device according to the first embodiment of the invention.

Next, in order to confirm effect of the thickness of the undoped GaN layer 24 on the 2DHG concentration, an additional experiment 5 was carried out. More specifically, in order to examine the lower limit of the thickness of the undoped GaN layer 24, a sample 20 in which the thickness of the undoped GaN layer 24 was increased to 80 nm was prepared. FIG. 17 shows the layer structure of the sample 20. More specifically, the GaN buffer layer (not shown) with a thickness of 30 nm was stacked on the C-plane sapphire substrate 21 by low temperature growth (530° C.), the growth temperature was raised to 1100° C., and then the undoped GaN layer 22 with a thickness of 800 nm, the undoped Al$_x$Ga$_{1-x}$N layer 23 with a thickness of 47 nm and x=0.23, the undoped GaN layer 24 with a thickness of 80 nm, the Mg-doped p-type GaN layer 25 with a Mg concentration of $5.0 \times 10^{18}$ cm$^{-3}$ and a thickness of 20 nm, the p$^+$-type GaN contact layer 26a with a Mg concentration of $7.0 \times 10^{19}$ cm$^{-3}$ and a thickness of 37 nm and the Mg-doped p$^+$-type GaN contact layer 26b with a Mg concentration of $2.0 \times 10^{20}$ cm$^{-3}$ and a thickness of 3 nm were grown to prepare the sample 20. As shown in FIG. 18, the central portion of the p$^+$-type GaN contact layer 26a and the p$^+$-type GaN contact layer 26b of the sample 20 were completely etched, and further the central portion of the p-type GaN contact layer 25 was etched to a thickness of 10 nm to prepare a sample 21. As shown in FIG. 19, the central portion of the p-type GaN layer 25, the p$^+$-type GaN contact layer 26a and the p$^+$-type GaN contact layer 26b of the sample 20 was completely etched, and further the central portion of the undoped GaN layer 24 was etched to a thickness of 75 nm to prepare a sample 22. As shown in FIG. 20, the central portion of the p-type GaN layer 25, the p$^+$-type GaN contact layer 26a and the p$^+$-type GaN contact layer 26b of the sample 20 was completely etched, and further the undoped GaN layer 24 was etched to a thickness of 30 nm to prepare a sample 23.

Hall measurement was carried out by using the samples 20 to 23. The result is shown in table 9.

TABLE 9

| SAMPLE NUMBER | Mg CONCENTRARION OF p-TYPE GaN LAYER 25 [cm$^{-3}$] | THICKNESS OF p-TYPE GaN LAYER 25 [nm] (THINNED BY ETCHING) | HOLE ||| ELECTRON |||
|---|---|---|---|---|---|---|---|---|
| | | | SHEET RESISTANCE [Ω/□] | SHEET CONCENTRATION [cm$^{-2}$] | MOBILITY [cm$^2$/Vs] | SHEET RESISTANCE [Ω/□] | SHEET CONCENTRATION [cm$^{-2}$] | MOBILITY [cm$^2$/Vs] |
| 20 | $5 \times 10^{18}$ | 20 | 445,000 | $9.01 \times 10^{12}$ | 15.6 | 1,070 | $5.1 \times 10^{12}$ | 1,150 |
| 21 | $5 \times 10^{18}$ | 10 | 852,000 | $5.82 \times 10^{12}$ | 12.6 | 1,140 | $5.2 \times 10^{12}$ | 1,050 |
| 22 | $5 \times 10^{18}$ | −5 nm CONSEQUENTLY ONLY UNDOPED GaN LAYER 24 (THICKNESS 75 nm) | 1,013,000 | $5.10 \times 10^{12}$ | 12.1 | 1,110 | $5.1 \times 10^{12}$ | 1,100 |
| 23 | $5 \times 10^{18}$ | −50 nm CONSEQUENTLY ONLY UNDOPED GaN LAYER 24 (THICKNESS 30 nm) | UNMEASURABLE | UNMEASURABLE | UNMEASURABLE | 970 | $5.6 \times 10^{12}$ | 1,150 |

As shown in table 9, the hole concentration of the sample 20 without etching was $9.01 \times 10^{12}$ cm$^{-2}$, whereas the hole concentration of the sample 21 and the sample 22 was $5.82 \times 10^{12}$ cm$^{-2}$ and $5.1 \times 10^{12}$ cm$^{-2}$, respectively. With respect to the sample 23, no current flows due to high resistance and the presence of holes could not be confirmed.

The structure, the 2DHG concentration, etc. of the above samples 7 to 23 are summarized in table 10. In table 10, sample numbers are shown in the first column, the thickness of the undoped GaN layer 24, the thickness of the p-type GaN layer 25 and the Mg concentration (in unit of $1 \times 10^{18}$ cm$^{-3}$) of the p-type GaN layer 25 are shown in the second to the fourth columns. In addition, the 2DHG concentration measured is shown in the sixth column. Numerals in the fifth column correspond to numerals based on new concept, that is, "Reduced thickness", which is a new index introduced to summarize experiment values.

TABLE 10

| SAMPLE NUMBER | THICKNESS OF UNDOPED GaN LAYER 24 [nm] | THICKNESS OF p-TYPE GaN LAYER 25 [nm] | Mg CONCENTRARION OF p-TYPE GaN LAYER 25 [$1 \times 10^{18}$ cm$^{-3}$] | REDUCED THICKNESS tR [nm] | 2DHG CONCENTRATION [$1 \times 10^{12}$ cm$^{-2}$] |
|---|---|---|---|---|---|
| 7  | 25 | 20 | 15  | 345 | 9.85 |
| 8  | 25 | 40 | 5   | 265 | 10 |
| 9  | 25 | 40 | 2   | 145 | 8.0 |
| 10 | 25 | 40 | 0.5 | 85  | 4.0 |
| 11 | 25 | 40 | 0.1 | 69  | 2.2 |
| 12 | 25 | 40 | 0   | 65  | 1.2 |
| 13 | 25 | 20 | 0.5 | 55  | — |
| 14 | 25 | 20 | 2   | 85  | 3.8 |
| 15 | 25 | 20 | 0.5 | 55  | — |
| 16 | 25 | 20 | 0   | 45  | — |
| 17 | 15 | 15 | 2   | 60  | 2.1 |
| 18 | 15 | 15 | 0.5 | 38  | — |
| 19 | 15 | 15 | 0   | 30  | — |
| 20 | 80 | 20 | 5   | 200 | 9 |
| 21 | 80 | 10 | 5   | 140 | 5.8 |
| 22 | 75 | 0  | (0) | 75  | 5.1 |
| 23 | 30 | 0  | (0) | 30  | — |

The reduced thickness will be explained. The reduced thickness is denoted by tR. The reduced thickness tR is a quantity represented by the following equation. When the thickness of the undoped GaN layer 24 is denoted as u [nm], the thickness of the p-type GaN layer 25 is denoted as v [nm] and the Mg concentration is denoted as w [cm$^{-3}$], the reduced thickness tR is defined as follows.

$$tR = u + v(1 + w \times 10^{-18}) \quad (1)$$

The meaning of terms on the right side of the equation will now be explained. The band of the p-type GaN layer 25 is higher than that of the undoped GaN layer 24, using Fermi level as the standard. That is, the effect of raising the band in the surface side AlGaN/GaN hetero-junction interface and generating 2DHG of the p-type GaN layer 25 is larger than that of the undoped GaN layer 24. Therefore, the effect of Mg dopant in the p-type GaN layer 25 is now considered. Activation ratio of Mg dopant at room temperature is usually about 1%. Since deep levels and n-type impurities of $10^{16}$ cm$^{-3}$ to $10^{17}$ cm$^{-3}$ exist in the GaN layer, the role of Mg as acceptors is hindered. Therefore, the Mg concentration of $10^{17}$ cm$^{-3}$ does not very contribute to p-type conductivity. The GaN layer with a Mg concentration smaller than $10^{17}$ cm$^{-3}$ is rather an undoped layer. Therefore, in order to evaluate a contribution of the p-type GaN layer 25 to the 2DHG concentration of the present structure, it is necessary to take effect of the Mg concentration into consideration. The effect is represented by using $10^{18}$ cm$^{-3}$ as a value for normalization, which is derived from the above consideration as the first order approximation. Therefore, it is expected that the 2DHG concentration presents a linear relation and a subsequent saturation curve for the reduced thickness tR denoted by the equation (1). The fifth column of table 10 shows the reduced thickness tR calculated by the equation (1).

Figure 21:
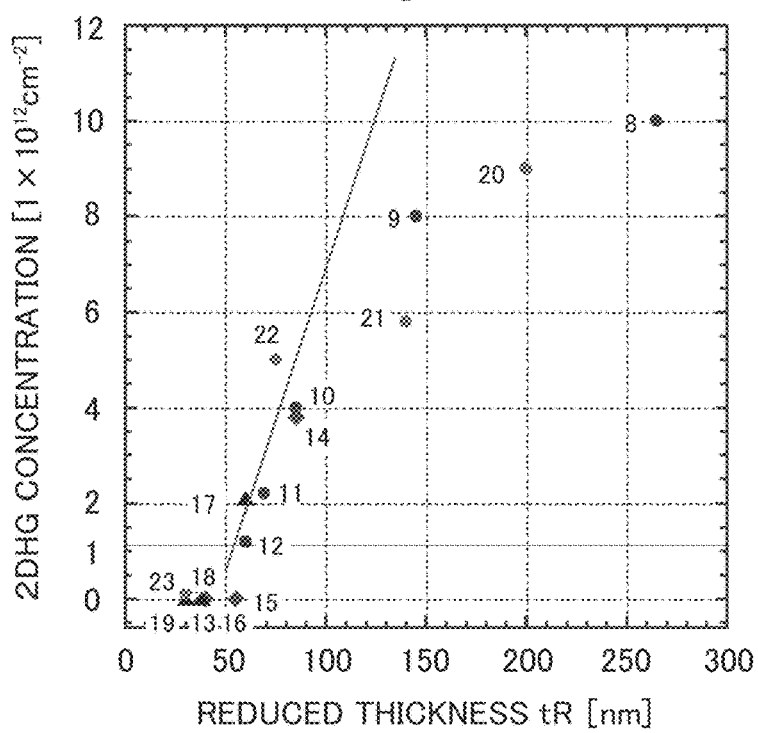
FIG. 21 A schematic view showing the relation between the reduced thickness tR of the samples 8 to 23 and the 2DHG concentration measured.
Figure 22:
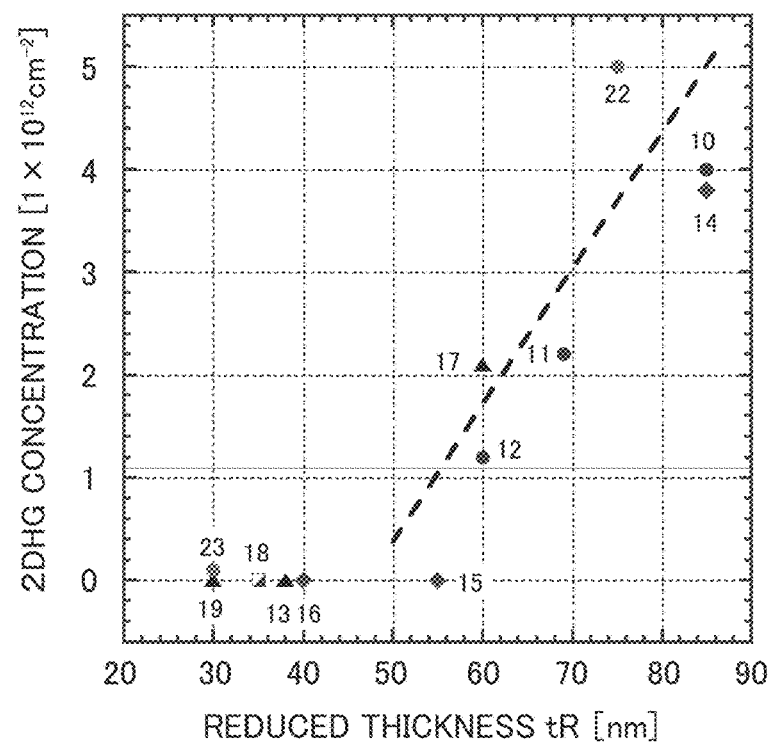
FIG. 22 A schematic view showing the enlarged part of FIG. 21.

Illustrated in FIG. 21 are the reduced thickness tR in the fifth column of table 10 in the x-axis and the 2DHG concentration in the sixth column of table 10 in the y-axis. FIG. 22 shows an enlarged view of an area with the reduced thickness tR of 20 to 90 nm in FIG. 21. Numerals in FIG. 21 and FIG. 22 show sample numbers. It was known from FIG. 21 that the 2DHG concentration is nearly proportional to the reduced thickness tR and as the reduced thickness tR is increased, the 2DHG concentration tends to saturate near $1 \times 10^{13}$ cm$^{-2}$. In an area with the small Mg concentration (FIG. 22), although data distribute a little widely due to large measurement error of Hall measurement, it could be confirmed that the 2DHG concentration is nearly proportional to the reduced thickness tR. For the reduced thickness tR of 50 nm or less it was impossible to measure the hole concentration. The reason why error of Hall measurement is large is that Hall voltage measured is small because the hole mobility is ~1/100 of the electron mobility and very small, and the contact resistance of an ohmic electrode with the p-type GaN contact layer 25 is originally high (experimentally, $10^5$ times of the contact resistance of an ohmic electrode with an n-type GaN layer), etc.

In the control sample A-3 with an ordinary HEMT structure the 2DEG concentration was about $1.1 \times 10^{13}$ cm$^{-2}$ (see table 5). The 2DEG concentration of the polarization super junction structure was about $(5.1-6.8) \times 10^{12}$ cm$^{-2}$ in the sample 8 to the sample 23. Its reason is as follows. That is, by the band lifting up effect by the relatively thick undoped GaN layer 24 and the p-type GaN layer 25 on the undoped $Al_xGa_{1-x}N$ layer 23, the 2DEG concentration of the AlGaN/GaN hetero-junction on the lower side formed by the undoped $Al_xGa_{1-x}N$ layer 23 and the undoped GaN layer 22 is reduced. It can be also understood that the 2DEG concentration increases a little as the reduced thickness tR is small, that is, lifting up of the band is small. It is interesting that for any combination of the upper undoped GaN layer 24 and the p-type GaN layer 25 almost constant 2DEG concentration $(5.1-6.8) \times 10^{12}$ cm$^{-2}$ was obtained.

That is, the 2DEG concentration of the polarization super junction structure is about ½ of the 2DEG concentration of the reference HEMT. This means that the 2DEG concentration of the reference HEMT can define the lower limit of the effective 2DHG concentration (the limit 2DHG concentration) of the polarization super junction structure with the corresponding undoped $Al_xGa_{1-x}N$ layer 23. That is, 2DEG concentration of the reference HEMT structure can be used as a reference.

As described above, in order to obtain sufficient polarization super junction effect, the effective 2DHG concentration is necessary to be more than 1/10 to 1/5 of the 2DEG concentration. Here, the effective 2DHG concentration is conditioned to be more than 1/5 of the 2DEG concentration. Using the 2DEG concentration ($1.1 \times 10^{13}$ cm$^{-2}$) of the reference HEMT as a reference, the effective lower limit 2DHG concentration of the polarization super junction is 1/10 of the 2DEG concentration=$1.1 \times 10^{12}$ cm$^{-2}$. It is shown in FIG. 22 as a horizontal line. Referring to FIG. 22, the reduced thickness for the 2DHG concentration of $1.1 \times 10^{12}$ cm$^{-2}$ is tR=55 nm. That is, when the thickness of the undoped GaN layer 24 is denoted as u [nm], the thickness of the p-type GaN layer 25 is denoted as v [nm] and the Mg concentration of the p-type GaN layer 25 is denoted as w [cm$^{-3}$], the effective structure as the polarization super junction corresponds to tR in the equation (1) satisfying:

$$tR \geq 55 \text{ [nm]} \quad (2)$$

The above effective range of the reduced thickness tR was obtained for the Al composition x of 0.23 and the thickness of 47 nm of the undoped Al$_x$Ga$_{1-x}$N layer 23. The reduced thickness tR for the undoped Al$_x$Ga$_{1-x}$N layer 23 with an Al composition x and a thickness different from the above will be described.

Figure 1A:
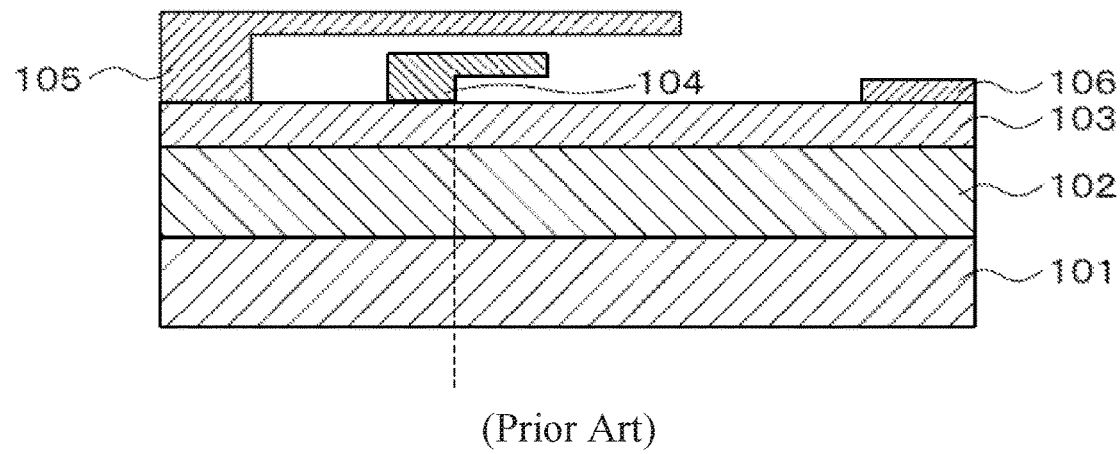
FIG. 1A A cross-sectional view showing an AlGaN/GaN HFET using a conventional field plate technology.
Figure 1B:
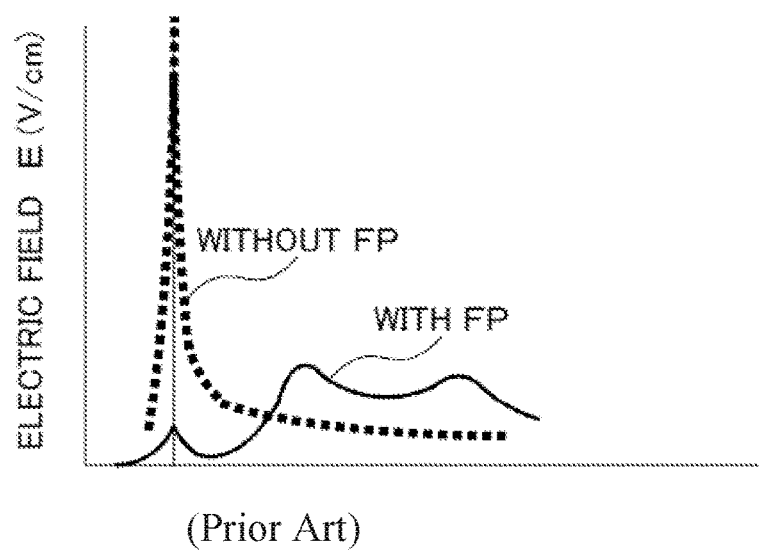
FIG. 1B A schematic view showing the electric field distribution in the AlGaN/GaN HFET shown in FIG. 1A.
Figure 2A:
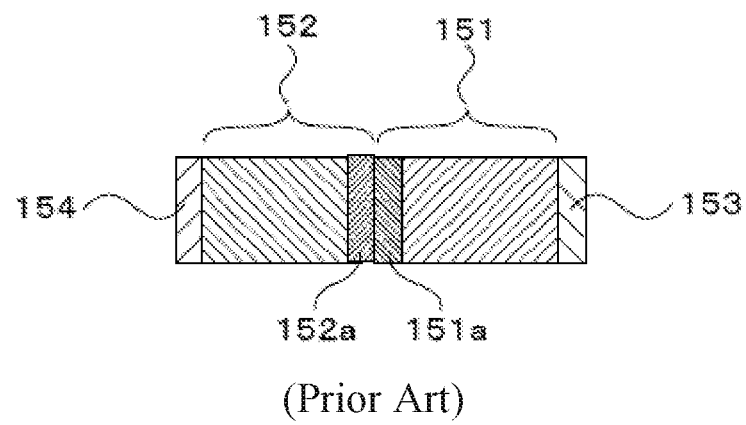
FIG. 2A A cross-sectional view showing a conventional pn junction applied a small reverse bias voltage.
Figure 2B:
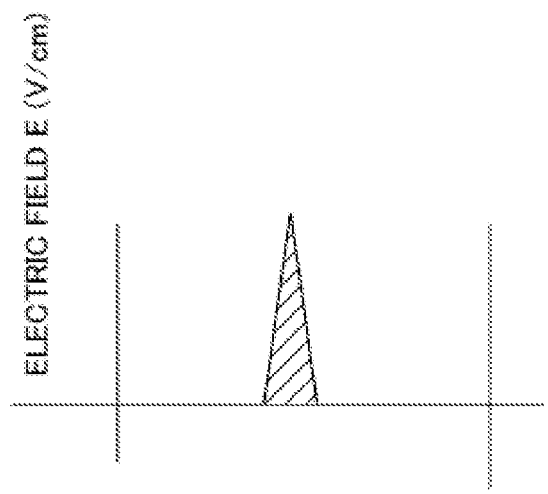
FIG. 2B A schematic view showing the electric field distribution in the pn junction shown in FIG. 2A.
Figure 3A:
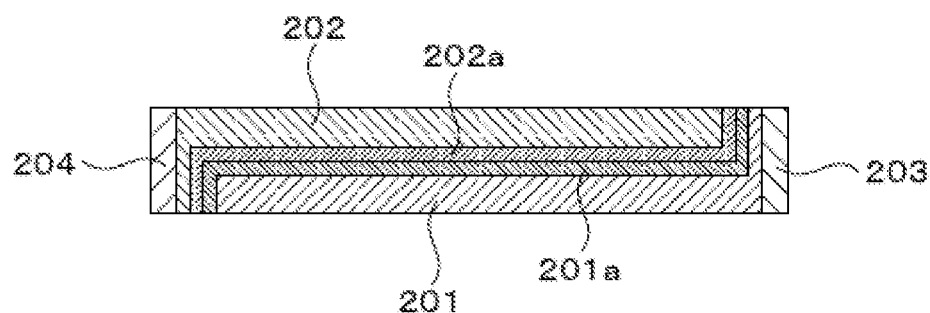
FIG. 3A A cross-sectional view showing a super junction applied a small reverse bias voltage.
Figure 3B:
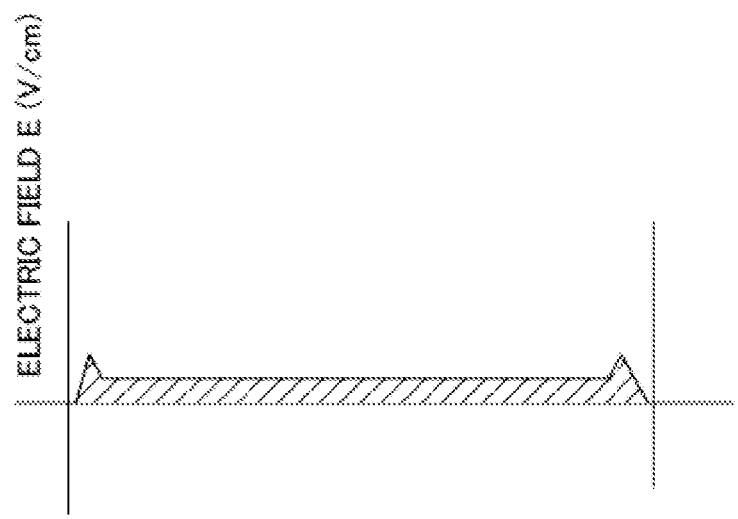
FIG. 3B A schematic view showing the electric field distribution in the super junction shown in FIG. 3A.
Figure 4A:
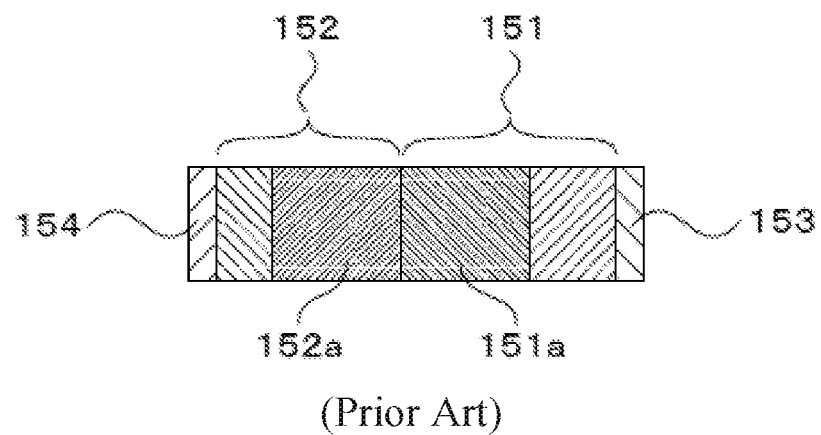
FIG. 4A A cross-sectional view showing the conventional pn junction applied a large reverse bias voltage.
Figure 4B:
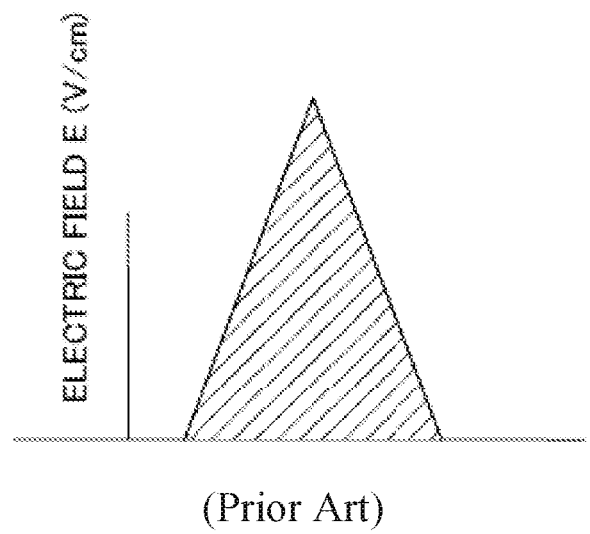
FIG. 4B A schematic view showing the electric field distribution in the pn junction shown in FIG. 4A.
Figure 5A:
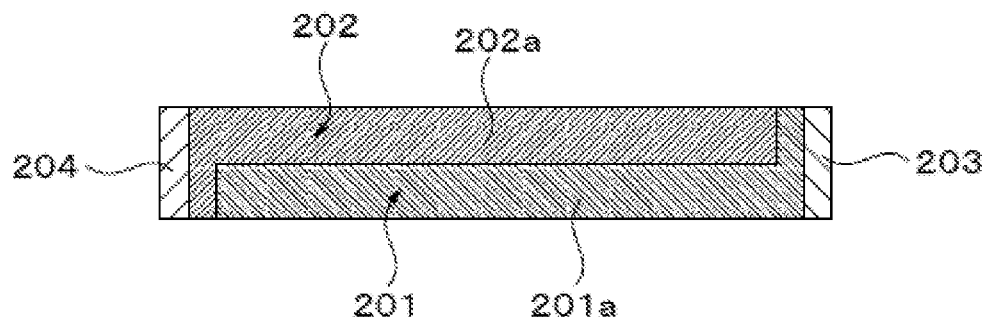
FIG. 5A A cross-sectional view showing the super junction applied a large reverse bias voltage.
Figure 5B:
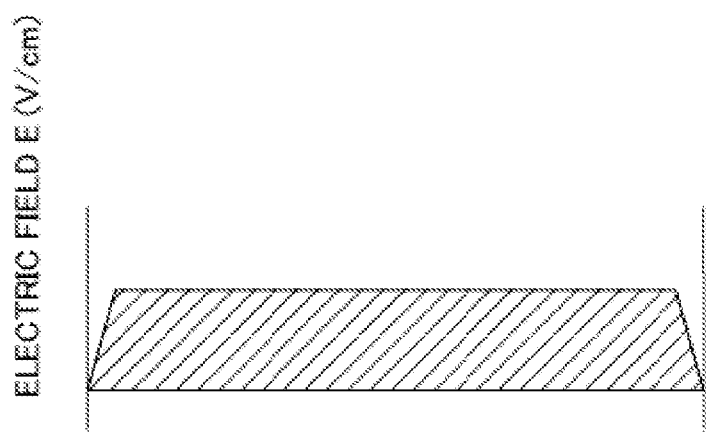
FIG. 5B A schematic view showing the electric field distribution in the super junction shown in FIG. 5A.
Figure 23:
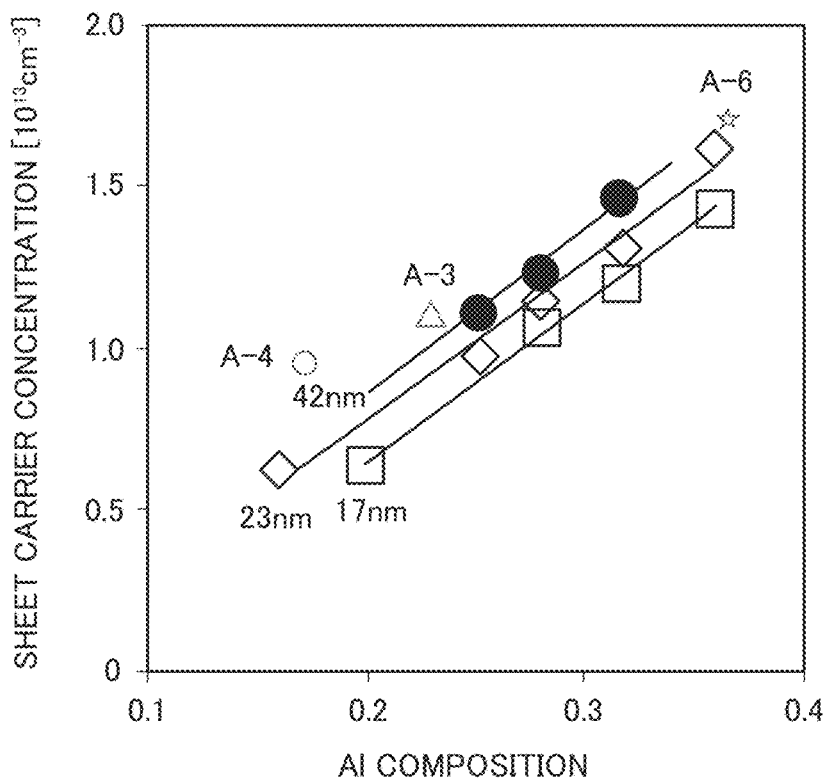
FIG. 23 A schematic view in which data of control samples A-3, A-4 and A-6 were written in FIG. 1 of p. 272 of the reference.

First, in order to obtain the reference 2DEG concentration, reference HEMTs with the undoped Al$_x$Ga$_{1-x}$N layer 23 with an Al composition x and a thickness varied. Table 11 summarizes its data.

the thickness of the undoped Al$_x$Ga$_{1-x}$N layer 23 was small as 25 nm. The 2DEG concentration was $0.89 \times 10^{13}$ cm$^{-2}$ for the sample A-4 and $1.7 \times 10^{13}$ cm$^{-2}$ for the sample A-6, respectively. FIG. 23 shows FIG. 1 in p. 272 of a publicly known literature (F. Calle et al. Journal of Materials Science: Materials in Electronics 14 (2003) 271-277), which describes the relation between the Al composition x of an Al$_x$Ga$_{1-x}$N layer and the sheet carrier concentration (the 2DEG concentration). Data (Δ, ○, ☆) of the samples A-3, A-4 and A-6 are shown in FIG. 23. In the literature, the Al composition x of the Al$_x$Ga$_{1-x}$N layer was changed from 0.16 to 0.36 and its thickness was changed from 17 nm to 42 nm. It is seen that the 2DEG concentration increases proportionally to the Al composition, whereas it does not increase remarkably for the thickness although it tends to increase because strain increases as the thickness increases. The 2DEG concentration of the samples A-3, A-4 and A-6 are relatively larger than the value of the literature. Its reason is considered as follows. That is, since the crystal quality of the samples A-3, A-4 and A-6 is high, the degree of lattice relaxation is smaller than that of the sample of the literature and lattice strain of the hetero-junction is large, so that polarization effect appears strongly.

Next, stacked on the undoped Al$_x$Ga$_{1-x}$N layer 23 of the sample A-4 were the undoped GaN layer 24 with a thickness of 80 nm, the p-type GaN layer 25 with a thickness of 40 nm and a Mg concentration of $1 \times 10^{18}$ cm$^{-3}$, the p$^+$-type GaN layer 26a with a thickness of 44 nm and a Mg concentration of $5 \times 10^{19}$ cm$^{-3}$ and the p$^+$-type GaN layer 26b with a

TABLE 11

| SAMPLE NUMBER | Al COMPOSITION x OF UNDOPED Al$_x$Ga$_{1-x}$N LAYER | THICKNESS OF UNDOPED Al$_x$Ga$_{1-x}$N LAYER [nm] | 2DEG CONCENTRATION [cm$^{-2}$] | MOBILITY [cm$^2$/Vs] |
| --- | --- | --- | --- | --- |
| A-3 | 0.23 | 47 | $1.10 \times 10^{13}$ | 925 |
| A-4 | 0.17 | 47 | $0.89 \times 10^{13}$ | 1230 |
| A-5 | 0.37 | 47 | UNMEASURABLE DUE TO GENERATION OF CRACK | |
| A-6 | 0.37 | 25 | $1.70 \times 10^{13}$ | 1085 |

The sample A-3 is the sample described above. The sample A-4 has the Al composition x of 0.17 and the thickness of 47 nm. The sample A-5 has the Al composition x of 0.37 and the thickness of 47 nm. The sample A-6 has the Al composition x of 0.37 and the thickness of 25 nm. With respect to the sample A-5, cracks were produced in its crystal and the film was torn, so that it was impossible to measure. Originally, in the sample A-5, the thickness of the undoped Al$_x$Ga$_{1-x}$N layer 23 exceeded far the theoretical critical thickness. The sample A-5 was intentionally prepared to fix the thickness of the undoped Al$_x$Ga$_{1-x}$N layer 23 to 47 nm. Therefore, alternatively, the sample A-6 was prepared so that thickness of 3 nm and a Mg concentration of $2 \times 10^{20}$ cm$^{-3}$ to prepare a sample 24. The p-type GaN layer 25 of the sample 24 was etched to a thickness of 20 nm to prepare a sample 25. After the p-type GaN layer 25 of the sample 24 was completely etched off, the undoped GaN layer 24 was etched to a depth of 5 nm and its thickness was made 75 nm to prepare a sample 26. In addition, after the p-type GaN layer 25 of the sample 24 was completely etched off, the undoped GaN layer 24 was etched to a depth of 30 nm and its thickness was made 50 nm to prepare a sample 27. The result of Hall measurement of the samples 24 to 27 is shown in table 12.

TABLE 12

| SAMPLE NUMBER | Mg CONCENTRARION OF p-TYPE GaN LAYER 25 [cm$^{-3}$] | THICKNESS OF p-TYPE GaN LAYER 25 [nm] (THINNED BY ETCHING) | HOLE SHEET RESIST-ANCE [Ω/□] | HOLE SHEET CONCEN-TRATION [cm$^{-2}$] | HOLE MOBILITY [cm$^2$/Vs] | ELECTRON SHEET RESIST-ANCE [Ω/□] | ELECTRON SHEET CONCEN-TRATION [cm$^{-2}$] | ELECTRON MOBILITY [cm$^2$/Vs] |
|---|---|---|---|---|---|---|---|---|
| 24 | $1 \times 10^{18}$ | 40 | 720,000 | $6.2 \times 10^{12}$ | 14.0 | 1,316 | $3.8 \times 10^{12}$ | 1,250 |
| 25 | $1 \times 10^{18}$ | 20 | 1,322,000 | $4.0 \times 10^{12}$ | 13.5 | 1,280 | $3.9 \times 10^{12}$ | 1,250 |
| 26 | $1 \times 10^{18}$ | −5 nm CONSEQUENTLY ONLY UNDOPED GaN LAYER 24 (THICKNESS 75 nm) | 4,460,000 | $1.0 \times 10^{12}$ | 14.0 | 1,360 | $4.0 \times 10^{12}$ | 1,150 |
| 27 | $1 \times 10^{18}$ | −50 nm CONSEQUENTLY ONLY UNDOPED GaN LAYER 24 (THICKNESS 30 nm) | UNMEAS-URABLE | UNMEAS-URABLE | UNMEAS-URABLE | 1,326 | $4.1 \times 10^{12}$ | 1,150 |

It was not possible to measure the hole concentration of the sample 27. The 2DEG concentration increases as the thickness of the undoped GaN layer 24 becomes small and was (3.8–4.1)×10$^{12}$ cm$^{-2}$. The 2DEG concentration was 42% to 46% of the 2DEG concentration of the sample A-4, 8.9×10$^{12}$ cm$^{-2}$.

Then a sample 28 with the polarization super junction structure was prepared by stacking on the sample A-6 the undoped GaN layer 24, the p-type GaN layer 25, the p$^+$-type GaN layer 26a and the p$^+$-type GaN layer 26b that are similar to the sample 24. Similarly, prepared were a sample 29 in which the thickness of the p-type GaN layer 25 was made 20 nm by etching, a sample 30 in which the thickness of the undoped GaN layer 24 was made 75 nm by etching and a sample 31 in which the thickness of the undoped GaN layer 24 was made 46 nm by etching. The result of Hall measurement of the samples 28 to 31 is shown in table 13.

TABLE 13

| SAMPLE NUMBER | Mg CONCENTRARION OF p-TYPE GaN LAYER 25 [cm$^{-3}$] | THICKNESS OF p-TYPE GaN LAYER 25 [nm] (THINNED BY ETCHING) | HOLE SHEET RESISTANCE [Ω/□] | HOLE SHEET CONCEN-TRATION [cm$^{-2}$] | HOLE MOBILITY [cm$^2$/Vs] | ELECTRON SHEET RESIST-ANCE [Ω/□] | ELECTRON SHEET CONCEN-TRATION [cm$^{-2}$] | ELECTRON MOBIL-ITY [cm$^2$/Vs] |
|---|---|---|---|---|---|---|---|---|
| 28 | $1 \times 10^{18}$ | 40 | 387,000 | $11.0 \times 10^{12}$ | 17.0 | 697 | $7.6 \times 10^{12}$ | 1,180 |
| 29 | $1 \times 10^{18}$ | 20 | 408,000 | $9.0 \times 10^{12}$ | 18.0 | 655 | $7.4 \times 10^{12}$ | 1,290 |
| 30 | $1 \times 10^{18}$ | −5 nm CONSEQUENTLY ONLY UNDOPED GaN LAYER 24 (THICKNESS 75 nm) | 1,008,000 | $4.0 \times 10^{12}$ | 15.5 | 697 | $7.8 \times 10^{12}$ | 1,150 |
| 31 | $1 \times 10^{18}$ | −50 nm CONSEQUENTLY ONLY UNDOPED GaN LAYER 24 (THICKNESS 46 nm) | 2,600,000 | $1.4 \times 10^{12}$ | 15.0 | 646 | $8.2 \times 10^{12}$ | 1,180 |

Since the Al composition x of the undoped Al$_x$Ga$_{1-x}$N layer 23 of the samples 28 to 31 was 0.35 and high, it was possible to measure the 2DHG concentration of all of the samples 28 to 31. The 2DEG concentration was (7.4–8.2)×10$^{12}$ cm$^{-2}$. The 2DEG concentration was 44% to 48% of the 2DEG concentration (1.7×10$^{13}$ cm$^{-2}$) of the sample A-6 with the reference HEMT structure.

The reduced thickness tR was calculated for the samples 24 to 31. The result is shown in table 14.

TABLE 14

| SAMPLE NUMBER | Al COMPOSITION x OF UNDOPED AlxGa1−xN LAYER 23 | THICKNESS OF UNDOPED AlxGa1−xN LAYER 23 [nm] | THICKNESS OF UNDOPED GaN LAYER 24 [nm] | THICKNESS OF p-TYPE GaN LAYER 25 [nm] | Mg CONCENTRATION OF p-TYPE GaN LAYER 25 [1 × 10$^{18}$ cm$^{-3}$] | REDUCED THICKNESS tR [nm] | 2DHG CONCENTRATION [1 × 10$^{12}$ cm$^{-2}$] |
|---|---|---|---|---|---|---|---|
| 24 | 0.17 | 47 | 80 | 40 | 1 | 160 | 6.2 |
| 25 | 0.17 | 47 | 80 | 20 | 1 | 120 | 4.0 |
| 26 | 0.17 | 47 | 75 | 0 | 1 | 75 | — |
| 27 | 0.17 | 47 | 50 | 0 | 1 | 50 | — |
| 28 | 0.35 | 25 | 80 | 40 | 1 | 160 | 11.0 |
| 29 | 0.35 | 25 | 80 | 20 | 1 | 120 | 9.0 |
| 30 | 0.35 | 25 | 75 | 0 | 1 | 75 | 4.0 |
| 31 | 0.35 | 25 | 46 | 0 | 1 | 45 | 1.4 |

Figure 24:
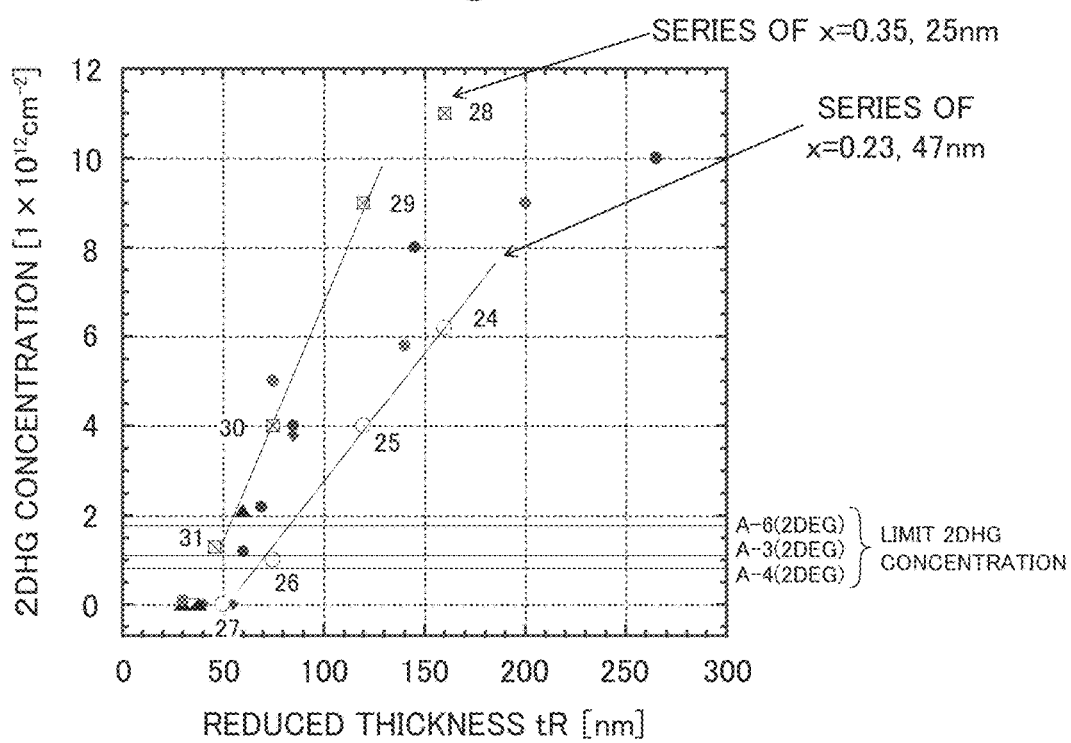
FIG. 24 A schematic view showing the relation between the reduced thickness tR of samples 24 to 31 and the 2DHG concentration measured.
Figure 25:
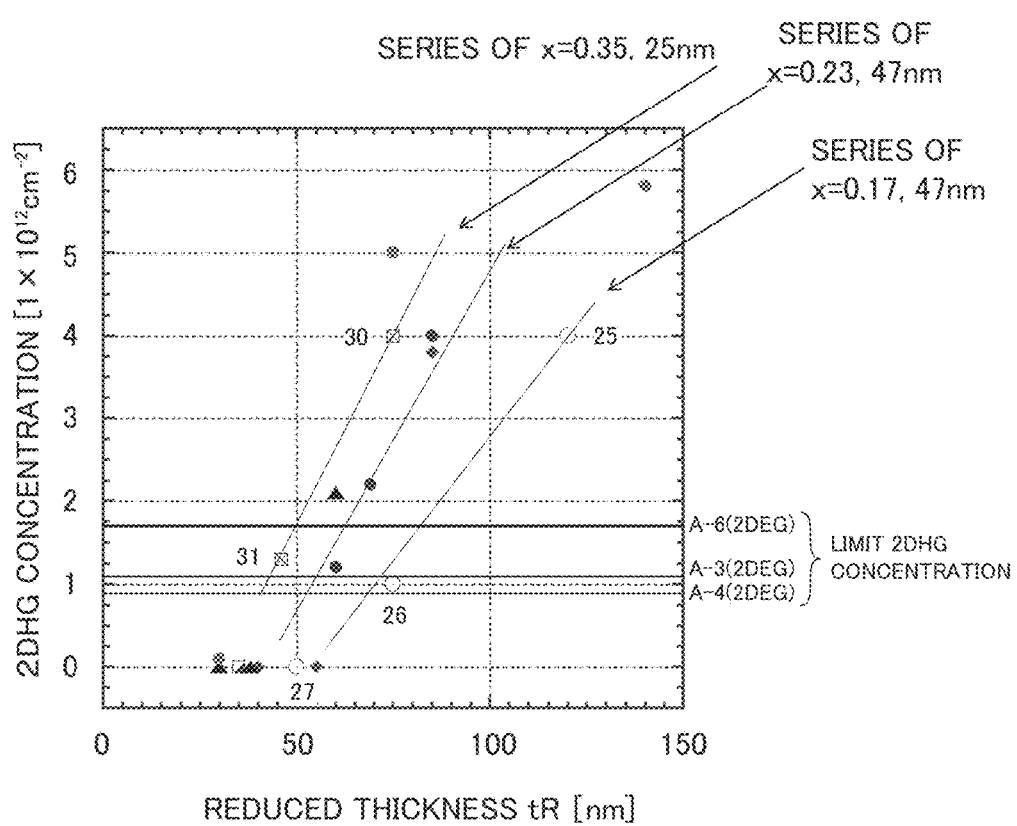
FIG. 25 A schematic view showing the enlarged part of FIG. 24.

FIG. 24 illustrates a graph in which the reduced thickness tR is in the transverse axis and the 2DHG concentration is in the vertical axis. Numerals in FIG. 24 are sample numbers. Data of the samples 8 to 23 were also shown in FIG. 24. Here, representation of sample numbers were omitted. In FIG. 24, it was found that when the 2DHG concentration is less than 1×10$^{13}$ cm$^{-2}$, the relationship between the reduced thickness tR and the 2DHG concentration is almost a linear relationship. In order to estimate the limit reduced thickness tR that the device can operate, an enlargement view of a part of 0-150 nm of the reduced thickness tR in FIG. 24 is shown in FIG. 25. A tenth value of the 2DEG concentration of the samples A-3, A-4 and A-6 that are the reference samples, that is, the limit 2DHG concentration is shown in FIG. 25 as a transverse line. That is, the limit 2DHG concentration is 1.1×10$^{12}$ cm$^{-2}$ for the sample A-3, 0.89×10$^{12}$ cm$^{-2}$ for the sample A-4 and 1.7×10$^{12}$ cm$^{-2}$ for the sample A-6. The limit 2DHG concentration is the minimum 2DHG concentration that is necessary for the device to operate as a polarization super junction device. As previously described, it is important that the 2DHG concentration effective for a polarization super junction device balances with the 2DEG concentration. The 2DHG concentration is ⅕ to 1/10 of the concentration of the coexisting 2DEG as described above. Here, ⅕, the highest (most rigorous) value, of the 2DEG concentration was adopted.

In FIG. 25, the reduced thickness tR at which the 2DHG concentration reaches the limit 2DHG concentration is 70 nm for the samples 24 to 27 with the undoped Al$_x$Ga$_{1-x}$N layer 23 with an Al composition of 0.17 and a thickness of 47 nm, 55 nm for the samples 8 to 23 with the undoped Al$_x$Ga$_{1-x}$N layer 23 with an Al composition of 0.23 and a thickness of 47 nm, and 50 nm for the samples 28 to 31 with the undoped Al$_x$Ga$_{1-x}$N layer 23 with an Al composition of 0.35 and a thickness of 25 nm. With respect to data of the device with the undoped Al$_x$Ga$_{1-x}$N layer 23 with the Al composition x of 0.23, the limit thickness was 55 nm from FIG. 22. Although the thickness of the undoped Al$_x$Ga$_{1-x}$N layer with the Al composition x of 0.35 of the sample is 25 nm, as shown in FIG. 23, the thickness dependency of the 2DEG concentration is at most about 30% in the thickness range (17 nm to 42 nm). Especially in the thickness range (25 nm to 47 nm) in the present experiment, the limit thickness of the three sample groups can be understand as differences of the Al composition.

Figure 26:
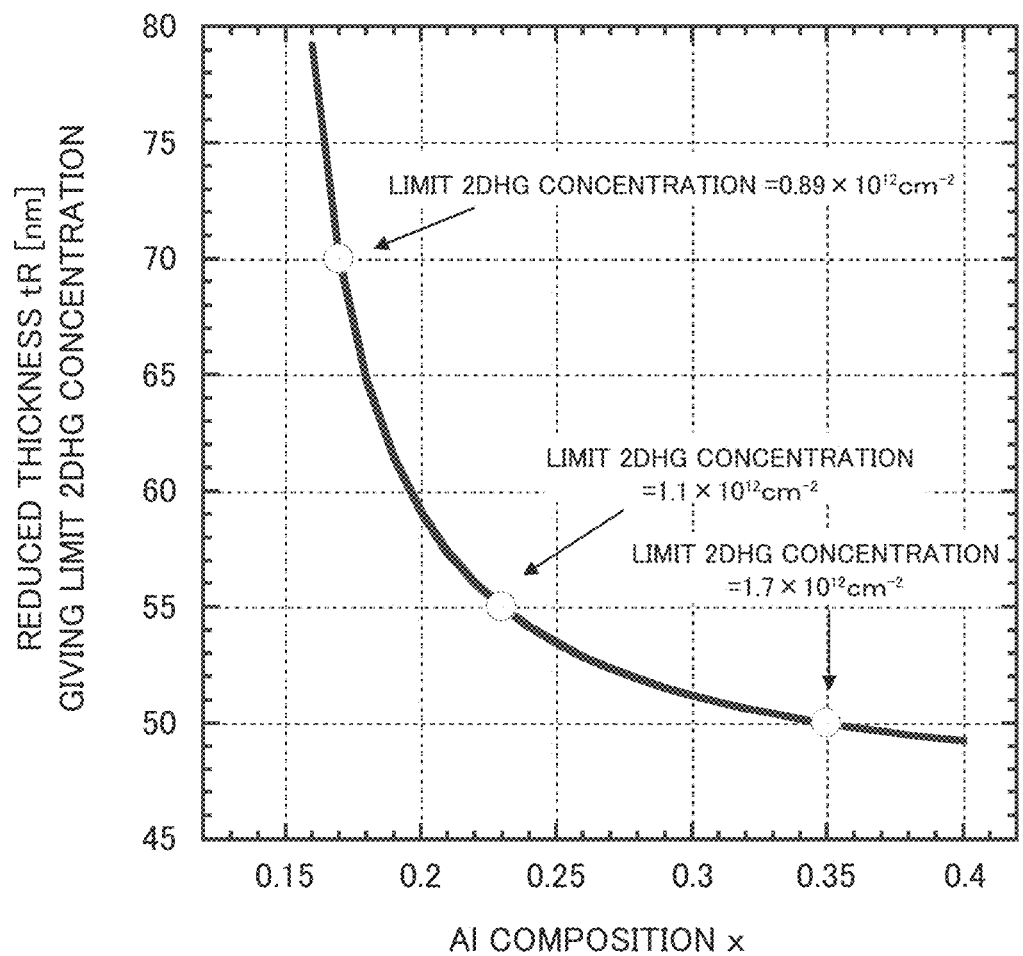
FIG. 26 A schematic view showing the relation between the Al composition x of the undoped $Al_xGa_{1-x}N$ layer and the limit 2DHG concentration.

FIG. 26 shows the reduced thickness tR for the limit 2DHG concentration plotted against the Al composition x of the undoped Al$_x$Ga$_{1-x}$N layer 23. Three data in FIG. 26 are the limit reduced thicknesses for respective Al compositions x. A curve passing the three points is shown in FIG. 26. When the Al composition is denoted as x and the limit thickness is denoted as y [nm], the curve is given by the following equation (3).

$$y = a/(x-b) + c \quad (3)$$

where, a=0.864
b=0.134
c=46.0

The equation (3) is an empirical equation adopted to give the limit thickness to structures with different Al compositions x of the undoped Al$_x$Ga$_{1-x}$N layer 23.

When the Al composition x and the thickness of the undoped Al$_x$Ga$_{1-x}$N layer 23 of the polarization super junction structure are 0.17 to 0.35 and about 25 nm to 47 nm, the reduced thickness tR is necessary to be larger than the limit thickness shown by the equation (3). That is, when the Al composition is 0.17 to 0.35 and the thickness is 25 nm to 47 nm, the reduced thickness tR $$tR \geq 0.864/(x-0.134) + 46.0 \text{ [nm]} \quad (4)$$

is applied.

In the design realizing the high performance polarization super junction device, it is necessary to realize a low contact resistance of the p-electrode in the polarization super junction region with a low or zero (0) Mg amount. For this, the polarization super junction region and the p-electrode contact region are structurally separated, a p$^+$-type GaN contact layer with an acceptor concentration (Mg concentration) higher than that of the p-type GaN layer 25 is provided on the p-electrode contact region and a p-electrode is made to come into contact with the p$^+$-type GaN contact layer.

Figure 27:
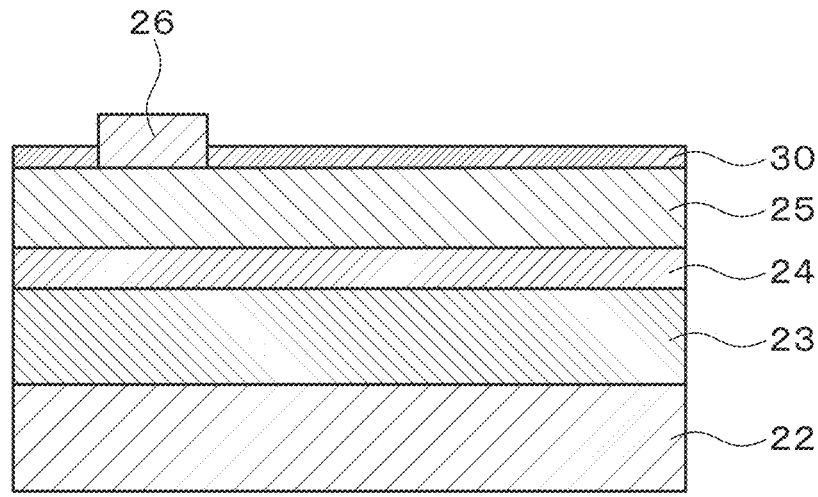
FIG. 27 A cross-sectional view for explaining a method for forming the polarization super junction region and the p-electrode contact region in the GaN-based semiconductor device according to the first embodiment of the invention.
Figure 28A:
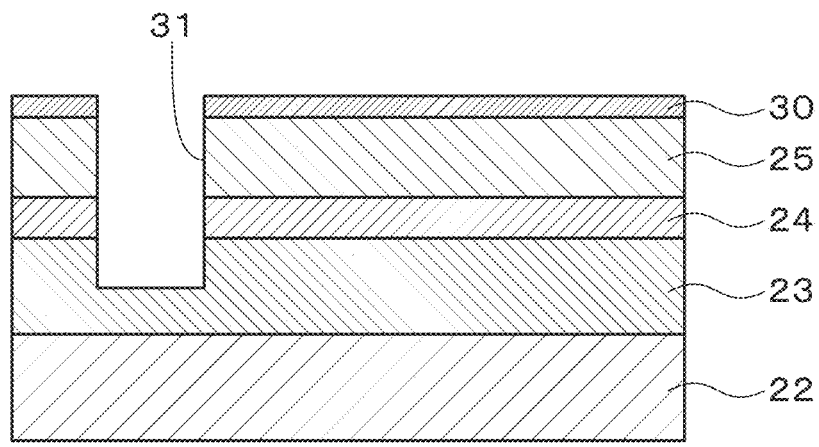
FIG. 28A A cross-sectional view for explaining another method for forming the polarization super junction region and the p-electrode contact region in the GaN-based semiconductor device according to the first embodiment of the invention.
Figure 28B:
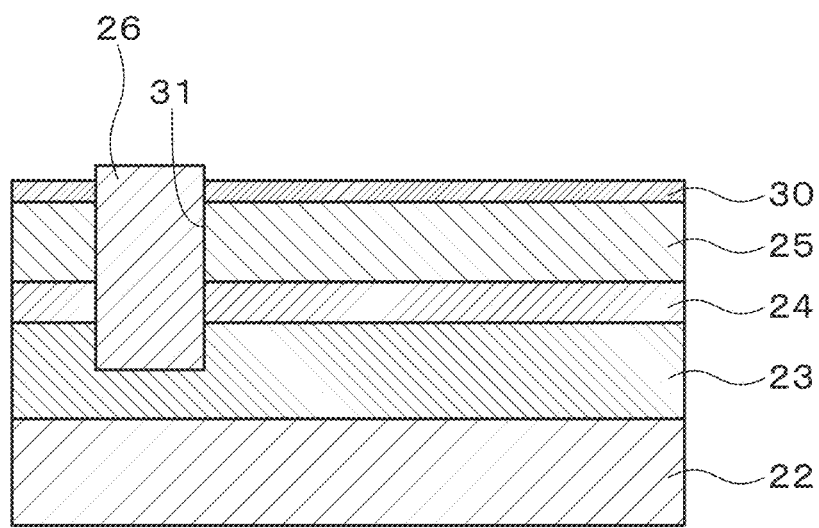
FIG. 28B A cross-sectional view for explaining another method for forming the polarization super junction region and the p-electrode contact region in the GaN-based semiconductor device according to the first embodiment of the invention.

In the Hall measurement samples shown in FIG. 14A and FIG. 14B or FIG. 16, the polarization super junction region and the p-electrode contact region are formed by etching the central part of the uppermost p$^+$-type GaN contact layer 26. However, for example, the polarization super junction region and the p-electrode contact region may be formed by using methods shown in FIG. 27 or FIG. 28A and FIG. 28B. That is, as shown in FIG. 27, after the p-type GaN layer 25 was grown, a growth mask 30 made of an insulating film such as an SiO$_2$ film was formed on it. Then a part of the growth mask 30 is etched off to form an opening and the p$^+$-type GaN contact layer 26 was selectively grown on the p-type GaN layer 25 exposed in the opening. Or, as shown in FIG. 28A, after the p-type GaN layer 25 was grown, the growth mask 30 made of an insulating film such as an SiO$_2$ film was formed on it. Then a part of the growth mask 30 was etched off to form an opening and a groove 31 was formed by etching the undoped Al$_x$Ga$_{1-x}$N layer 23 to its middle depth using the growth mask 30. And as shown in FIG. 28B, the p$^+$-type GaN contact layer 26 was selectively grown inside the groove 31 using the growth mask 30.

Next, described are examples of specific structures of field effect transistors and diodes to which the semiconductor device is applied.

The First Example of the Structure

Figure 29:
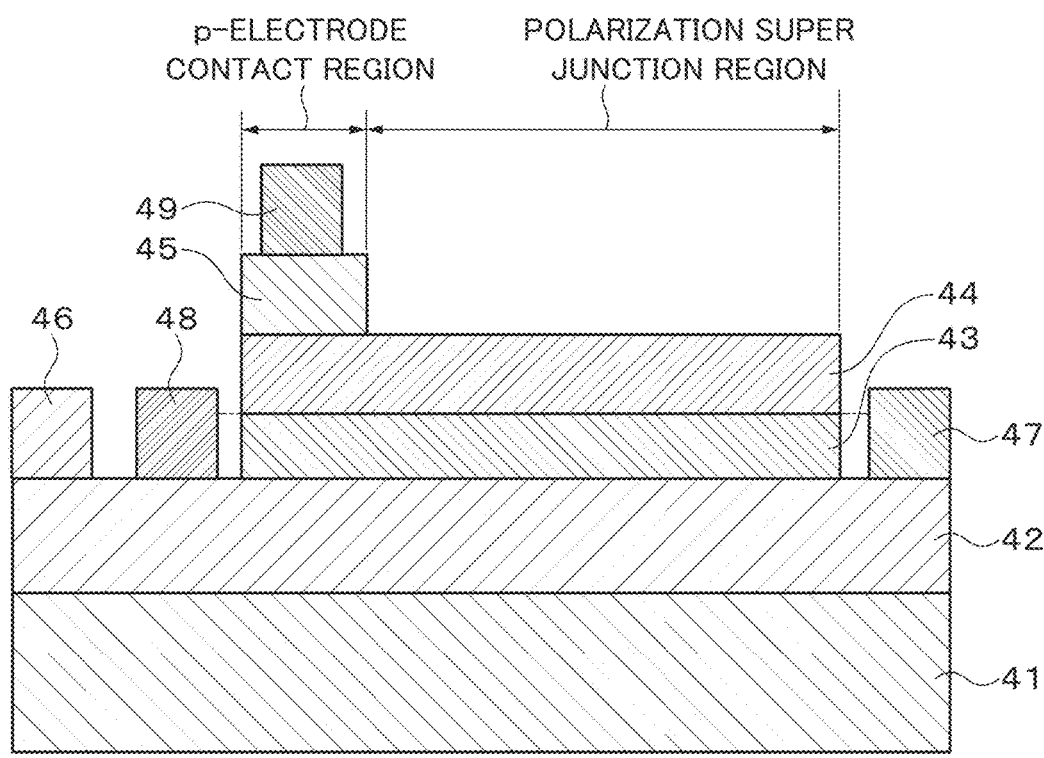
FIG. 29 A cross-sectional view showing the first example of the structure of the GaN-based semiconductor device according to the first embodiment of the invention.

FIG. 29 shows a four-terminal structure field effect transistor. As shown in FIG. 29, stacked in order are an undoped GaN layer 41, an undoped Al$_x$Ga$_{1-x}$N layer 42 (0.17≤x≤0.35) with a thickness not smaller than 25 nm and not larger than 47 nm, an undoped GaN layer 43 and a p-type GaN layer 44. The undoped GaN layer 43 and the p-type GaN layer 44 on the undoped Al$_x$Ga$_{1-x}$N layer 42 is patterned as a mesa and a p$^+$-type GaN contact layer 45 is formed on the p-type GaN layer 44 as a mesa. A source electrode 46 and a drain electrode 47 are formed on the undoped Al$_x$Ga$_{1-x}$N layer 42 so as to sandwich the undoped GaN layer 43 and the p-type GaN layer 44. The source electrode 46 and the drain electrode 47 are made of, for example, a Ti/Al two-layer film and come in ohmic contact with the undoped Al$_x$Ga$_{1-x}$N layer 42. A gate electrode 48 is formed on the undoped Al$_x$Ga$_{1-x}$N layer 42 of a part between the source electrode 46 and the undoped GaN layer 43 and the p-type GaN layer 44 and a p-electrode 49 is formed on the p$^+$-type GaN contact layer 45. The gate electrode 48 is made of, for example, a Ni/Au two-layer film and comes in Schottky contact with the undoped Al$_x$Ga$_{1-x}$N layer 42. The p-electrode 49 is made of, for example, a Ni/Au two-layer film and comes in ohmic contact with the p$^+$-type GaN contact layer 45. The field effect transistor has the structure that can be applied to both of a method that connects the p-electrode 49 and the source electrode 46 (this corresponds to a source field plate of a metal field plate (FP) method) and a method that connects the p-electrode 49 and the gate electrode 48 (this corresponds to a base field plate when the p-electrode 49 is considered as a base electrode). In FIG. 29, parts of the undoped Al$_x$Ga$_{1-x}$N layer 42 between the source electrode 46 and the gate electrode 48, between the gate electrode 48 and the undoped GaN layer 43 and between the undoped GaN layer 43 and the drain electrode 47 are exposed. However, as needed, it is possible to cover the surface of the undoped Al$_x$Ga$_{1-x}$N layer 42 with an undoped GaN layer so as to prevent the undoped Al$_x$Ga$_{1-x}$N layer 42 from exposing.

The Second Example of the Structure

Figure 30:
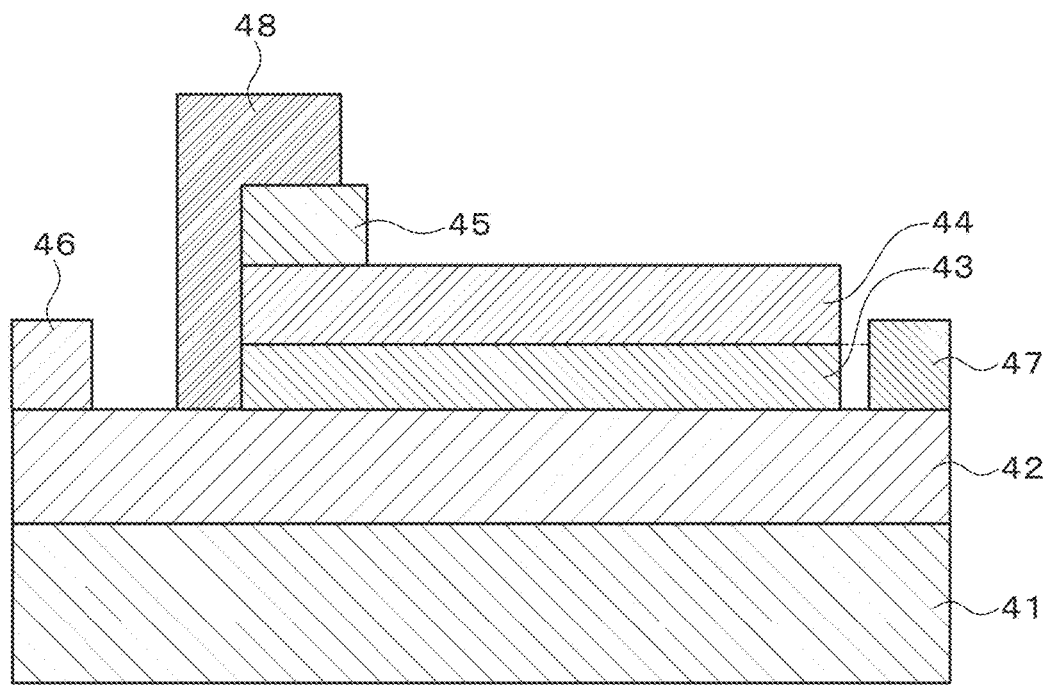
FIG. 30 A cross-sectional view showing the second example of the structure of the GaN-based semiconductor device according to the first embodiment of the invention.

FIG. 30 shows a three-terminal structure field effect transistor. As shown in FIG. 30, stacked in order are the undoped GaN layer 41, the undoped Al$_x$Ga$_{1-x}$N layer 42, the undoped GaN layer 43 and the p-type GaN layer 44. The undoped GaN layer 43 and the p-type GaN layer 44 on the undoped Al$_x$Ga$_{1-x}$N layer 42 are patterned as a mesa and the p$^+$-type GaN contact layer 45 is formed on the p-type GaN layer 44 as a mesa. The source electrode 46 and the drain electrode 47 are formed on the undoped Al$_x$Ga$_{1-x}$N layer 42 so as to sandwich the undoped GaN layer 43 and the p-type GaN layer 44. The gate electrode 48 serving also as the p-electrode 49 is formed on a part of the undoped Al$_x$Ga$_{1-x}$N layer 42 between the source electrode 46 and the undoped GaN layer 43 and the p-type GaN layer 44 such that it extends from the end surface of the undoped GaN layer 43 and the p-type GaN layer 44 to the p$^+$-type GaN contact layer 45. The gate electrode 48 is made of, for example, a Ni/Au two-layer film and comes in ohmic contact with the p$^+$-type GaN contact layer 45. The field effect transistor has the three-terminal structure in which the gate electrode 48 and the p-electrode 49 are made as one body and is equivalent to the field effect transistor shown in FIG. 25 in which the gate electrode 48 and the p-electrode 49 are made as one body.

The Third Example of the Structure

Figure 31:
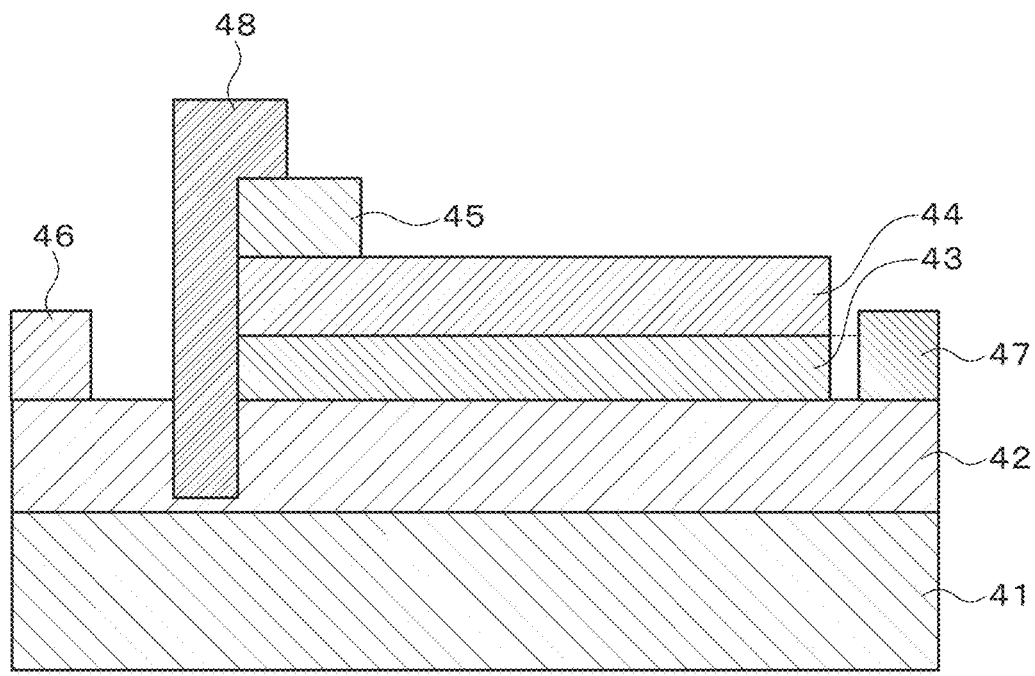
FIG. 31 A cross-sectional view showing the third example of the structure of the GaN-based semiconductor device according to the first embodiment of the invention.

FIG. 31 shows a normally-off three-terminal structure field effect transistor. As shown in FIG. 31, stacked in order are the undoped GaN layer 41, the undoped Al$_x$Ga$_{1-x}$N layer 42, the undoped GaN layer 43 and the p-type GaN layer 44. The undoped GaN layer 43 and the p-type GaN layer 44 on the undoped Al$_x$Ga$_{1-x}$N layer 42 are patterned as a mesa and the p$^+$-type GaN contact layer 45 is formed on the p-type GaN layer 44 as a mesa. The source electrode 46 and the drain electrode 47 are formed on the undoped Al$_x$Ga$_{1-x}$N layer 42 so as to sandwich the undoped GaN layer 43 and the p-type GaN layer 44. A groove is formed in a part of the undoped Al$_x$Ga$_{1-x}$N layer 42 between the source electrode 46 and the undoped GaN layer 43 and the p-type GaN layer 44 such that it continues to the end surface of the undoped GaN layer 43 and the p-type GaN layer 44. The gate electrode 48 serving also as the p-electrode 49 is buried inside the groove and further extends from the end surface of the undoped GaN layer 43 and the p-type GaN layer 44 on the p$^+$-type GaN contact layer 45. Control of the threshold voltage of the field effect transistor is carried out by the thickness of the undoped Al$_x$Ga$_{1-x}$N layer 42 at the part of the groove formed in the undoped Al$_x$Ga$_{1-x}$N layer 42 or a remaining amount after etching upon forming the groove.

The Fourth Example of the Structure

Figure 32:
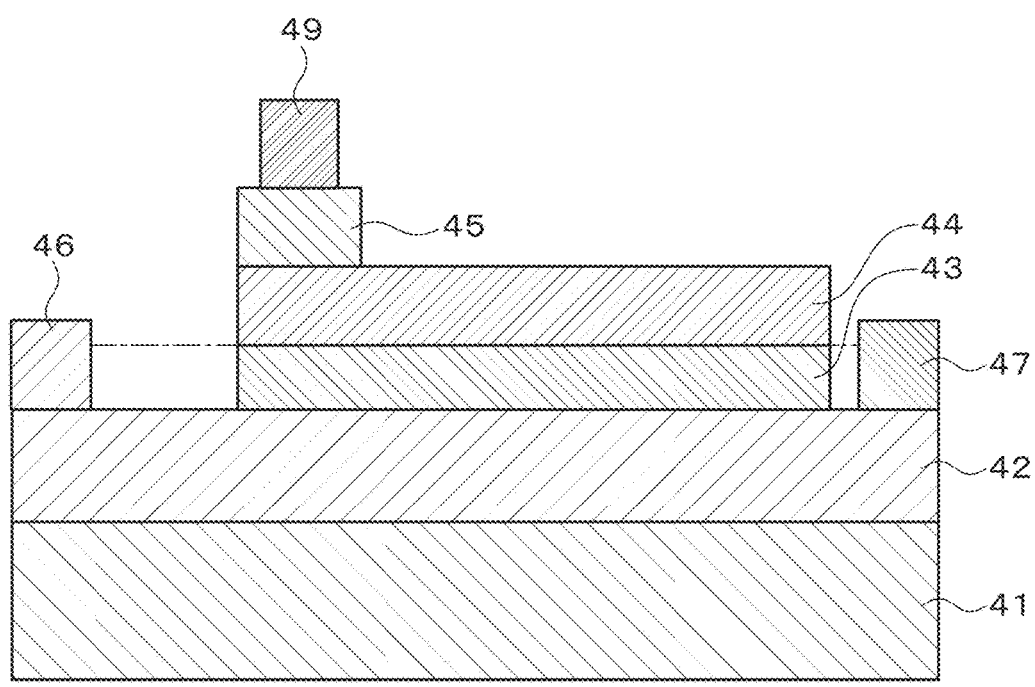
FIG. 32 A cross-sectional view showing the fourth example of the structure of the GaN-based semiconductor device according to the first embodiment of the invention.

FIG. 32 shows a three-terminal structure field effect transistor. As shown in FIG. 32, stacked in order are the undoped GaN layer 41, the undoped Al$_x$Ga$_{1-x}$N layer 42, the undoped GaN layer 43 and the p-type GaN layer 44. The undoped GaN layer 43 and the p-type GaN layer 44 on the undoped Al$_x$Ga$_{1-x}$N layer 42 are patterned as a mesa and the p$^+$-type GaN contact layer 45 is formed on the p-type GaN layer 44 as a mesa. The source electrode 46 and the drain electrode 47 are formed on the undoped Al$_x$Ga$_{1-x}$N layer 42 so as to sandwich the undoped GaN layer 43 and the p-type GaN layer 44. The p-electrode 49 serving also as the gate electrode 48 is formed on the p$^+$-type GaN contact layer 45. Operation of the field effect transistor is the same as the field effect transistor shown in FIG. 31 except that the threshold voltage becomes deeper (shifts to the negative side).

The Fifth Example of the Structure

Figure 33:
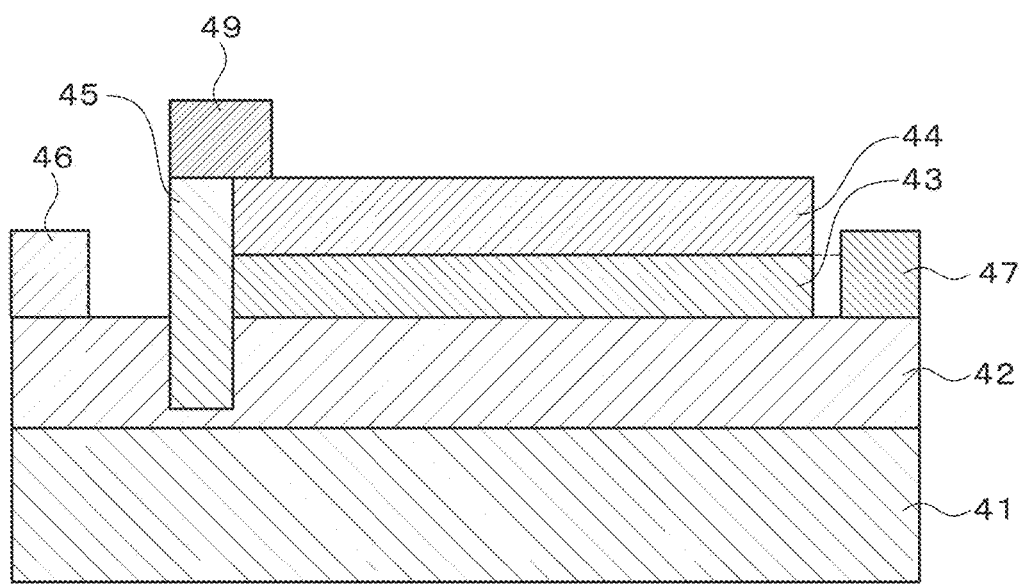
FIG. 33 A cross-sectional view showing the fifth example of the structure of the GaN-based semiconductor device according to the first embodiment of the invention.

FIG. 33 shows a normally-off three-terminal structure field effect transistor. As shown in FIG. 33, stacked in order are the undoped GaN layer 41, the undoped Al$_x$Ga$_{1-x}$N layer 42, the undoped GaN layer 43 and the p-type GaN layer 44. The undoped GaN layer 43 and the p-type GaN layer 44 on the undoped Al$_x$Ga$_{1-x}$N layer 42 are patterned as a mesa. A groove is formed in the undoped Al$_x$Ga$_{1-x}$N layer 42 such that it continues the end surface of the undoped GaN layer 43 and the p-type GaN layer 44 and the p$^+$-type GaN contact layer 45 is buried inside the groove, so that the p$^+$-type GaN contact layer 45 and a two-dimensional hole gas (not shown) form a junction. The p$^+$-type GaN contact layer 45 can be grown by selective regrowth. The source electrode 46 and the drain electrode 47 are formed on the undoped Al$_x$Ga$_{1-x}$N layer 42 so as to sandwich the undoped GaN layer 43 and the p-type GaN layer 44. The p-electrode 49 serving also as the gate electrode 48 is formed on the p$^+$-type GaN contact layer 45. In the field effect transistor shown in FIG. 31, the gate electrode 48 is a Schottky junction type. In contrast with this, in the field effect transistor, the gate electrode 48 is a p/n junction type. Although the gate electrode 48 of the field effect transistor is a p/n junction type as described above, diffusion potential of the p/n junction is 3.4V, which is higher than diffusion potential ~1.4V of the Schottky junction by +2V. Therefore, it is possible to obtain a high gate threshold voltage. It is good for improvement of the threshold voltage to completely remove a part of the undoped Al$_x$Ga$_{1-x}$N layer 42 under the p$^+$-type GaN contact layer 45 and make the p$^+$-type GaN contact layer 45 come in contact with the undoped GaN layer 41.

The Sixth Example of the Structure

Figure 34:
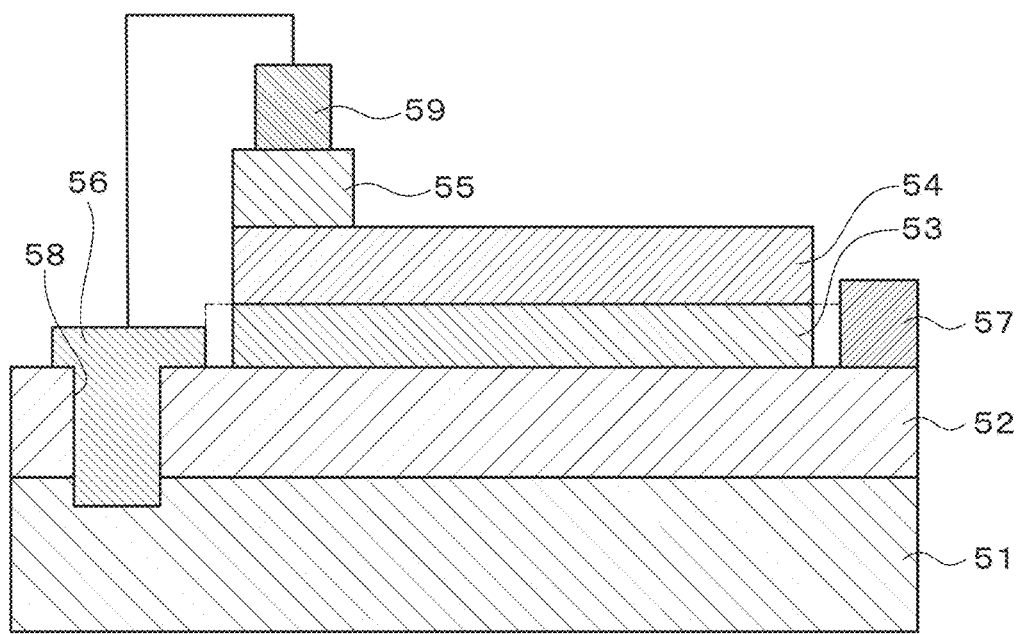
FIG. 34 A cross-sectional view showing the sixth example of the structure of the GaN-based semiconductor device according to the first embodiment of the invention.

FIG. 34 shows a three-terminal structure diode. As shown in FIG. 34, stacked in order are an undoped GaN layer 51, an undoped Al$_x$Ga$_{1-x}$N layer 52, an undoped GaN layer 53 and a p-type GaN layer 54. The undoped GaN layer 53 and the p-type GaN layer 54 on the undoped Al$_x$Ga$_{1-x}$N layer 52 are patterned as a mesa and a p$^+$-type GaN contact layer 55 is formed on the p-type GaN layer 54 as a mesa. An anode electrode 56 and a cathode electrode 57 are formed so as to sandwich the undoped GaN layer 53 and the p-type GaN layer 54. The anode electrode 56 is buried inside a groove 58 that is formed in a depth reaching the undoped GaN layer 51 and comes in direct contact with a 2DEG (not shown) formed in the undoped GaN layer 51 in the vicinity part of the hetero-interface between the undoped GaN layer 51 and the undoped Al$_x$Ga$_{1-x}$N layer 52. The anode electrode 56 is made of, for example, a Ni/Au two-layer film etc. that comes in Schottky contact with an n-type GaN-based semiconductor. The source electrode 57 is formed on the undoped Al$_x$Ga$_{1-x}$N layer 52. A p-electrode 59 is formed on the p$^+$-type GaN contact layer 55. The anode electrode 56 and the p-electrode 59 are electrically connected each other. The diode corresponds to the field effect transistor shown in FIG. 25 in which the undoped Al$_x$Ga$_{1-x}$N layer 52 under the gate electrode 48 is etched and the gate electrode 48 is made come in contact with the undoped GaN layer 51 to form a Schottky junction. As needed, the anode electrode 56 and the p-electrode 59 are formed as one body.

The Seventh Example of the Structure

Figure 35:
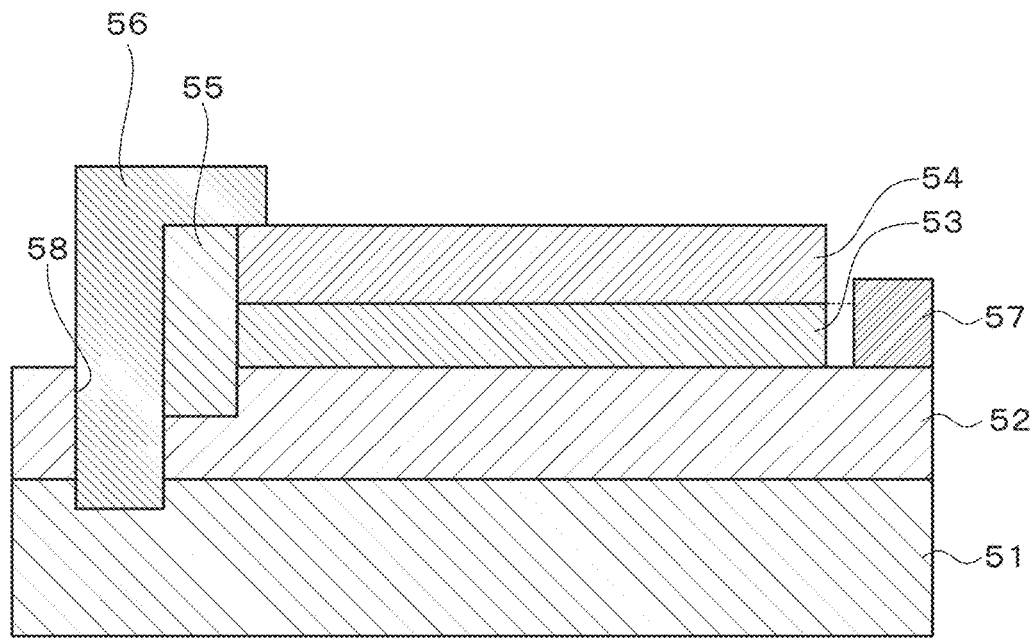
FIG. 35 A cross-sectional view showing the seventh example of the structure of the GaN-based semiconductor device according to the first embodiment of the invention.

FIG. 35 shows a two-terminal structure diode. As shown in FIG. 35, stacked in order are the undoped GaN layer 51, the undoped Al$_x$Ga$_{1-x}$N layer 52, the undoped GaN layer 53 and the p-type GaN layer 54. The undoped GaN layer 53 and the p-type GaN layer 54 on the undoped Al$_x$Ga$_{1-x}$N layer 52 are patterned as a mesa. A groove is formed in the undoped Al$_x$Ga$_{1-x}$N layer 52 such that it continues the end surface of the undoped GaN layer 53 and the p-type GaN layer 54 and the p$^+$-type GaN contact layer 55 is buried inside the groove, so that the p$^+$-type GaN contact layer 55 and a two-dimensional hole gas (not shown) forms a junction. The anode electrode 56 and the cathode electrode 57 are formed so as to sandwich the undoped GaN layer 53 and the p-type GaN layer 54. Another groove 58 with a depth reaching the undoped GaN layer 51 is formed such that it continues the p$^+$-type GaN contact layer 55. The anode electrode 56 is buried inside another groove 58 and further extends on the p$^+$-type GaN contact layer 55. The anode electrode 56 is made of, for example, a Ni/Au two-layer film. The source electrode 57 is formed on the undoped Al$_x$Ga$_{1-x}$N layer 52.

The Eighth Example of the Structure

Figure 36:
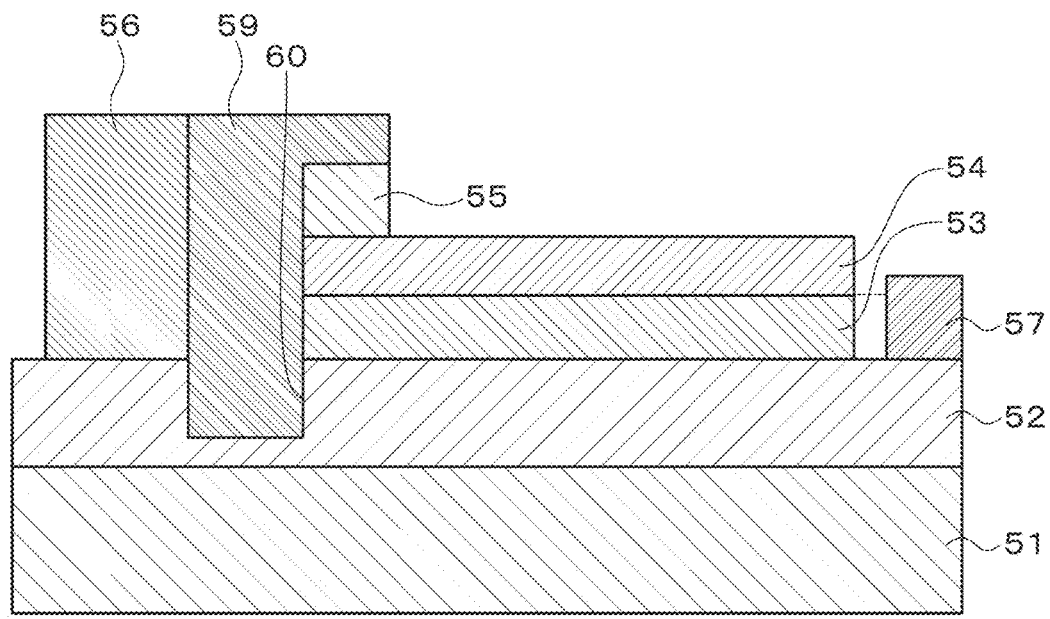
FIG. 36 A cross-sectional view showing the eighth example of the structure of the GaN-based semiconductor device according to the first embodiment of the invention.

FIG. 36 shows a two-terminal structure diode. As shown in FIG. 36, stacked in order are the undoped GaN layer 51, the undoped Al$_x$Ga$_{1-x}$N layer 52, the undoped GaN layer 53 and the p-type GaN layer 54. The undoped GaN layer 53 and the p-type GaN layer 54 on the undoped Al$_x$Ga$_{1-x}$N layer 52 are patterned as a mesa and the p$^+$-type GaN contact layer 55 is formed on the p-type GaN layer 54 as a mesa. A groove 60 is formed in a part of the undoped Al$_x$Ga$_{1-x}$N layer 52 between the anode electrode 56 and the undoped GaN layer 53 and the p-type GaN layer 54 such that it continues the end surface of the undoped GaN layer 53 and the p-type GaN layer 54. The p-electrode 59 is buried inside the groove 60. The p-electrode 59 further extends from the end surface of the undoped GaN layer 53 and the p-type GaN layer 54 on the p$^+$-type GaN contact layer 55 and forms one body with the anode electrode 56, so that the p-electrode 59 and the anode electrode 56 are electrically connected each other. The diode has a structure in which the source electrode 46 and the gate electrode 48 of the normally-off (enhancement mode) field effect transistor with the gate threshold voltage higher than 0 V shown in FIG. 32 are formed as one body. When a positive voltage is applied to the anode electrode 56 relative to the cathode electrode 57, the Schottky junction turns on and forward current flows between the anode electrode 56 that is an ohmic electrode and the cathode electrode 57. When a negative voltage is applied to the anode electrode 56, the Schottky junction turns off and no current flows between the anode electrode 56 and the cathode electrode 57.

Figure 37:
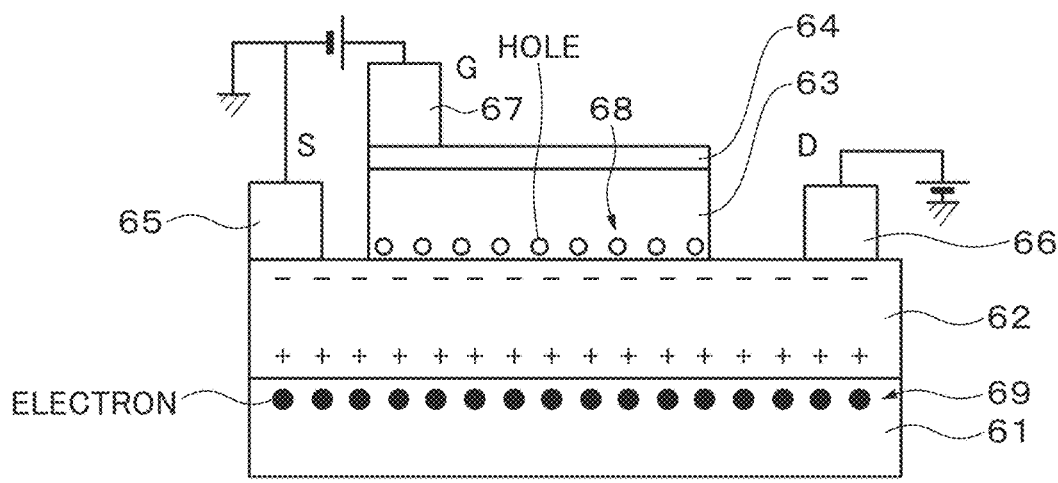
FIG. 37 A schematic view for explaining operation of the GaN-based semiconductor device according to the first embodiment of the invention.

A field effect transistor to which the polarization super junction structure shown in FIG. 37 is applied was made. The result of operation experiment of the field effect transistor will be described. By the operation experiment, it is possible to evaluate the effect of the contact resistance of the p-electrode on the switching characteristic of the transistor.

Figure 38:
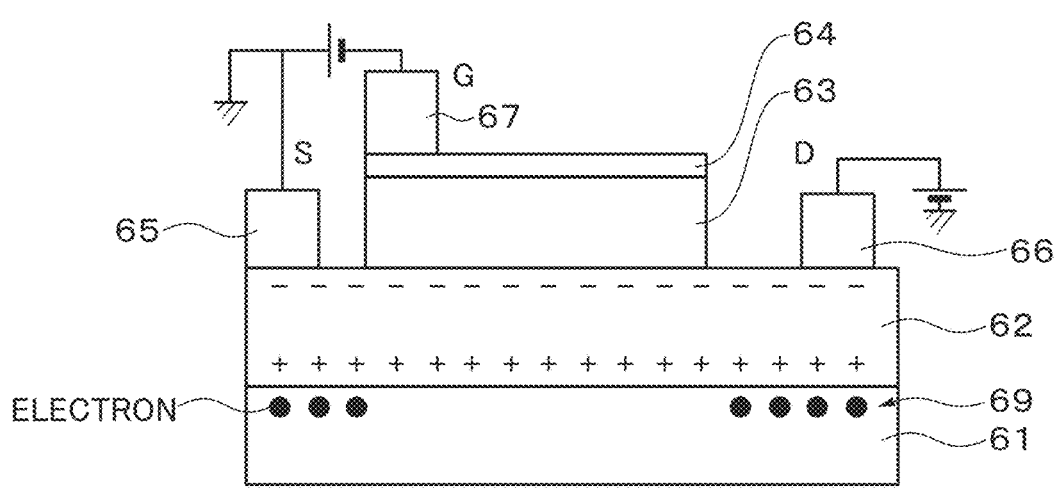
FIG. 38 A schematic view for explaining operation of the GaN-based semiconductor device according to the first embodiment of the invention.

As shown in FIG. 37, in the field effect transistor, stacked in order are an undoped GaN layer 61, an undoped Al$_x$Ga$_{1-x}$N layer 62, an undoped GaN layer 63 and a p-type GaN layer 64. The undoped GaN layer 63 and the p-type GaN layer 64 on the undoped Al$_x$Ga$_{1-x}$N layer 62 are patterned as a mesa. A source electrode 65 and a drain electrode 66 are formed on the undoped Al$_x$Ga$_{1-x}$N layer 62 so as to sandwich the undoped GaN layer 63 and the p-type GaN layer 64. A gate electrode 67 serving also as a p-electrode is formed on the p-type GaN layer 64. In FIG. 37, a state of electrons and holes in the on state of the transistor is shown. Reference numeral 68 denotes 2DHG and 69 denotes 2DEG. In FIG. 38, a state of electrons and holes in the off state of the transistor is shown. In FIG. 38, a negative voltage is applied to the gate electrode 67, holes (2DHG 68) are extracted through the gate electrode 67 and an electron channel (2DEG 69) just under the gate electrode 67 is depleted. In this way, in on/off operation of the transistor, injection/extraction of holes (2DHG 68) is carried out. If there is any obstacle in movement of holes (2DHG 68), it has an effect on its dynamic characteristic.

The hole mobility is one of factors having an effect on movement of holes (2DHG 68). The hole mobility is empirically about 15-30 [cm$^2$/Vs] as shown in table 3. The value is 1/500~1/1000 of the electron mobility and it is therefore considered that the moving velocity of holes dominates the speed of the present transistor. Then the switching speed is presumed to be less than 1/1000 of the general HFET. Therefore, the cutoff frequency is presumed to be about several MHz~several tens MHz, depending on the length of the polarization super junction region. However, the switching frequency of the Si-IGBT (Insulated Gate Bipolar Transistor) is several tens kHz at most and that of the Si-power MOSFET is several MHz. The field effect transistor using the super junction can be applied to a high voltage resistance power device and its speed is higher than that of the Si-IGBT or the Si-power MOSFET.

Figure 39:
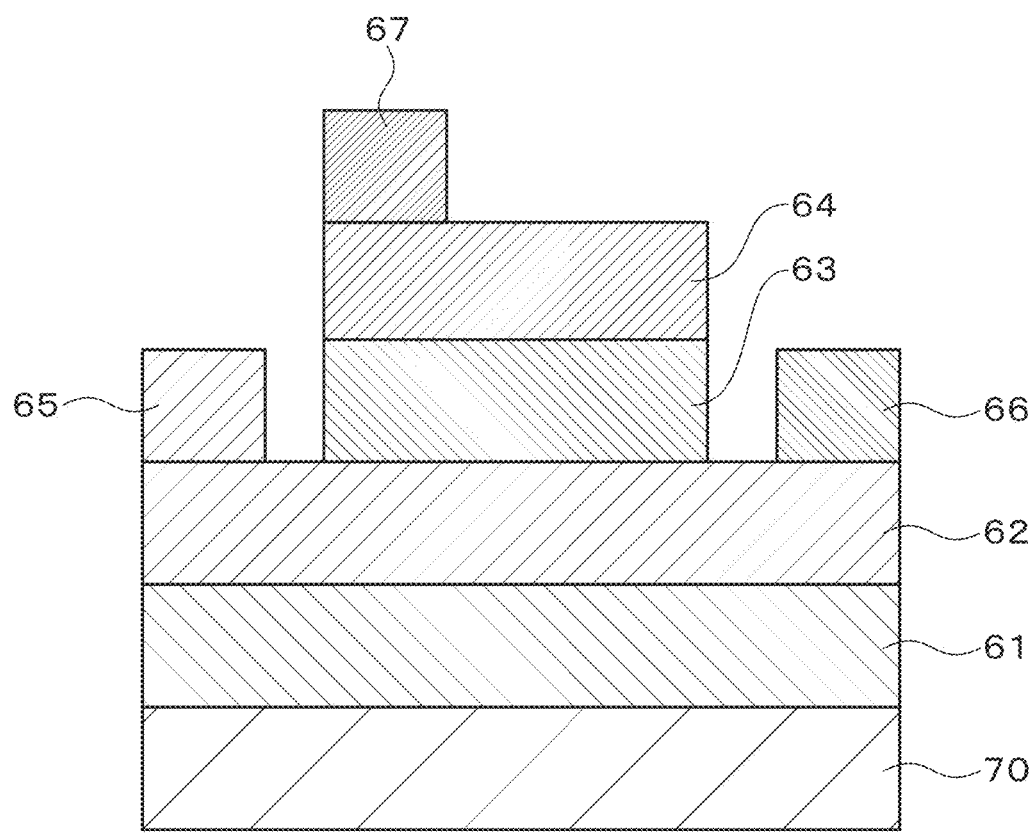
FIG. 39 A cross-sectional view showing a sample which was used in an experiment conducted to confirm operation of the GaN-based semiconductor device according to the first embodiment of the invention.
Figure 40:
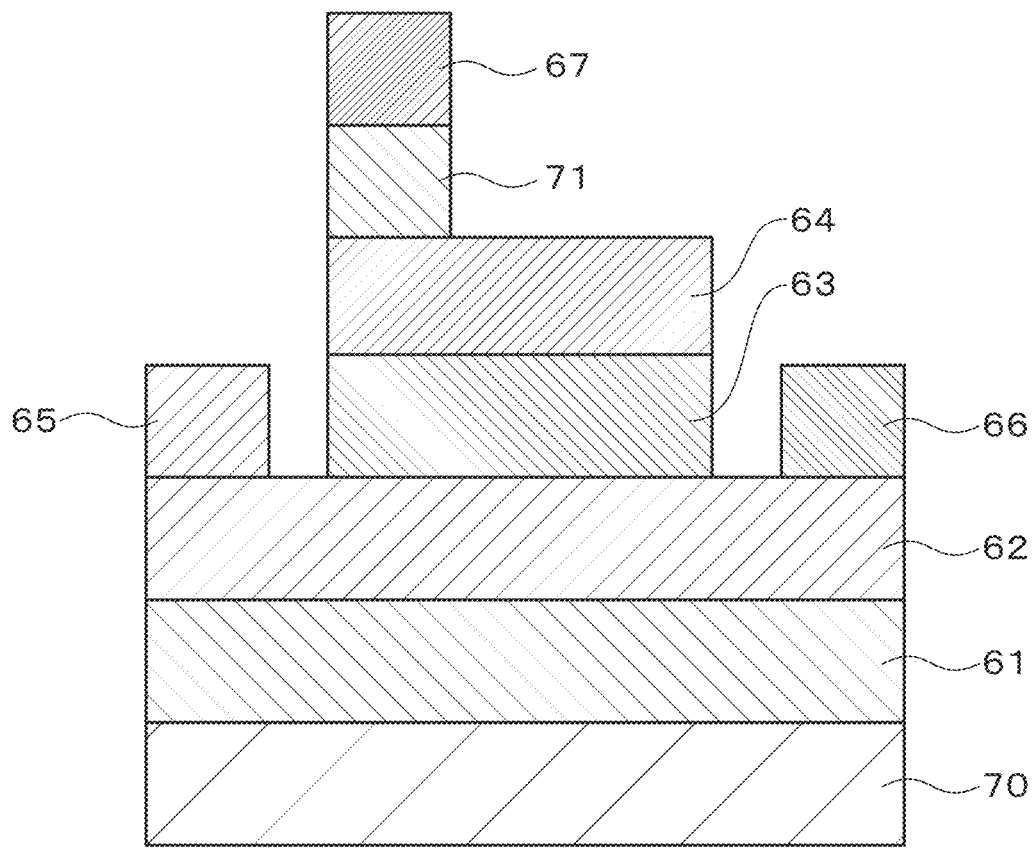
FIG. 40 A cross-sectional view showing the sample which was used in the experiment conducted to confirm operation of the GaN-based semiconductor device according to the first embodiment of the invention.

In order to attain the above speed, the contact resistance of the p-electrode must be small so that it does not have an effect on the moving velocity of holes. Therefore, in order to investigate effect of the contact resistance of the p-electrode, two transistors 1 and 2 with contact resistances much different from each other were made and their dynamic characteristics were examined. The transistor 1 has a three-terminal structure shown in FIG. 39. As shown in FIG. 39, the layer structure of the transistor 1 is as follows. The undoped $Al_xGa_{1-x}N$ layer 62 has a thickness of 47 nm and x=0.23, the undoped GaN layer 63 has a thickness of 25 nm and the p-type GaN layer 64 has a Mg concentration of $1.5 \times 10^{19}$ $cm^{-3}$ and a thickness of 40 nm. The transistor 2 has a three-terminal structure shown in FIG. 40. As shown in FIG. 40, the layer structure of the transistor 2 is as follows. The undoped $Al_xGa_{1-x}N$ layer 62 has a thickness of 47 nm and x=0.23, the undoped GaN layer 63 has a thickness of 25 nm, the p-type GaN layer 64 has a Mg concentration of $1.5 \times 10^{19}$ $cm^{-3}$ and a thickness of 20 nm. The p-type GaN layer with a Mg concentration of $1.5 \times 10^{19}$ $cm^{-3}$ and a thickness of 20 nm and the $p^+$-type GaN contact layer 71 with a Mg concentration of $5 \times 10^{19}$ $cm^{-3}$ and a thickness of 40 nm are stacked in order on the p-type GaN layer 64 and a mesa is formed. In FIG. 40, the p-type GaN layer on the p-type GaN layer 64 is illustrated as included in the $p^+$-type GaN contact layer 71. With respect to the transistor 2, since the high concentration $p^+$-type GaN contact layer 71 is added on the top surface, the $p^+$-type GaN contact layer 71 was etched off except for the contact region of the gate electrode 67 serving also as a p-electrode. The etching amount was 60 nm. The contact resistance of the transistor 1 was $1.3 \times 10^4$ $\Omega cm^2$ and the contact resistance of the transistor 2 was 0.84 $\Omega cm^2$.

Figure 41:
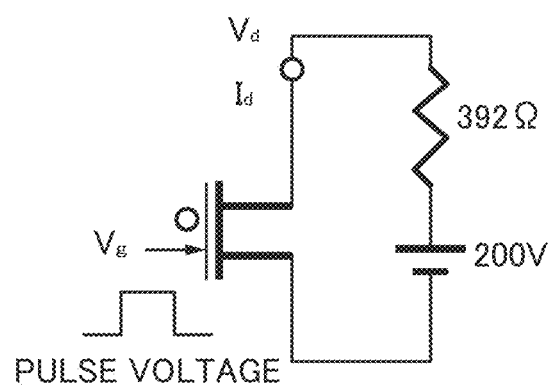
FIG. 41 A schematic view showing a measurement circuit which was used in the experiment conducted to confirm operation of the GaN-based semiconductor device according to the first embodiment of the invention.

FIG. 41 shows a measurement circuit. As shown in FIG. 41, a DC voltage source, a load resistor and a transistor for test (transistor 1 or 2) were connected in series. Power supply voltage was set to 200V and the resistance of the load resistor was set to 392Ω. The transistor 1 or 2 was kept for ten seconds in a pinch-off state. Then a positive voltage pulse was applied to the gate electrode 67 to turn on the transistor 1 or 2. The pulse width of positive voltage applied to the gate electrode 67 was 1 μs. In FIG. 41, the transistor 1 or 2 that is a PSJ-FET is denoted by a symbol. In the symbol, ○ denotes 2DHG.

Figure 42:
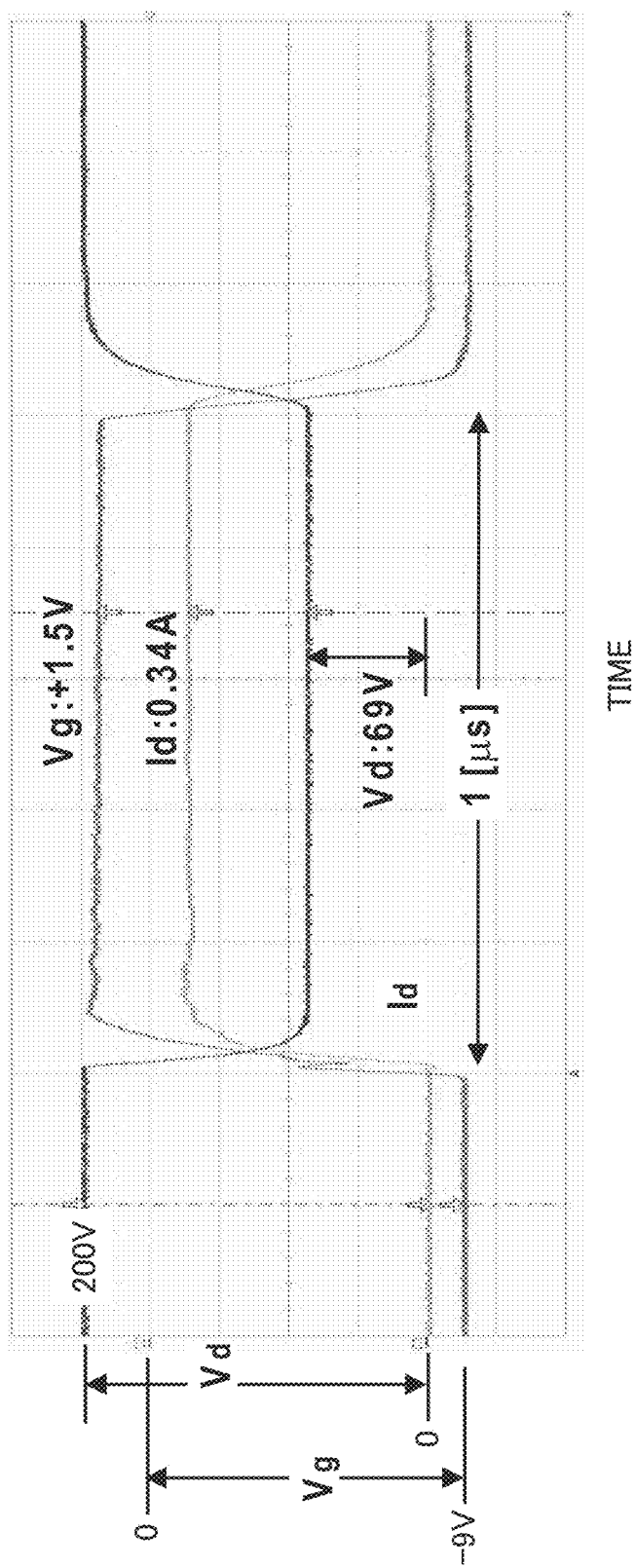
FIG. 42 A schematic view showing the result of an operation experiment conducted by using the sample shown in FIG. 39.
Figure 43:
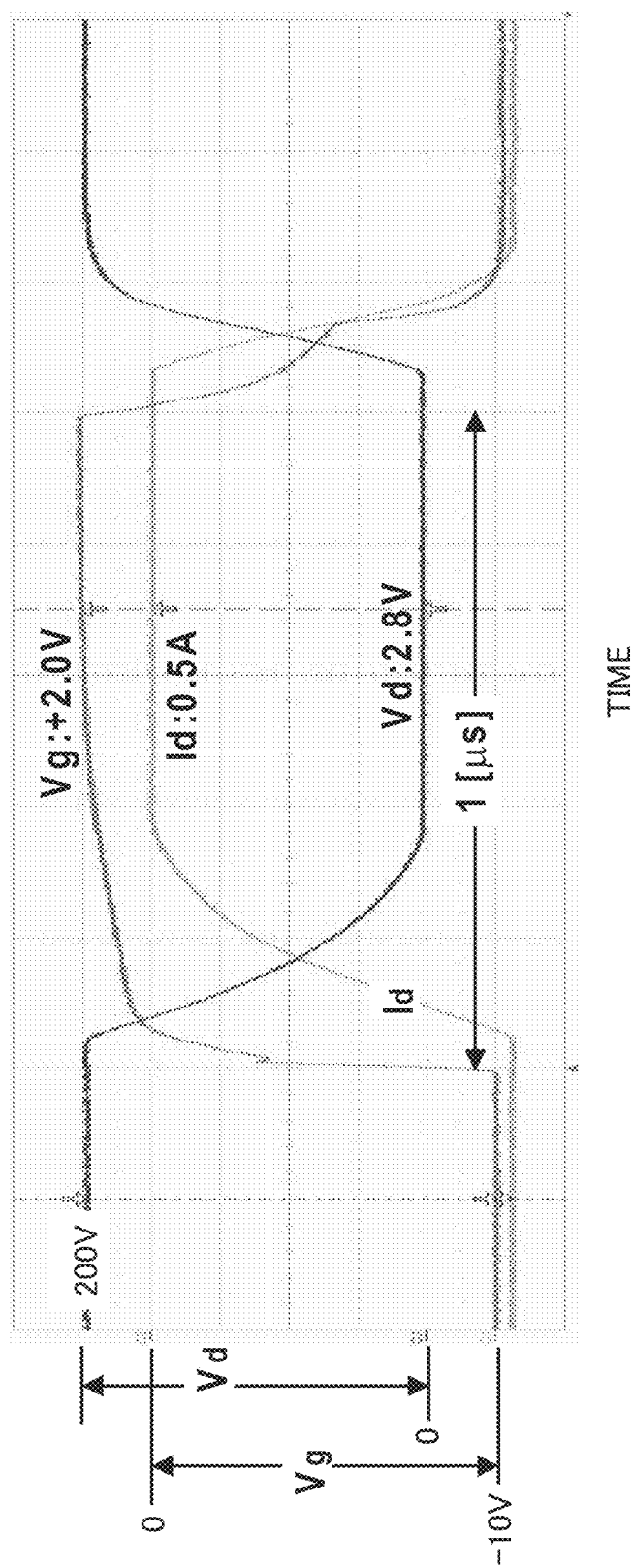
FIG. 43 A schematic view showing the result of an operation experiment conducted by using the sample shown in FIG. 40.

FIG. 42 and FIG. 43 show waveforms of the gate voltage $V_g$, the drain voltage $V_d$ and the drain current $I_d$. In a transition period from the off state to the on state, a voltage was applied to the load resistor and the drain voltage $V_d$ decreased. With respect to the transistor 1, after the drain voltage $V_d$ rapidly decreased, it did not decrease further and remained at a constant value. The constant value of $V_d$ was 69V. This shows that the channel resistance of the device is very large and the device is in the state of so-called current collapse. This phenomenon is called a switching collapse. In general HFETs this is a serious problem. Its reason is as follows. Injection speed of holes is small, so that the region of the p-type GaN layer 64 remains in the negatively ionized state. As a result, the channel is narrowed by Coulomb effect and there occurs a state of a small drain current $I_d$ and a large drain voltage $V_d$. It is to be noted that the transistor 1 does not suffer from current collapse for DC (the pulse width is larger than hundreds ms). On the other hand, with respect to transition from the on state to the off state, since a very high reverse bias voltage of 200V is applied between the gate electrode 67 and the drain electrode 66, holes are extracted even though the contact resistance of the gate electrode 67 serving also as a p-electrode for the p-type GaN layer 64 and a clear off state can be realized as fast as 100 ns or less.

Next the dynamic characteristic of the transistor 2 is observed. As shown in FIG. 43, the drain voltage $V_d$ fell off almost completely within 200 ns. This shows that the polarization super junction region is subject to injection of holes and neutralized.

It is understood from the above that it is very important to make the contact resistance of the p-electrode small.

According to the first embodiment, it is possible to realize a GaN-based semiconductor device which can easily overcome the tradeoff relation between the high voltage resistance and high speed in the semiconductor device using a polarization super junction proposed in patent literature 3 and non-patent literature 3, realize both the high voltage resistance and elimination of the occurrence of current collapse during switching and operate in high speed and further the loss is low.

2. The Second Embodiment

The GaN-based semiconductor device according to the second embodiment is described.

Figure 44:
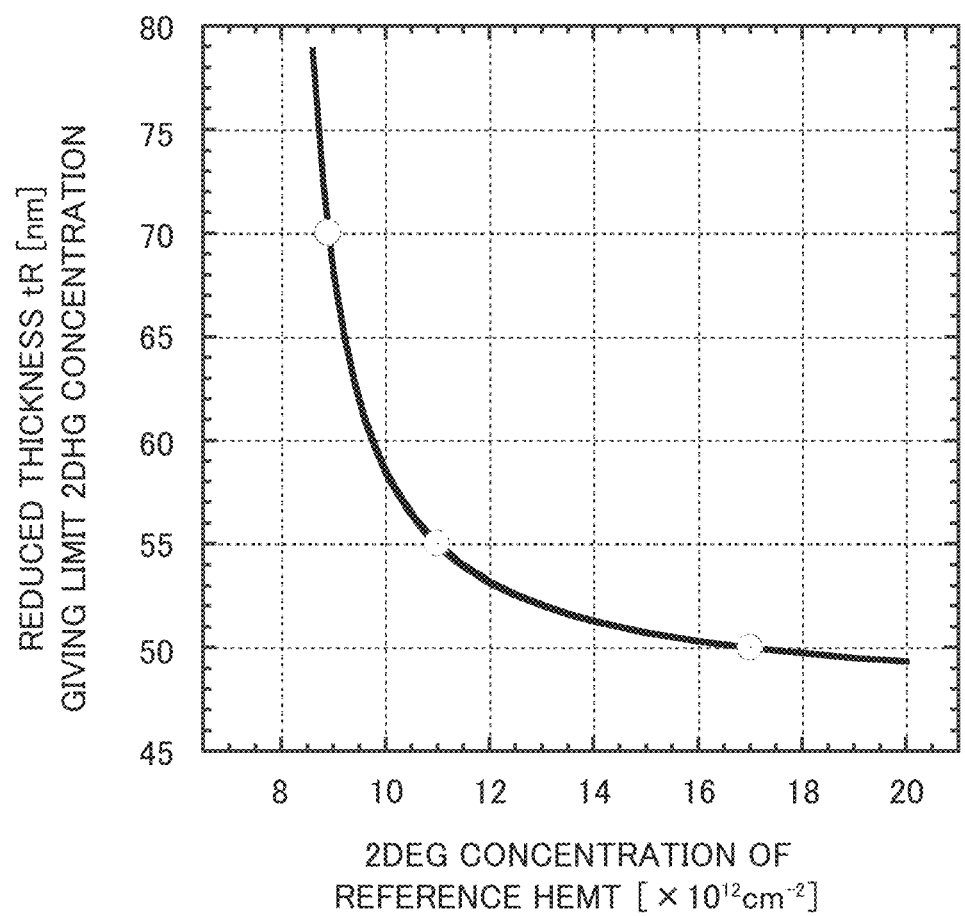
FIG. 44 A schematic view showing the relation between the 2DEG concentration of the reference HEMT and the reduced thickness tR giving the limit 2DHG concentration which is the base of the GaN-based semiconductor device according to the second embodiment of the invention.

In the first embodiment, the limit reduced thickness is obtained for the structure (composition and thickness) of the undoped $Al_xGa_{1-x}N$ layer 23 (or the undoped $Al_xGa_{1-x}N$ layer 12). It is not easy to simply measure the Al composition and the thickness of the $Al_xGa_{1-x}N$ layer of the device made, whereas it is easy to measure the electron concentration. Therefore, it is meaningful to examine the relation between the 2DEG concentration and the reduced thickness tR of the device. It is now examined. As described previously, the structure of the $Al_xGa_{1-x}N$ layer and the 2DEG concentration have the first order relationship as described in the above literature and therefore the reduced thickness tR can be obtained in relation to the 2DEG concentration of the reference HEMT. The reference HEMT is a HEMT with a structure composed of the undoped GaN layer 11 and the undoped $Al_xGa_{1-x}N$ layer 12 (0.17≤x≤0.35) with a thickness not smaller than 25 nm and not larger than 47 nm formed on it and has a 2DEG concentration not smaller than 0 0.89×$10^{13}$ $cm^{-2}$ and not larger than $1.70 \times 10^{13}$ $cm^{-2}$. FIG. 44 shows the reduced thickness tR that gives the limit 2DHG concentration of the corresponding polarization super junction structure against the 2DEG concentration of the reference HEMT. In FIG. 44, shown is a 1/x curve that fits the values measured. The 2DEG concentration of the reference HEMT is denoted as $n_s$ in unit of $10^{12}$ $cm^{-2}$ and the limit reduced thickness is denoted as y. Here, in $$y = a/(n_s - b) + c \qquad (5)$$

a, b and c of the curve that fits the values measured were a=24.22 (24.2 after rounded), b=7.83 and c=47.36 (47.4 after rounded).

In the above consideration, the Al composition x of the undoped $Al_xGa_{1-x}N$ layer 12 was set to 0.17≤x≤0.35 and the thickness was set to be not smaller than 25 nm and not larger than 47 nm. However, depending on various conditions of crystal growth, the structure (composition and thickness) of the undoped $Al_xGa_{1-x}N$ layer 23 (or the undoped $Al_xGa_{1-x}N$ layer 12) of the reference HEMT with the 2DEG concentration not smaller than 0 $0.89\times10^{13}$ cm$^{-2}$ and not larger than $1.7\times10^{13}$ cm$^{-2}$ may change. And it is apparent from the difference between the 2DEG concentration of the above literature and that of the reference HEMT that it is possible to obtain the above 2DEG concentration by the undoped $Al_xGa_{1-x}N$ layer 23 with an Al composition and a thickness different from the Al composition x of $0.17\leq x\leq0.35$ and the thickness not smaller than 25 nm and not larger than 47 nm. Its reason is as follows. That is, the 2DEG is formed by polarization and the undoped $Al_xGa_{1-x}N$ layer 23 is introduced to produce the polarization. The structure (composition and thickness) of the undoped $Al_xGa_{1-x}N$ layer 23 to produce the polarization may change depending on various conditions such as a growth apparatus and temperature. However, the Al composition and the thickness of the undoped $Al_xGa_{1-x}N$ layer 23 do not differ much from the Al composition of $0.17\leq x\leq0.35$ and the thickness not smaller than 25 nm and not larger than 47 nm. Therefore, the reduced thickness tR that can be applied to the undoped $Al_xGa_{1-x}N$ layer 23 ($0<x<1$) that makes the 2DEG concentration of the reference HEMT not smaller than $0.89\times10^{13}$ cm$^{-2}$ and not larger than $1.7\times10^{13}$ cm$^{-2}$ instead of the Al composition and the thickness of the $Al_xGa_{1-x}N$ layer described above is as follows.

$$tR \geq 24.2/(n_s-7.83)+47.4 \text{ [nm]} \quad (6)$$

Here, as far as the 2DEG concentration of the reference HEMT is not smaller than $0.89\times10^{13}$ cm$^{-2}$ and not larger than $1.70\times10^{13}$ cm$^{-2}$, it is possible to use an n-type or p-type $Al_xGa_{1-x}N$ layer that is doped with donors (n-type impurities) or acceptors (p-type impurities), for example, a Si-doped n-type $Al_xGa_{1-x}N$ layer instead of the undoped $Al_xGa_{1-x}N$ layer 23.

Therefore, in the GaN-based semiconductor device, the thickness u [nm] of the undoped GaN layer 13, the thickness v [nm] of the p-type GaN layer 14, the Mg concentration w [cm$^{-3}$] of the p-type GaN layer 14 and the Al composition and the thickness of the undoped $Al_xGa_{1-x}N$ layer 12 (or the doped $Al_xGa_{1-x}N$ layer 12) are selected so that the reduced thickness tR satisfies the equation (6). With this, it is possible to form the 2DHG 16 with a concentration equal to or larger than $1\times10^{12}$ cm$^{-2}$.

Other than the above of the GaN-based semiconductor device is the same as the GaN-based semiconductor device according to the first embodiment.

Specific examples of the structure of the GaN-based semiconductor device are also the same as the first embodiment fundamentally.

According to the second embodiment, the same advantages as the first embodiment can be obtained.

3. The Third Embodiment

The GaN-based bidirectional field effect transistor (polarization super junction bidirectional field effect transistor) according to the third embodiment is described.

Figure 45:
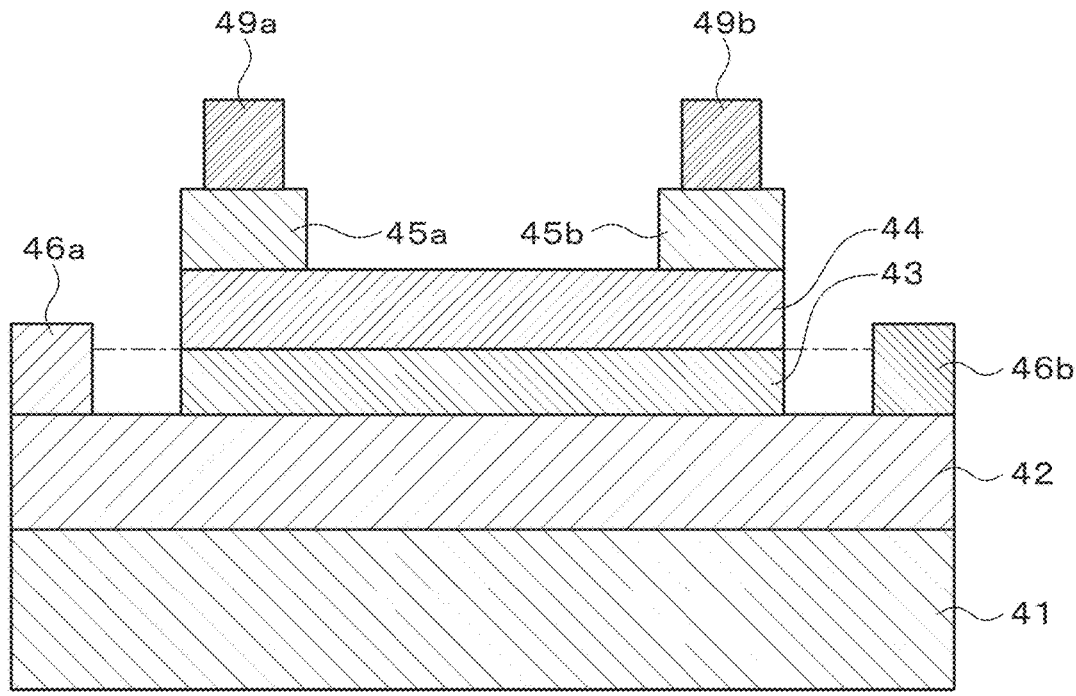
FIG. 45 A cross-sectional view showing the GaN-based bidirectional field effect transistor according to the third embodiment of the invention.

FIG. 45 shows the GaN-based bidirectional field effect transistor. As shown in FIG. 45, stacked in order are the undoped GaN layer 41, the undoped $Al_xGa_{1-x}N$ layer 42, the undoped GaN layer 43 and the p-type GaN layer 44. The undoped GaN layer 43 and the p-type GaN layer 44 on the undoped $Al_xGa_{1-x}N$ layer 42 are patterned as a mesa. Two p$^+$-type GaN contact layers 45a, 45b are formed separately each other on the p-type GaN layer 44 as mesas. Two source electrodes 46a, 46b are formed separately each other on the undoped $Al_xGa_{1-x}N$ layer 42 so as to sandwich the undoped GaN layer 43 and the p-type GaN layer 44. A p-electrode 49a that is used as a gate electrode is formed on the p$^+$-type GaN contact layer 45a and a p-electrode 49b that is used as a gate electrode is formed on the p$^+$-type GaN contact layer 45b. The source electrodes 46a, 46b, the p$^+$-type GaN contact layer 45a, 45b and the p-electrodes 49a, 49b are formed symmetrically with respect to the undoped GaN layer 43 and the p-type GaN layer 44. In the GaN-based bidirectional field effect transistor, the equation (4) is satisfied.

The GaN-based bidirectional field effect transistor can turn on or off both forward and reverse voltage for AC voltage input by signal voltages (switch signals) applied to the p-electrodes 49a, 49b that are used as gate electrodes. In this case, depending on polarity of AC voltage input the source electrode 46a or the source electrode 46b acts as the drain electrode.

Figure 46:
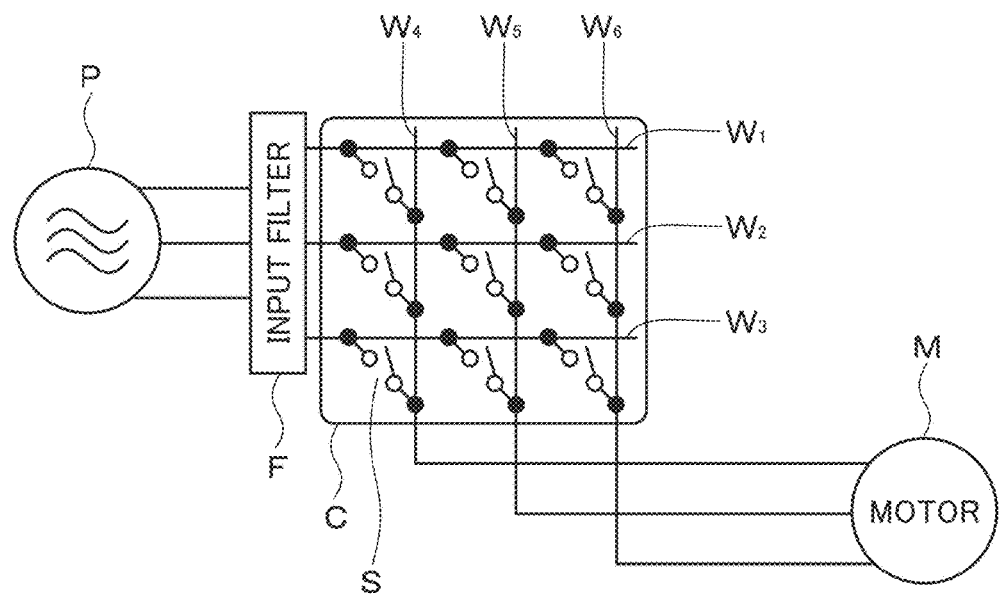
FIG. 46 A circuit diagram showing a power circuit of a three-phase alternative current induction motor in which the GaN-based bidirectional field effect transistor according to the third embodiment of the invention is used as a bidirectional switch of a matrix converter.

The GaN-based bidirectional field effect transistor is suitable for a bidirectional switch of a matrix converter. An example is shown in FIG. 46. FIG. 46 shows a power supply circuit of a three phase AC induction motor M using the matrix converter. As shown in FIG. 46, in the matrix converter C, at each intersection of transverse wires $W_1$, $W_2$ and $W_3$ and vertical wires $W_4$, $W_5$ and $W_6$, the bidirectional switch S that connects the transverse wire and the vertical wire that intersects at each intersection is formed as a matrix. Each phase voltage of three phase AC power supply P is input to the wires $W_1$, $W_2$ and $W_3$ through an input filter F. The wires $W_4$, $W_5$ and $W_6$ are connected with the three phase AC induction motor M. As the bidirectional switch S, the GaN-based bidirectional field effect transistor shown in FIG. 45 is used.

In the power supply circuit shown in FIG. 46, by turning on or off the bidirectional switch S of the matrix converter C, each phase voltage of the three phase AC input to the wires $W_1$, $W_2$ and $W_3$ is directly cut like a thin rectangle by pulse width modulation (PWM), AC voltage of arbitrary voltage and frequency thus obtained is output to the wires $W_4$, $W_5$ and $W_6$ and the three phase AC induction motor M is driven.

The GaN-based bidirectional field effect transistor is also suitable for the bidirectional switch of a multi-level inverter. The multi-level inverter is effective, for example, for improving the power conversion efficiency of a power conversion system (for example, see Fujijiho, Vol. 83, No. 6 2010. pp. 362-365).

The GaN-based bidirectional field effect transistor according to the third embodiment can reduce a rising time when a switch signal is input to the gate electrode and achieve high speed operation as compared with a GaN-based field effect transistor that is not constructed as bidirectional, for example, the GaN-based field effect transistor shown in FIG. 32. Therefore, by using the GaN-based bidirectional field effect transistor as the bidirectional switch S of the matrix converter shown in FIG. 46, it is possible to switch the bidirectional switch S at a high speed and achieve high speed operation of the matrix converter C. With this, it is possible to realize a high performance matrix converter C and realize a high performance AC power supply circuit by using the matrix converter C. Similarly, it is possible to realize a high performance multi-level inverter and realize a high efficiency power conversion system by using the multi-level inverter.

4. The Fourth Embodiment

The GaN-based bidirectional field effect transistor according to the fourth embodiment is described.

The GaN-based bidirectional field effect transistor has the same constitution as the GaN-based bidirectional field effect transistor according to the third embodiment except that the equation (6) is satisfied. As the same as the GaN-based bidirectional field effect transistor according to the third embodiment, the GaN-based bidirectional field effect transistor can be used as a bidirectional switch S of the matrix converter C or a bidirectional switch of the multi-level inverter.

According to the fourth embodiment, the same advantages as the third embodiment can be obtained.

5. The Fifth Embodiment

In the fifth embodiment, described is the mounted structure body in which a chip constituting the GaN-based field effect transistor or the GaN-based bidirectional field effect transistor according to any one of the first to the fourth embodiments is flip chip mounted on a mount substrate.

In order to make it easy to understand the meaning and the explanation of the mounted structure body, consideration by the present inventors is described.

Figure 47:
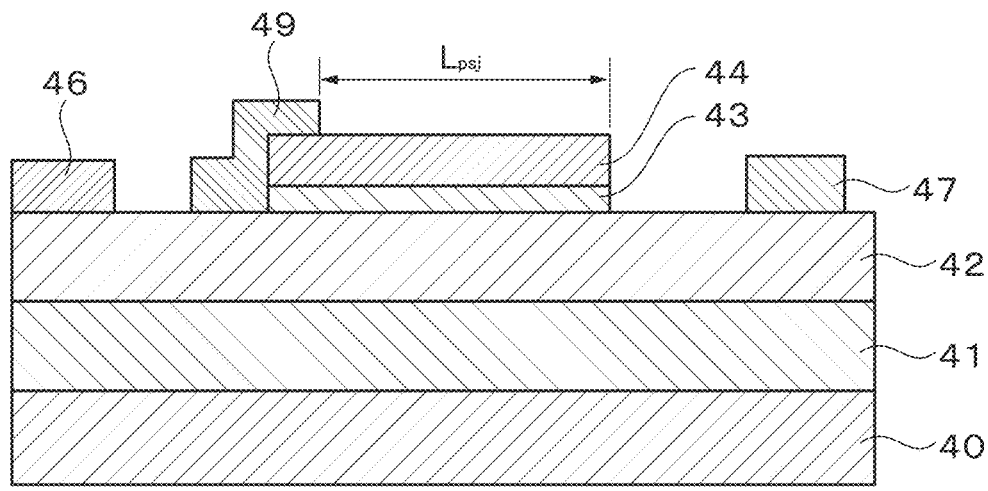
FIG. 47 A cross-sectional view showing a GaN-based field effect transistor on a sapphire substrate for explaining a mounted structure body according to the fifth embodiment of the invention.
Figure 48:
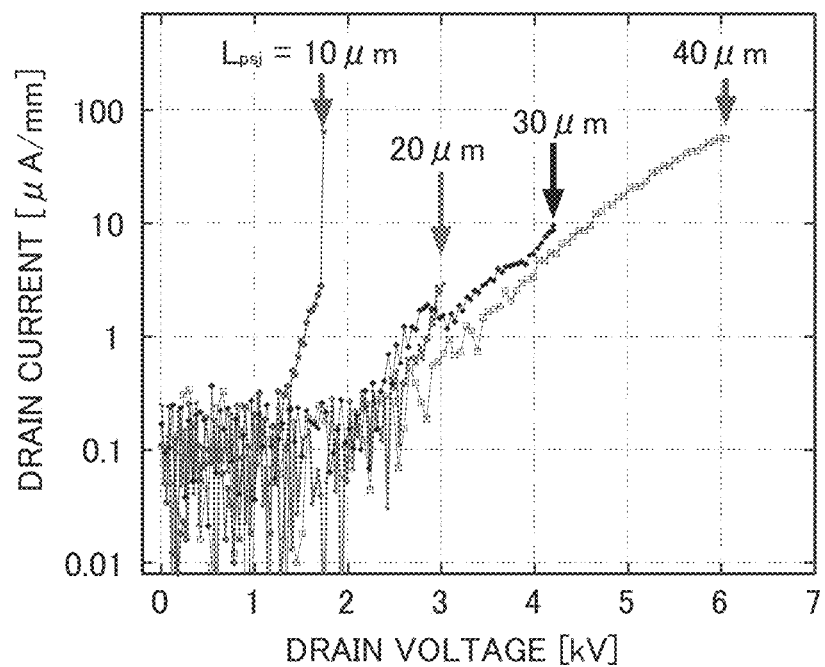
FIG. 48 A schematic view showing the result of measurement of drain current-drain voltage characteristic of the GaN-based field effect transistor shown in FIG. 47.

In the field effect transistor according to the invention, the principle of the polarization super junction with both the advantage of the polarization junction and the advantage of the super junction is used. Therefore, it is possible to realize a low uniform electric field over the whole transporting channel. As an example, FIG. 48 shows dependence of the off resistance voltage of the field effect transistor (PSJ-FET) formed on the sapphire substrate shown in FIG. 47 on the length of the polarization super junction region (PSJ length ($L_{psj}$)). The field effect transistor has substantially the same structure as the field effect transistor shown in FIG. 32. Although the p$^+$-type GaN contact layer 45 is formed on the p-type GaN layer 44 as a mesa, it is not illustrated in FIG. 47. The p-electrode 49 serving also as the gate electrode is formed such that it extends from the end surface of the undoped GaN layer 43, the p-type GaN layer 44 and the p$^+$-type GaN contact layer 45 on the p$^+$-type GaN contact layer 45. As shown in FIG. 47, the PSJ length $L_{psj}$ is the distance between the end surface of the p-electrode 49 serving also as the gate electrode on the side of the drain electrode 47 and the end surface of the undoped GaN layer 43 and the p-type GaN layer 44 on the side of the drain electrode 47. Reference numeral 40 denotes the sapphire substrate. Four kinds of field effect transistor in which $L_{psj}$ was changed as 10 μm, 20 μm, 30 μm and 40 μm were made. As understood from FIG. 48, the off resistance voltage was 1800V for $L_{psj}$=10 μm and it was 6000V for $L_{psj}$=40 μm. The off resistance voltage is proportional to $L_{psj}$ and effect of the super junction is realized. Since the resistance voltage is proportional to $L_{psj}$, if it is desired to double the resistance voltage, $L_{psj}$ is doubled.

Figure 49:
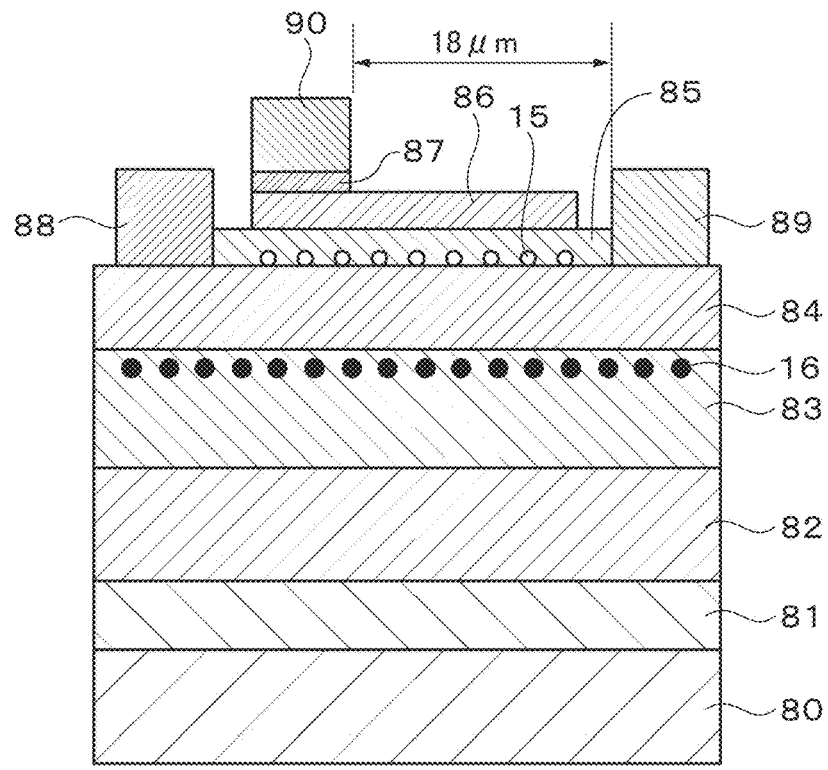
FIG. 49 A cross-sectional view of the GaN-based field effect transistor on the sapphire substrate for explaining the mounted structure body according to the fifth embodiment of the invention.

Described above is the result about the field effect transistor made on the sapphire substrate 40. However, if a Si substrate is used as a base substrate, that is not the case. Considered here is a case where the field effect transistor with the structure shown in FIG. 47 was made on the Si substrate. FIG. 49 shows the field effect transistor. The field effect transistor has substantially the same structure as the field effect transistor shown in FIG. 32. As shown in FIG. 49, in the field effect transistor, stacked in order on a Si substrate 80 are an AlN layer 81 with a thickness of 100 nm, an AlGaN buffer layer 82 with a thickness of 1.5 μm, an undoped GaN layer 83 with a thickness of an undoped $Al_{0.23}Ga_{0.77}N$ layer 84 with a thickness of 40 nm, an undoped GaN layer 85 with a thickness of 30 nm and a p-type GaN layer 86 with an acceptor concentration of $1\times10^{19}$ cm$^{-3}$ and a thickness of 20 nm. The undoped GaN layer 85 and the p-type GaN layer 86 on the undoped $Al_{0.23}Ga_{0.77}N$ layer 84 are patterned as a mesa and a p$^+$-type GaN contact layer 87 with an acceptor concentration of $1\times10^{20}$ cm$^{-3}$ and a thickness of 5 nm is formed on the p-type GaN layer 86 as a mesa. A source electrode 88 and a drain electrode 89 are formed on the undoped $Al_{0.23}Ga_{0.77}N$ layer 84 so as to sandwich the undoped GaN layer 85 and the p-type GaN layer 86. The undoped GaN layer 85 extends such that both end surfaces come in contact with the source electrode 88 and the drain electrode 89, respectively. A p-electrode 90 serving also as a gate electrode is formed on the p$^+$-type GaN contact layer 87. A 2DHG 15 is formed in the undoped GaN layer 85 in the vicinity part of a heterointerface between the undoped $Al_{0.23}Ga_{0.77}N$ layer 84 and the undoped GaN layer 85 and a 2DEG 16 is formed in the undoped GaN layer 83 in the vicinity part of a heterointerface between the undoped GaN layer 83 and the undoped $Al_{0.23}Ga_{0.77}N$ layer 84. In this case, the gate width $W_g$=0.1 mm and $L_{psj}$=18 μm.

Figure 50:
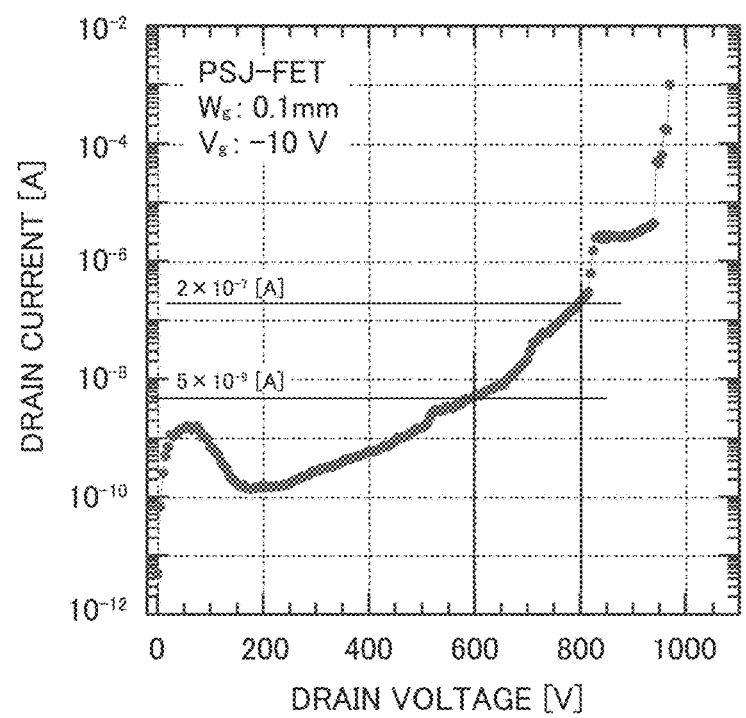
FIG. 50 A schematic view showing the result of measurement of drain current-drain voltage characteristic of the GaN-based field effect transistor shown in FIG. 49.
Figure 51:
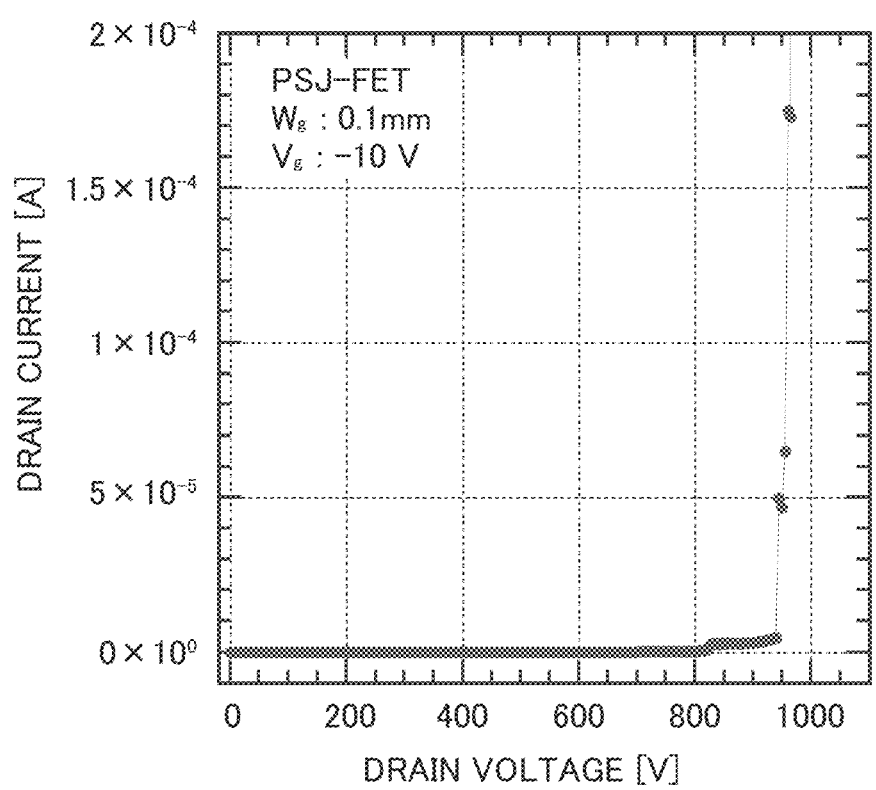
FIG. 51 A schematic view showing the result of measurement of drain current-drain voltage characteristic of the GaN-based field effect transistor shown in FIG. 49.

FIG. 50 shows the result of measurement of a drain current-drain voltage characteristic of the field effect transistor (PSJ-FET). Here, the gate voltage $V_g$=−10V. The vertical axis of FIG. 50 has a logarithmic scale. As shown in FIG. 50, in the field effect transistor, the drain current increases from the drain voltage of about 800V. FIG. 51 shows a graph that is obtained by changing the vertical axis of FIG. 50 to a linear scale. From FIG. 51 it is understood that the drain current rapidly increases from the drain voltage of about 950V. That is, the off resistance voltage of the field effect transistor (PSJ-FET) on the Si substrate 80 is about 950V, which is small as compared with the off resistance voltage of the field effect transistor on the sapphire substrate 40 shown in FIG. 47. Its reason has been identified as follows. That is, in the field effect transistor on the Si substrate 80, during the operation, there exists a leak current path in which electrons from the source electrode 88 reach the drain electrode 89 after they pass through the base Si substrate 80 or a leak current path in which electrons from the source electrode 88 reach the drain electrode 89 through the interface between the Si substrate 80 and the AlN layer 81. This is understood from that the resistance voltage of the Si substrate 80 is 0.3 MV/cm, which is small one order of magnitude as compared with the resistance voltage of GaN.

Figure 52:
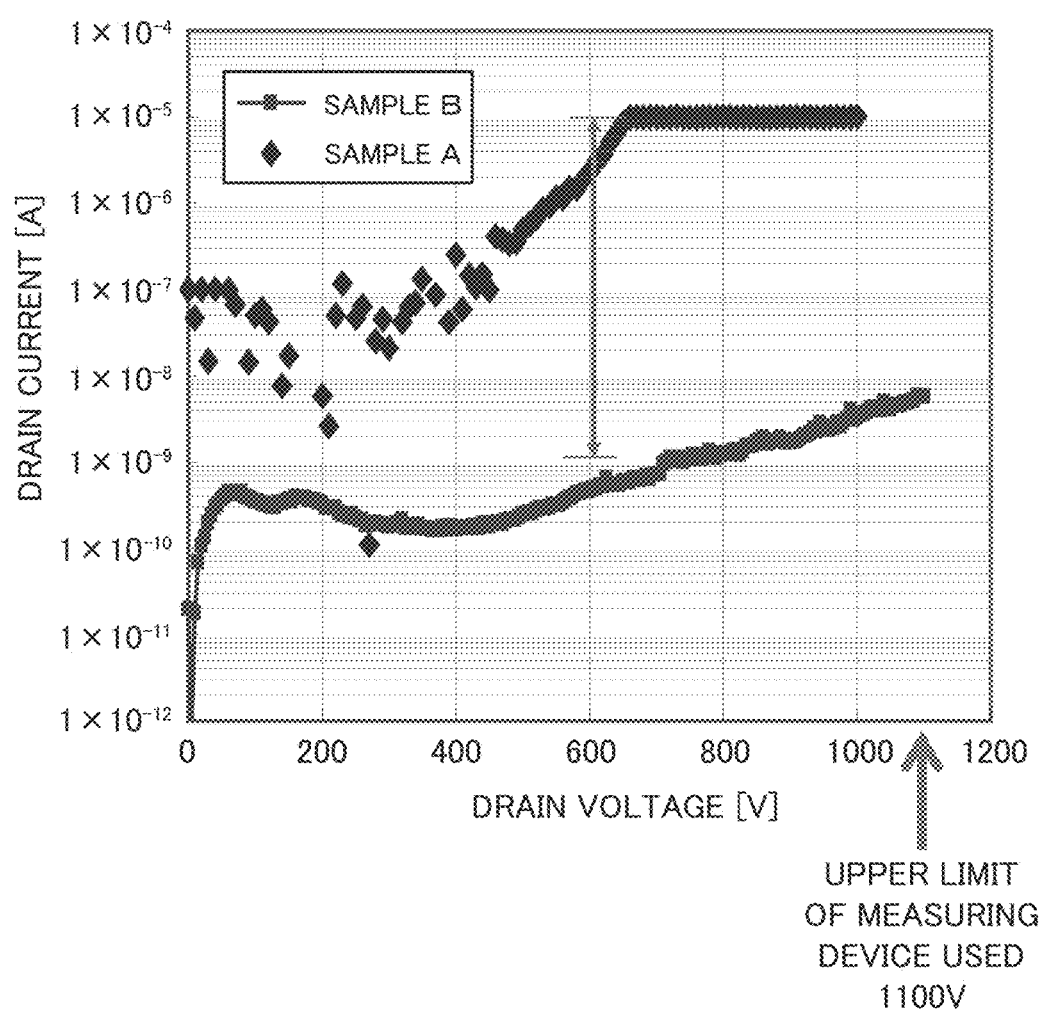
FIG. 52 A schematic view showing the result of measurement of drain current-drain voltage characteristic of the GaN-based field effect transistor on a Si substrate for explaining the mounted structure body according to the fifth embodiment of the invention.

In order to reduce the leak current of the field effect transistor on the Si substrate, a device on an insulating substrate is made by removing the Si substrate and coating insulating material instead. FIG. 52 shows the result of measurement of the drain current–the drain voltage characteristic of the field effect transistor before removing the Si substrate (sample A) and the field effect transistor after removing the Si substrate and coating epoxy resin as an example instead to make a device on the insulating substrate (sample B). Here, $W_g$=1 mm and $L_{psj}$=25 μm for both samples A and B. As understood from FIG. 52, with respect to the sample B in which the device on the insulating substrate was made by removing the Si substrate and coating epoxy resin instead, the leak current reduced to 1/4000 of the leak current of the sample A before removing the Si substrate. Here, the drain current of the sample A=10 μA ($1\times10^{-5}$ A) was used as the compliance current. With respect to the voltage when the field effect transistor breaks (the breakdown voltage), since the maximum voltage that the measurement device used can apply was 1100V, the transistor did not fail, so that the breakdown voltage was not known. From the above, it was demonstrated that it is possible to obtain ultrahigh voltage resistance performance of original GaN by removing the Si substrate.

Figure 53:
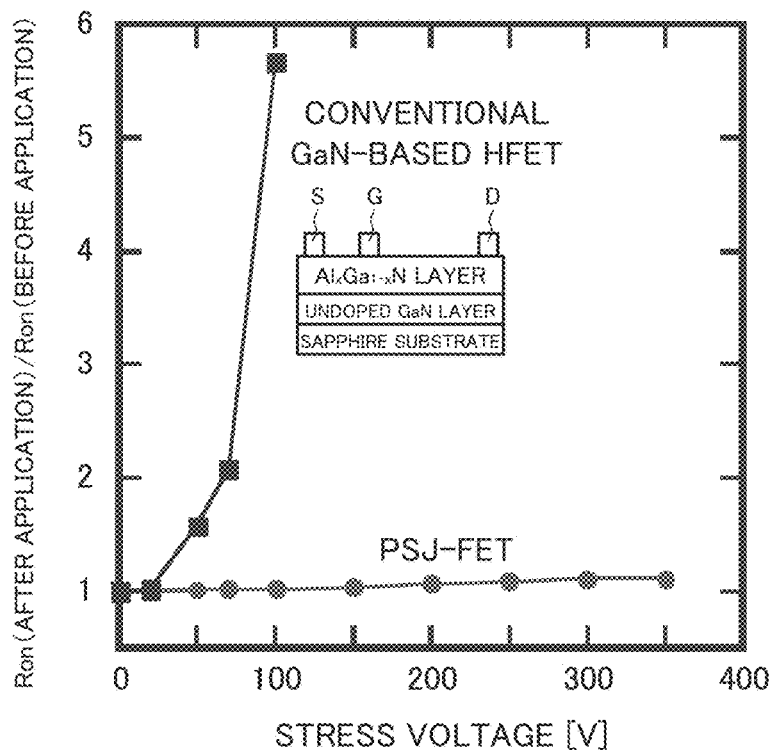
FIG. 53 A schematic view showing the result of measurement of current collapse of the GaN-based field effect transistor on the sapphire substrate and current collapse of the conventional GaN-based HFET on the sapphire substrate for explaining the mounted structure body according to the fifth embodiment of the invention.

Consideration is given here to that high voltage resistance and control of current collapse of the field effect transistor are possible or not by combining the conventional field plate (FP) technology and the sapphire substrate. First, it is possible to increase the resistance voltage by the field plate as compared with the transistor without the field plate. Its reason is that the maximum electric field can be reduced by dividing the peak of the electric field by the field plate. It is also possible to alleviate the current collapse by the field plate for the same reason. However, it has been known that the GaN-based HFET with the field plate on the sapphire substrate is very insufficient for control of the current collapse, so that at present development for putting the GaN-based HFET on the sapphire substrate to practical use was abandoned for high current application. In fact, as shown in FIG. 53, the conventional GaN-based HFET on the sapphire substrate suffers the current collapse seriously and is not practical. That is, the current collapse resulted for the stress voltage higher than 50V. Here, as shown in an inserted figure in FIG. 53, in the GaN-based HFET, an undoped GaN layer and an $Al_xGa_{1-x}N$ layer were stacked on a sapphire substrate in order, and a gate electrode G, a source electrode S and a drain electrode D were formed on the $Al_xGa_{1-x}N$ layer. On the other hand, as shown in FIG. 52, the field effect transistor (PSJ-FET) shown in FIG. 32 did not suffer the current collapse at all even though it was formed on the sapphire substrate. That is, the PSJ-FET did not suffer the current collapse for the stress voltage of 350V. Here, FIG. 53 shows the result of measurement of the current collapse and the transverse axis denotes the stress voltage and the vertical axis denotes a ratio of the channel resistance (on resistance) before and after application of the stress voltage, that is, the ratio of the channel resistance $R_{On}$ (after application) after application of the stress voltage to the channel resistance $R_{On}$ (before application) before application of the stress voltage, $R_{On}$ (after application)/$R_{On}$ (before application). Here, the stress voltage means the drain voltage when the gate electrode is negatively biased to turn off the transistor and the large drain voltage is applied. By application of the stress voltage, a large voltage (electric field) was applied between the gate and the drain. A method of measuring the current collapse is as follows. In a state where on voltage of +1V was applied to the gate electrode as a gate voltage ($V_g$), the drain voltage ($V_d$) from 0 to about 10V was applied and the drain current ($I_d$) was measured. Then the stress voltage was applied for about 1 second and $V_d$ was set to 0V and $V_g$ was set to +1V. Next, $V_d$ from 0 to 10V was applied and $I_d$ was measured. The ratio of the inverse of the slope of $I_d$ (conductance) (channel resistance), that is, $R_{On}$ (after application)/$R_{On}$ (before application) was obtained. $R_{On}$ (after application)/$R_{On}$ (before application) thus obtained was plotted against the stress voltage as shown in FIG. 53.

The meaning shown by FIG. 53 is described again. That is, the conventional GaN-based HFET suffers the current collapse since the underlying part (the opposite side of the surface electrode) of the undoped GaN layer that is the channel layer is constituted by the sapphire substrate and insulative, it is not practical. On the other hand, if the GaN-based HFET is formed on a conductive Si substrate and thereafter the Si substrate is removed to make the resistance voltage high, there occurs the current collapse. Therefore, at present, the practical resistance voltage of the GaN-based HFET is limited to hundreds V by the resistance voltage of the Si substrate that cannot be removed from the viewpoint of control of the current collapse. In contrast with this, in the field effect transistor (PSJ-FET) according to the invention, even though the underlying part of the undoped GaN layer (more generally, an undoped InGaN layer) that is the channel layer is constituted by an insulating substrate, the current collapse does not occur. Therefore, even when the Si substrate as well as the sapphire substrate is used as a base substrate for crystal growth, a high voltage resistance device free from the current collapse can be made by removing the base substrate.

Now the subject when the underlying part of the undoped GaN layer that is the channel layer is constituted by an insulating substrate to make the resistance voltage high is the ability of heat radiation. Thermal conductivity of sapphire is about 30 [W/mK]. When a Si substrate is used as the base substrate for crystal growth, thereafter the base substrate is removed, and then an insulating substrate is used as the support, its heat conductivity is the problem. Actually, thermal conductivity of polyimide or epoxy resin ranges from 0.5 to 5 [W/mK]. Since heat conductivity of all of sapphire, polyimide and epoxy resin is low as described above, the device will suffer temperature increase if no measure is taken and cannot be put to practical use.

The subject of heat radiation can be solved by improving and applying flip chip technology that is a technology known. The flip chip technology is included in a category of wire technology and develops as digital high density mounting technology. Usually, wiring between a (ceramic) substrate inside a package and a die (chip) is carried out by a wire bonding method. In contrast with this, a substrate and a die pad are directly connected face to face via solder ball bumps to reduce the die bonding area. Furthermore, in a light emitting device such as a light emitting diode (LED) and a laser diode (LD), almost the whole surface of the chip is joined to a submount substrate with solder for the purpose of the heat radiation. This technology is also categorized into the flip chip technology. On the other hand, to the present inventor's knowledge, with respect to application of the flip chip technology to GaN-based devices, its application to electronic devices (electron transporting devices) has not been reported.

Figure 54:
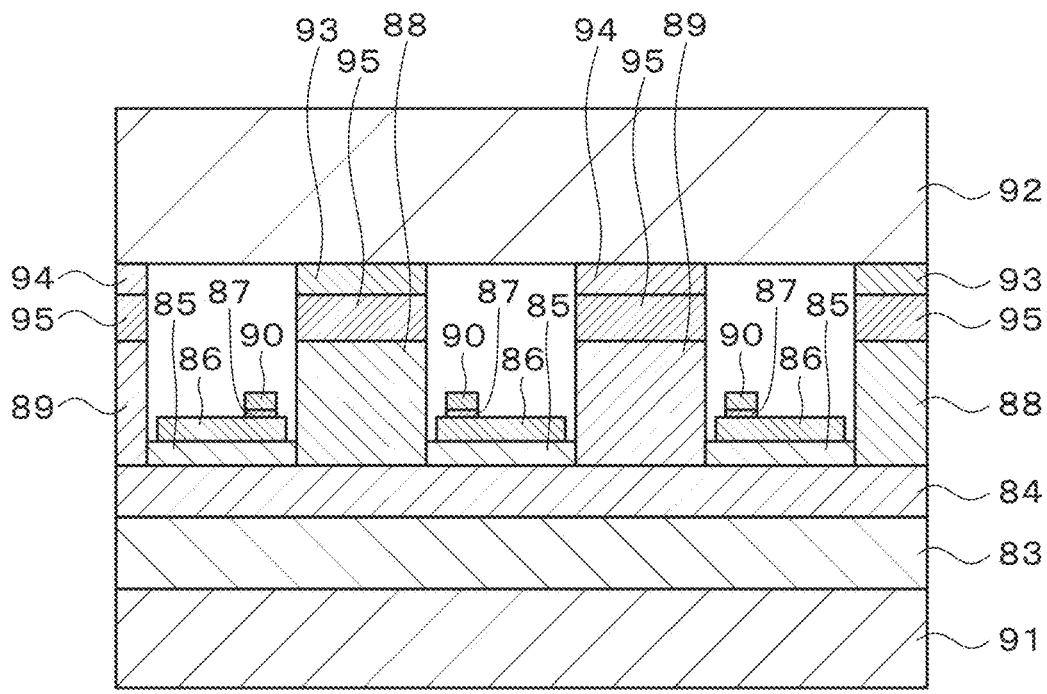
FIG. 54 A cross-sectional view showing the mounted structure body according to the fifth embodiment of the invention.

In the flip chip technology, to aim at the heat radiation of the chip, it is necessary to join the chip to the submount substrate in an area of the chip near the heating part. In a lateral high current field effect transistor, usually, all of the gate electrode, the source electrode and the drain electrode have an interdigital structure. Here, it is desired that the submount substrate is directly and thermally in contact with ohmic electrodes, that is, the source electrode and the drain electrode of the teeth of the interdigital structure. FIG. 54 shows its example. That is, as shown in FIG. 54, a field effect transistor (PSJ-FET) (as an example, the field effect transistor has the structure of the GaN-based field effect transistor shown in FIG. 48) is formed on, for example, a Si substrate, and then the Si substrate is removed by a method publicly known and thereafter an insulating layer 91 is formed on an exposed surface. If the insulating layer 91 is made of, for example, organic materials such as polyimide or inorganic glass materials such as SOG (spin on glass), it can be formed by spin coating etc. If a field effect transistor (PSJ-FET) is formed on a sapphire substrate, it is desired that the sapphire substrate is thinned to a thickness of about 100 μm. The source electrode 88 and the drain electrode 89 are formed like a metal pillar with a height of about several μm to 10 μm by plating. On the other hand, metal layers 93, 94 that are patterned as almost the same size as the source electrode 88 and the drain electrode 89 are formed on the submount substrate 92, and further solder layers 95 (or solder balls) are formed on the metal layers 93, 94. And the solder layers 95 of the submount substrate 92 are aligned with the source electrode 88 and the drain electrode 89 and made to come in contact with them. As the submount substrate 92, for example, a Si substrate, a SiC substrate, a diamond substrate, a BeO substrate, a CuW substrate, a CuMo substrate, a Cu substrate, an AlN substrate, etc. can be used. In this state, the solder layers 95 are melted by heating, so that the source electrode 88 and the drain electrode 89 and the metal layers 93, 94 are bonded. At this time, because the source electrode 88 and the drain electrode 89 and the metal layers 93, 94 are self-aligned one another by the surface tension of the molten solder, no alignment accuracy is required. A commercially available die mounter can be used. Here, although the width of the ohmic electrodes, that is, the width of the source electrode 88 and the drain electrode 89 is necessary to be the width permitting alignment by a general die mounter with patterns of the metal layers 93, 94 on the submount substrate 92, generally the width equal to or larger than 20 μm is enough. In the mounted structure body, heat generated from the field effect transistor during the operation is rapidly conducted to the submount substrate 92 via the source electrode 88, the drain electrode 89 and the metal layers 93, 94, and finally, radiated to the outside from the submount substrate 92. It should be noted that only one of the source electrode 88 and the drain electrode 89 (for example, only the drain electrode 89) may be connected with the submount substrate 92 via the metal layer 93 or the metal layer 94. In this case, it is also possible to finally radiate heat from the submount substrate 92 effectively.

Figure 55:
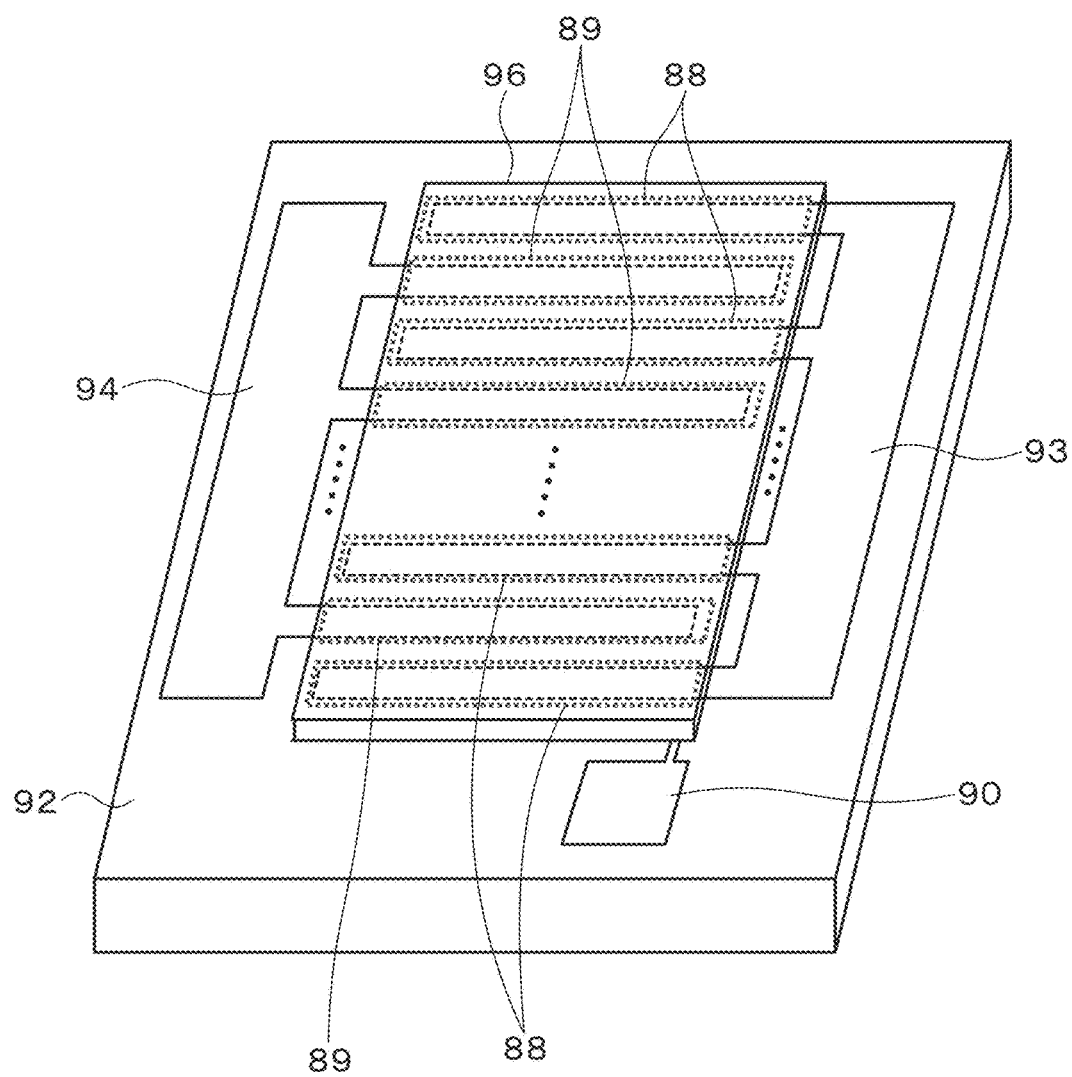
FIG. 55 A perspective view showing an example of the whole image of the mounted structure body according to the fifth embodiment of the invention.
Figure 56:
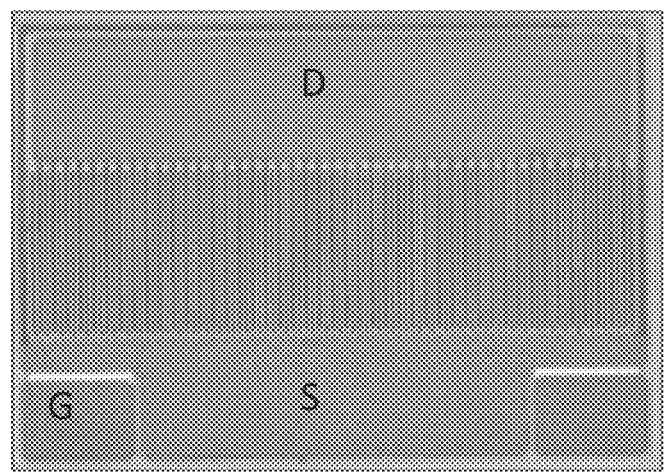
FIG. 56 A substitute picture for a drawing showing the outside of the chip which was packaged by a conventional wire bonding method as a reference example.

FIG. 55 shows an example of the whole image of the chip 96 constituting the field effect transistor and the submount substrate 92. The metal layers 93, 94 on the submount substrate 92 are formed like the teeth of a comb respectively, and connected with the source electrode 88 and the drain electrode 89 formed on the chip 96 as patterns apart from each other, respectively. A wide lead electrode pad for wire bonding is formed on the metal layers 93, 94 outside of the chip 96. In this case, it is not necessary to form the lead electrode pad on the chip 96, and therefore the area of the wire bonding can be saved. And it is possible to make the chip 96 small accordingly, resulting reduction of cost of making the field effect transistor. For reference, FIG. 56 shows a photograph of a chip of a conventional lateral power transistor in which packaging was done by wire bonding. In the chip, a wire bonding area is required in addition to the intrinsic area (device area), and therefore the area of the chip is increased.

As described above, according to the fifth embodiment, by combining the GaN-based field effect transistor (PSJ-FET) according to the first to the fourth embodiments and the flip chip technology, the novel mounted structure body can be realized. The mounted structure body has the following advantages. That is, because the chip 96 constituting the GaN-based field effect transistor is flip chip mounted on the submount substrate 92, heat generated from the chip 96 during the operation can be rapidly conducted to the submount substrate 92 and radiated to the outside from the submount substrate 92 effectively. Therefore, it is possible to prevent the temperature of the chip 96 from increasing. In addition, the voltage applied to the GaN-based field effect transistor (PSJ-FET) is not limited and the GaN-based field effect transistor with super high resistance voltage higher than 600V can be realized. On the other hand, as the base substrate used for crystal growth, not only a sapphire substrate but also a Si substrate can be used. Furthermore, because an area for a lead electrode pad on the side of the device is not necessary to form, the size of the chip can be decreased to the size of the intrinsic area. As described above, according to the fifth embodiment, new values never obtained before can be given to the field effect transistor as a lateral high current device. The conventional GaN-based HFET using the field plate technology can never realize that.

Heretofore, embodiments and examples of the present invention have been explained specifically. However, the present invention is not limited to these embodiments and examples, but contemplates various changes and modifications based on the technical idea of the present invention.

For example, numerical numbers, structures, shapes, materials, etc. presented in the aforementioned embodiments and examples are only examples, and the different numerical numbers, structures, shapes, materials, etc. may be used as needed.

For example, in the GaN-based field effect transistors shown in FIG. 29-FIG. 33, as shown by dot and dash lines in FIG. 29-FIG. 33, the undoped GaN layer 43 may be extended until its end surface comes in contact with the drain electrode 47. With this, because the undoped GaN layer 43 functions as a surface passivation film (cap layer) of the undoped $Al_xGa_{1-x}N$ layer 42, the surface stability of the undoped $Al_xGa_{1-x}N$ layer 42 can be improved, resulting an improvement of the characteristics of the GaN-based field effect transistors. Further in the GaN-based field effect transistor shown in FIG. 29, as shown by a dot and dash line in FIG. 29, the undoped GaN layer 43 may be extended until its end surface comes in contact with the gate electrode 48. Further in the GaN-based field effect transistor shown in FIG. 32, as shown by dot and dash lines in FIG. 32, the undoped GaN layer 43 may be extended until its end surface comes in contact with the source electrode 46. Furthermore, in the GaN-based diodes shown in FIG. 34-FIG. 36, as shown by a dot and dash line in FIG. 34-FIG. 36, the undoped GaN layer 53 may be extended until its end surface comes in contact with the cathode electrode 57. With this, because the undoped GaN layer 53 functions as a surface passivation film of the undoped $Al_xGa_{1-x}N$ layer 52, the surface stability of the undoped $Al_xGa_{1-x}N$ layer 52 can be improved, resulting an improvement of the characteristics of the GaN-based diodes. Further in the GaN-based diode shown in FIG. 30, as shown by a dot and dash line in FIG. 34, the undoped GaN layer 53 may be extended until its end surface comes in contact with the anode electrode 56. Furthermore, in the GaN-based bidirectional field effect transistor shown in FIG. 44, as shown by a dot and dash line in FIG. 44, the undoped GaN layer 43 may be extended until its end surface comes in contact with the source electrodes 46a, 46b. With this, because the undoped GaN layer 43 functions as a surface passivation film of the undoped $Al_xGa_{1-x}N$ layer 42, the surface stability of the undoped $Al_xGa_{1-x}N$ layer 42 can be improved, resulting an improvement of the characteristics of the GaN-based bidirectional field effect transistor. As needed, in the GaN-based field effect transistors shown in FIG. 29-FIG. 33, the GaN-based diodes shown in FIG. 34-FIG. 36 and the GaN-based bidirectional field effect transistor shown in FIG. 44, the whole of the exposed surface of the undoped $Al_xGa_{1-x}N$ layer 42 or the undoped $Al_xGa_{1-x}N$ layer 52 may be covered by the undoped GaN layer 43 or the undoped GaN layer 53.

Figure 57A:
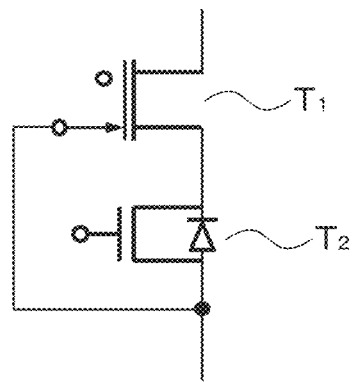
FIG. 57A A schematic view showing a cascode circuit using a normally-on field effect transistor to which the invention was applied.
Figure 57B:
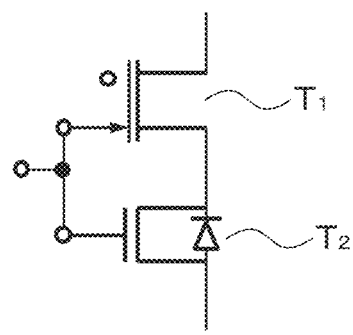
FIG. 57B A schematic view showing a modified cascode circuit using the normally-on field effect transistor to which the invention was applied.
Figure 57C:
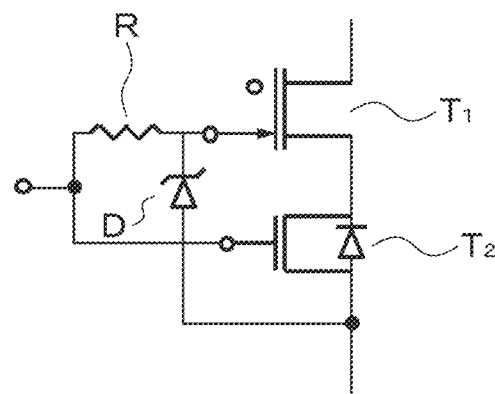
FIG. 57C A schematic view showing a modified cascode circuit using the normally-on field effect transistor to which the invention was applied.
Figure 57D:
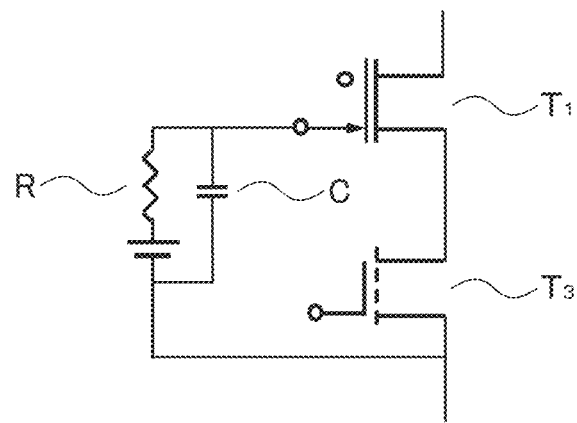
FIG. 57D A schematic view showing a modified cascode circuit using the normally-on field effect transistor to which the invention was applied.

The normally-on field effect transistor of the GaN-based semiconductor device according to the first or the second embodiment can be changed into the one of normally-off type by mounting a cascode circuit publicly known with a low-priced low resistance voltage Si transistor. FIG. 57A shows a cascode circuit using a normally-on field effect transistor $T_1$ and a low resistance voltage normally-off Si MOS transistor $T_2$. FIG. 57B shows a modified cascode circuit using the normally-on field effect transistor $T_1$ and the low resistance voltage normally-off Si MOS transistor $T_2$. FIG. 57C shows a modified cascode circuit using the normally-on field effect transistor $T_1$ and the low resistance voltage normally-off Si MOS transistor $T_2$, a Schottky diode D and a resistor R. FIG. 57D shows a modified cascode circuit using the normally-on field effect transistor $T_1$, the low resistance voltage normally-off Si MOS transistor $T_2$, a capacitor C and the resistor R. In the cascode circuit shown in FIG. 57A, the gate voltage ($V_{gs}$) in an on state of the normally-on field effect transistor $T_1$ on the side of the high resistance voltage is 0V. In the normally-on field effect transistor $T_1$, it is effective to apply a positive gate voltage. For the purpose, it is effective to use the modified cascode circuit shown in FIG. 57B, FIG. 57C or FIG. 57D. It is also possible to use the cascode circuit or the modified cascode circuit and place a gate driver in a package by the technology publicly known heretofore.

EXPLANATION OF REFERENCE NUMERALS

11 Undoped GaN layer
12 Undoped $Al_xGa_{1-x}N$ layer
13 Undoped GaN layer
14 P-type GaN layer
15 Two-dimensional hole gas
16 Two-dimensional electron gas
17 Anode electrode
18 Cathode electrode
21 C-plane sapphire substrate
22 Undoped GaN layer
23 Undoped $Al_xGa_{1-x}N$ layer
24 Undoped GaN layer
25 P-type GaN layer
26 P$^+$-type GaN contact layer
96 Chip It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:
1. A semiconductor device, comprising:
a polarization super junction region and a p-electrode contact region which are separated from each other, the polarization super junction region, comprising:
a first undoped GaN layer,
an undoped $Al_xGa_{1-x}N$ layer ($0.17 \leq x \leq 0.35$) with a thickness not smaller than 25 nm and not larger than 47 nm on the first undoped GaN layer,
a second undoped GaN layer on the undoped layer; and
a Mg-doped p-type GaN layer on the second undoped GaN layer,

$$tR \geq 0.864/(x-0.134)+46.0 \text{ [nm]}$$

being satisfied when the thickness of the second undoped GaN layer is denoted as u[nm], the thickness of the p-type GaN layer is denoted as v[nm], the Mg concentration of the p-type GaN layer is denoted as w [cm$^{-3}$] and the reduced thickness tR is defined as $$tR = u + v(1 + w \times 10^{-18}),$$

wherein the thickness of the p-type GaN layer v [nm]$\leq$20 [nm] and the Mg concentration of the p-type GaN layer w[cm$^{-3}$]$\leq 5 \times 10^{18}$[cm$^{-3}$],
the p-electrode contact region, comprising:
a p-type GaN contact layer which is doped with Mg heavier than the p-type GaN layer, provided in contact with the p-type GaN layer only in the p-electrode contact region; and
a p-electrode which is in ohmic contact with the p-type GaN contact layer,
a two-dimensional hole gas being formed in the second undoped GaN layer in the vicinity part of a hetero-interface between the undoped $Al_xGa_{1-x}N$ layer and the second undoped GaN layer, and a two-dimensional electron gas being formed in the first undoped GaN layer in the vicinity part of a hetero-interface between the first undoped GaN layer and the undoped $Al_xGa_{1-x}N$ layer at a non-operating time.
2. The semiconductor device according to claim 1 wherein the p-type GaN contact layer is formed on the p-type GaN layer as a mesa.
3. The semiconductor device according to claim 2 wherein the semiconductor device is a field effect transistor, and the second undoped GaN layer and the p-type GaN layer on the undoped $Al_xGa_{1-x}N$ layer are patterned as a mesa, the p-type GaN contact layer is formed on the p-type GaN layer as a mesa, a source electrode and a drain electrode are formed on the undoped $Al_xGa_{1-x}N$ layer so as to sandwich the second undoped GaN layer and the p-type GaN layer, and the p-electrode serving also as a gate electrode is formed on the p-type GaN contact layer.

* * * * *